US012684979B2

(12) United States Patent
Choi

(10) Patent No.: US 12,684,979 B2
(45) Date of Patent: Jul. 14, 2026

(54) DISPLAY DEVICE, REPAIRING METHOD THEREOF AND ELECTRONIC DEVICE INCLUDING THE DISPLAY DEVICE

(71) Applicant: Samsung Display Co., LTD., Yongin-si (KR)

(72) Inventor: Jong Hyun Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 19/237,881

(22) Filed: Jun. 13, 2025

(65) Prior Publication Data

US 2026/0130068 A1 May 7, 2026

(30) Foreign Application Priority Data

Nov. 7, 2024 (KR) ........................ 10-2024-0157063

(51) Int. Cl.
| | |
|---|---|
| *H10K 59/131* | (2023.01) |
| *G09G 3/3233* | (2016.01) |
| *H10K 59/88* | (2023.01) |

(52) U.S. Cl.
CPC ......... *H10K 59/131* (2023.02); *G09G 3/3233* (2013.01); *H10K 59/88* (2023.02); *G09G 2300/0413* (2013.01); *G09G 2300/0426* (2013.01); *G09G 2300/0819* (2013.01); *G09G 2300/0842* (2013.01); *G09G 2300/0861* (2013.01); *G09G 2320/045* (2013.01); *G09G 2330/08* (2013.01)

(58) Field of Classification Search
CPC .... H10K 59/131; H10K 59/88; G09G 3/3233;

G09G 2300/0413; G09G 2300/0426;
G09G 2300/0819; G09G 2300/0842;
G09G 2300/0861; G09G 2320/045; G09G 2330/08

See application file for complete search history.

(56) References Cited

U.S. PATENT DOCUMENTS

| | | |
|---|---|---|
| 10,204,975 B2 | 2/2019 | Kang |
| 10,360,845 B2 | 7/2019 | Park et al. |

(Continued)

FOREIGN PATENT DOCUMENTS

KR 20190138492 A * 12/2019 ........... G09G 3/3225

OTHER PUBLICATIONS

English translation of KR-20190138492-A (Year: 2019).*

*Primary Examiner* — Lixi C Simpson

(74) *Attorney, Agent, or Firm* — CANTOR COLBURN LLP

(57) ABSTRACT

A display device includes a substrate in which a display area including first and second areas and a non-display area surrounding a side of the display area are defined, a sub-pixel in the display area, a dummy pixel in the non-display area, and a repair line provided to the display area and the non-display area. The repair line includes first and second repair lines arranged between first and second pixel rows in the first area. The dummy pixel includes first and second dummy pixels arranged corresponding to the first and second pixel rows, respectively. Each of the first and second dummy pixels includes a dummy pixel circuit and a first capacitor. The first capacitor of each of the first and second dummy pixels is between the dummy pixel circuit of the first dummy pixel and the dummy pixel circuit of the second dummy pixel.

20 Claims, 33 Drawing Sheets

(56)         References Cited

U.S. PATENT DOCUMENTS

2015/0294618 A1 * 10/2015 Park ..................... G09G 3/3291
                                              345/78
2016/0019841 A1 *  1/2016 Woo ..................... G09G 3/3233
                                              345/204
2025/0372035 A1 * 12/2025 Guo ..................... G09G 3/3233

* cited by examiner

CP4(CNE1)

RPL1

BRP1

II

II'

WL4
WL11

VL

WL5

BRP2

WL11

WL4

RPL2

CP4(CNE1)

SCP

CP4(CNE1)

CH1
(CH)

RPL1

BRP1

WL4
WL11

VL

WL5

BRP2

WL11

WL4

RPL2

CP4(CNE1)

SCP

Figure 25:
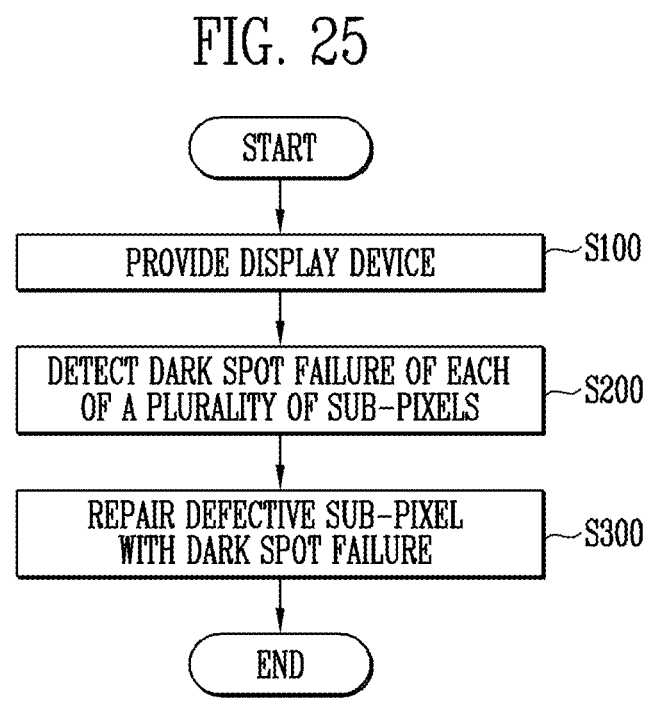

```
┌─────────────┐
│    START    │
└─────────────┘
       │
       ▼
┌──────────────────────────────┐
│   PROVIDE DISPLAY DEVICE      │────S100
└──────────────────────────────┘
       │
       ▼
┌──────────────────────────────┐
│  DETECT DARK SPOT FAILURE OF  │
│     EACH OF A PLURALITY OF    │────S200
│          SUB-PIXELS           │
└──────────────────────────────┘
       │
       ▼
┌──────────────────────────────┐
│   REPAIR DEFECTIVE SUB-PIXEL  │
│     WITH DARK SPOT FAILURE    │────S300
└──────────────────────────────┘
       │
       ▼
┌─────────────┐
│     END     │
└─────────────┘
```

CNE1(CP4)

CH(CH1)

CNE1(CP4)

RPL1

CH(CH2)

SCP

RPL2

CH

CNE1(CP4)

DR2

DR3 · → DR1

DISPLAY DEVICE, REPAIRING METHOD THEREOF AND ELECTRONIC DEVICE INCLUDING THE DISPLAY DEVICE

This application claims priority to Korean Patent Application Number 10-2024-0157063, filed on Nov. 7, 2024, and all the benefits accruing therefrom under 35 U.S.C. § 119, the content of which in its entirety is herein incorporated by reference.

BACKGROUND

1. Field

Embodiments of the disclosure relate to a display device, a method of repairing the same, and an electronic device including the display device.

2. Related Art

With the recent increase in interest in information display, research and development of display devices is ongoing.

SUMMARY

The disclosure provides a display device, a repairing method thereof, and an electronic device including the display device which may improve reliability by preventing a dark spot failure of a pixel.

An embodiment of the disclosure includes a display device including a substrate in which a display area including a first area and a second area and a non-display area surrounding a side of the display area are defined; a sub-pixel arranged in the display area; a dummy pixel arranged in the non-display area; and a repair line commonly provided to the display area and the non-display area and extending in a first direction. The repair line includes a first repair line and a second repair line arranged between a first pixel row and a second pixel row of the substrate in the first area. The dummy pixel includes a first dummy pixel and a second dummy pixel arranged corresponding to the first pixel row and the second pixel row, respectively. Each of the first and second dummy pixels includes a dummy pixel circuit and a first capacitor electrically connected to the dummy pixel circuit. The first capacitor of each of the first and second dummy pixels is disposed between the dummy pixel circuit of the first dummy pixel and the dummy pixel circuit of the second dummy pixel.

In an embodiment, the first capacitor of the first dummy pixel and the first capacitor of the second dummy pixel may be provided as a single body. The first dummy pixel and the second dummy pixel may share the first capacitor.

In an embodiment, the first repair line and the second repair line may extend in the first direction, may be spaced apart from each other in a second direction crossing the first direction, and may be electrically isolated from each other.

In an embodiment, the display device may further include a first bridge pattern extending in the second direction and electrically connected to the first repair line; and a second bridge pattern extending in the second direction and electrically connected to the second repair line.

In an embodiment, the sub-pixel may include a transistor arranged on the substrate; a light-emitting element electrically connected to the transistor and emitting light; and a contact electrode electrically connecting the light-emitting element and the transistor.

In an embodiment, the contact electrode may be arranged on the semiconductor pattern of the transistor between an insulating layer interposed therebetween, and may be electrically connected to the semiconductor pattern of the transistor through a first contact hole passing through the insulating layer.

In an embodiment, the first bridge pattern may be disposed on one side of the first contact hole and the second bridge pattern may be disposed on an opposite side of the first contact hole opposite to the one side of the first contact hole on the basis of the first contact hole in a plan view.

In an embodiment, the first and second bridge patterns may be disposed on one side of the first contact hole on the basis of the first contact hole in a plan view.

In an embodiment, the contact electrode may overlap the first and second bridge patterns. The contact electrode, the first bridge pattern, and the second bridge pattern may be electrically isolated from each other.

In an embodiment, the first dummy pixel may be electrically connected to one of the first and second repair lines, and the second dummy pixel may be electrically connected to a remaining (the other) repair line between the first and second repair lines.

In an embodiment, the sub-pixel may include a pixel circuit. Pixel circuits of two sub-pixels facing each other in the second direction while interposing the first and second repair lines in the first area may be mirror symmetrical with respect to each other.

In an embodiment, the sub-pixel may include a transistor arranged on the substrate, a light-emitting element electrically connected to the transistor and emitting light, and a contact electrode electrically connecting the light-emitting element and the transistor. The display device further includes a bridge pattern disposed between the sub-pixel arranged in the first pixel row and the sub-pixel arranged in the second pixel row, and connected to a corresponding repair line between the first and second repair lines. The contact electrode of the sub-pixel arranged in the first pixel row overlaps one end of the bridge pattern, and the contact electrode of the sub-pixel arranged in the second pixel row overlaps an opposite end of the bridge pattern opposite to the one end of the bridge pattern.

In an embodiment, in each of the first and second pixel rows, the sub-pixel may include a first sub-pixel, a second sub-pixel, and a third sub-pixel arranged in the first direction. The bridge pattern disposed between the first sub-pixel arranged in the first pixel row and the first sub-pixel arranged in the second pixel row may be connected to the first repair line. The bridge pattern disposed between the second sub-pixel arranged in the first pixel row and the second sub-pixel arranged in the second pixel row may be connected to the second repair line. The bridge pattern disposed between the third sub-pixel arranged in the first pixel row and the third sub-pixel arranged in the second pixel row may be connected to the first repair line.

In an embodiment, the non-display area may include a first non-display area next (adjacent) to the first area and a second non-display area next (adjacent) to the second area. The first and second repair lines may be arranged between the first and second dummy pixels arranged in the same row as the first pixel row and the first and second dummy pixels arranged in the same row as the second pixel row in the first non-display area.

An embodiments of the disclosure includes a display device including a substrate in which a display area and a non-display area surrounding a side of the display area are defined; a sub-pixel arranged in the display area and including a transistor, a light-emitting element electrically connected to the transistor, and a contact electrode electrically connecting the light-emitting element and the transistor; a first repair line and a second repair line extending in a first direction and arranged between a first pixel row and a second pixel row of the substrate; a first dummy pixel and a second dummy pixel arranged in the non-display area and arranged in the first pixel row and the second pixel row, respectively; and a first bridge pattern and a second bridge pattern disposed between the first repair line and the second repair line and extending in a second direction crossing the first direction. The first bridge pattern is connected to the first repair line, and the second bridge pattern is connected to the second repair line. The contact electrode is arranged on a semiconductor pattern of the transistor with an insulating layer interposed therebetween, and is electrically connected to the semiconductor pattern through a first contact hole passing through the insulating layer. The first bridge pattern is disposed on one side of the first contact hole and the second bridge pattern is disposed on an opposite side of the first contact hole opposite to the one side of the first contact hole, based on the first contact hole.

In an embodiment, the contact electrode may overlap the first and second bridge patterns. The contact electrode, the first bridge pattern, and the second bridge pattern may be electrically isolated from each other.

In an embodiment, each of the first dummy pixel and the second dummy pixel may include a dummy pixel circuit including a first capacitor. The dummy pixel circuit of the first dummy pixel and the dummy pixel circuit of the second dummy pixel may share the first capacitor.

In an embodiment, the first dummy pixel may be electrically connected to one of the first and second repair lines, and the second dummy pixel may be electrically connected to a remaining (the other) repair line between the first and second repair lines.

An embodiment of the disclosure includes a repairing method of a display device including a substrate in which a display area and a non-display area surrounding a side of the display area are defined, a sub-pixel arranged in the display area and including a transistor, a light-emitting element electrically connected to the transistor, and a contact electrode electrically connecting the light-emitting element and the transistor, a first repair line and a second repair line arranged between a first pixel row and a second pixel row of the substrate and spaced apart from each other, a first bridge pattern arranged between the first and second pixel rows and connected to the first repair line, a second bridge pattern arranged between the first pixel row and the second pixel row and connected to the second repair line, a first dummy pixel arranged in the non-display area corresponding to each of the first and second pixel rows and connected to one of the first and second repair lines, and a second dummy pixel connected to a remaining (the other) repair line between the first and second repair lines, the repairing method including: separating a first bad pixel circuit arranged in a first pixel column of the first pixel row from a first light-emitting element corresponding to the first bad pixel circuit; electrically connecting the contact electrode electrically connected to an anode electrode of the first light-emitting element to one of the first and second bridge patterns to electrically connect the anode electrode of the first light-emitting element to a dummy pixel circuit of one of the first and second dummy pixels; separating a second defective pixel circuit arranged in a third pixel column of the first pixel row from a second light-emitting element corresponding to the second defective pixel circuit; and electrically connecting the contact electrode electrically connected to an anode electrode of the second light-emitting element to a remaining (the other) bridge pattern between the first and second bridge patterns to electrically connect the anode electrode of the second light-emitting element to a remaining (the other) dummy pixel circuit between the first and second dummy pixels.

In an embodiment, the contact electrode of each of the first and second light-emitting elements may be arranged on a semiconductor pattern of the transistor with an insulating layer interposed therebetween, and may be electrically connected to the semiconductor pattern through a first contact hole passing through the insulating layer. The first bridge pattern may be disposed on one side of the first hole and the second bridge pattern may be disposed on an opposite side of the first contact hole opposite to the one side of the first contact hole on the basis of the first contact hole.

An embodiment of the disclosure includes an electronic device, including: a processor providing input image data to a display device; and the display device displaying an image based on the input image data. The display device includes: a substrate in which a display area including a first area and a second area and a non-display area surrounding a side of the display area are defined; a sub-pixel arranged in the display area, a dummy pixel arranged in the non-display area; and a repair line commonly provided to the display area and the non-display area and extending in a first direction. The repair line includes a first repair line and a second repair line arranged between a first pixel row and a second pixel row of the substrate in the first area. The dummy pixel includes a first dummy pixel and a second dummy pixel arranged corresponding to the first pixel row and the second pixel row, respectively. Each of the first and second dummy pixels includes a dummy pixel circuit and a first capacitor electrically connected to the dummy pixel circuit. The first capacitor of each of the first and second dummy pixels is disposed between the dummy pixel circuit of the first dummy pixel and the dummy pixel circuit of the second dummy pixel.

In an embodiment, the first capacitor of the first dummy pixel and the first capacitor of the second dummy pixel may be provided as a single body. The first dummy pixel and the second dummy pixel share the first capacitor.

BRIEF DESCRIPTION OF THE DRAWINGS

The above and other features of embodiments of the disclosure will become more apparent by describing in further detail embodiments thereof with reference to the accompanying drawings, in which:

FIG. 1 is a schematic block diagram illustrating an embodiment of a display device.

FIG. 13 is a schematic enlarged plan view of a portion EA2 of FIG. 7.

FIG. 15 is a schematic enlarged plan view of a portion of a first area, corresponding to the portion EA2 of FIG. 7.

FIG. 25 is a schematic flow diagram illustrating an embodiment of a method of repairing a display device.

FIG. 27 is a schematic view of a portion EA3 of FIG. 26.

DETAILED DESCRIPTION

Figure 2:
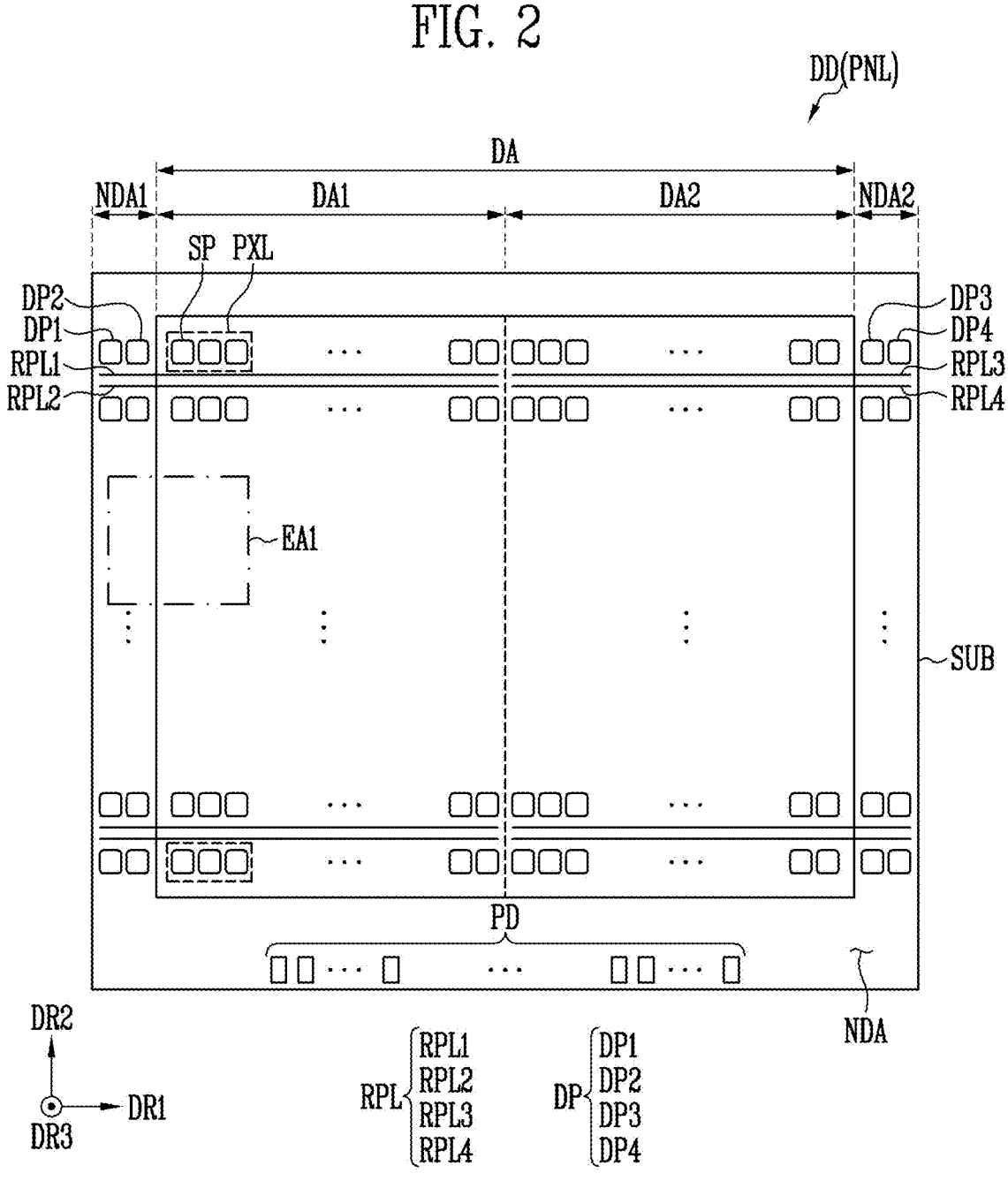
FIG. 2 is a schematic plan view illustrating an embodiment of a display device.

The disclosure now will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be thorough and complete, and will fully convey the scope of the disclosure to those skilled in the art.

In describing the drawings, like reference numerals have been used for like elements. In the accompanying drawings, the dimensions of the structures are enlarged than the actual size in order to clearly explain the disclosure. It will be understood that, although the terms "first", "second", etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the following description, when a first part is "connected" to a second part, this includes not only the case where the first part is directly connected to the second part, but also the case where a third part is interposed therebetween and they are connected to each other.

Furthermore, relative terms, such as "lower" or "bottom" and "upper" or "top," may be used herein to describe one element's relationship to another element as illustrated in the drawing figures. It will be understood that relative terms are intended to encompass different orientations of the device in addition to the orientation depicted in the drawing figures. For example, if the device in one of the drawing figures is turned over, elements described as being on the "lower" side of other elements would then be oriented on "upper" sides of the other elements. The term "lower," may therefore, encompasses both an orientation of "lower" and "upper," depending on the particular orientation of the figure. Similarly, when the device in one of the drawing figures is turned over, elements described as "below" or "beneath" other elements would then be oriented "above" the other elements.

The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Hereinafter, embodiments of the disclosure will be described in detail with reference to the accompanying drawings.

Figure 1:
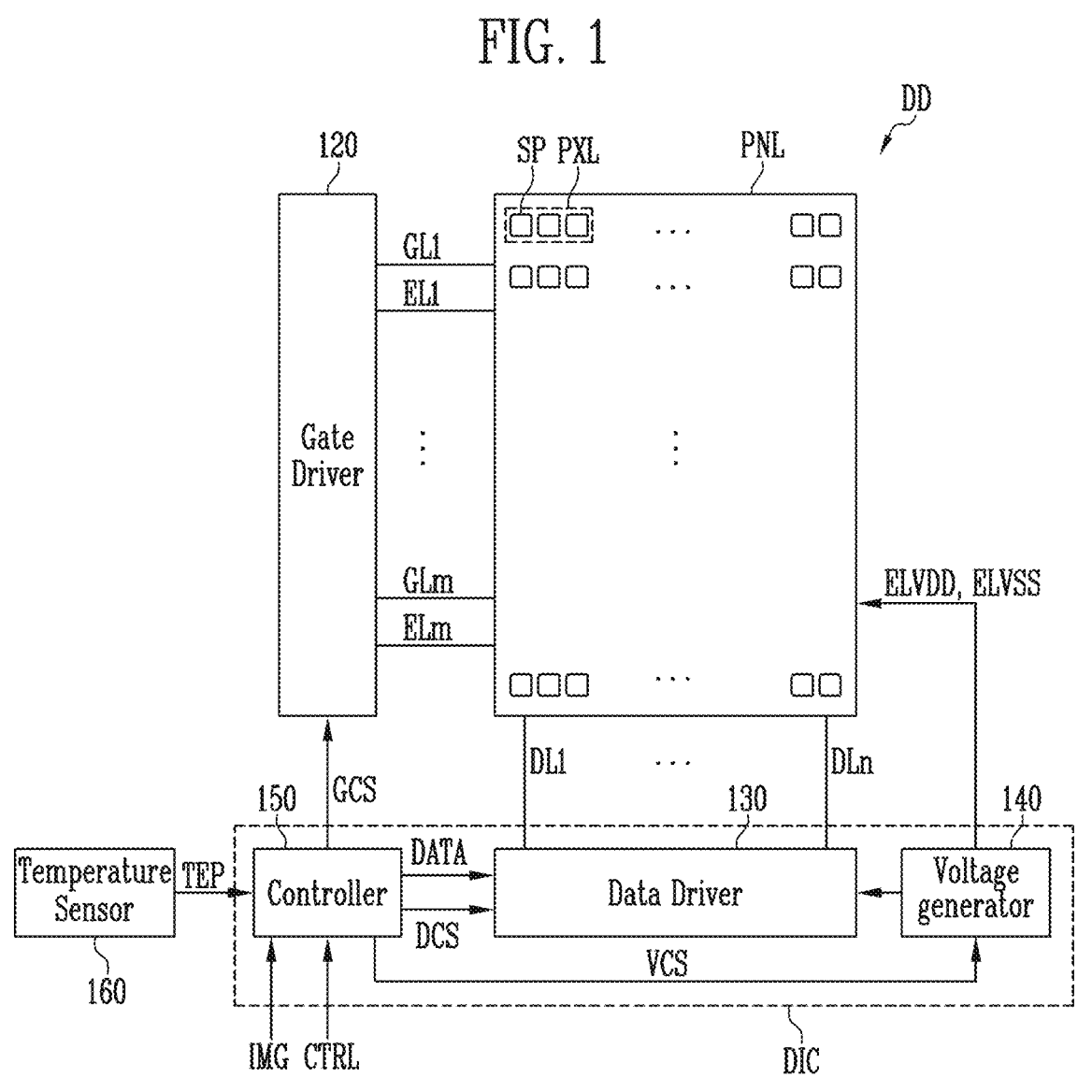

FIG. 1 is a schematic block diagram illustrating an embodiment of a display device DD.

Referring to FIG. 1, the display device DD may include a display panel PNL, a gate driver 120, a data driver 130, a voltage generator 140, and a controller 150.

The display panel PNL may include sub-pixels SP. The sub-pixels SP may be connected to the gate driver 120 through first to mth gate lines GL1 to GLm where m is a natural number. The sub-pixels SP may be connected to the data driver 130 through first to nth data lines DL1 to DLn where n is a natural number.

Each of the sub-pixels SP may include at least one light-emitting element which generates light. Accordingly, each of the sub-pixels SP may generate light of a particular color, such as red, green, blue, cyan, magenta, yellow, or the like. Two or more of the sub-pixels SP may constitute a single pixel PXL. In an embodiment, as shown in FIG. 1, three sub-pixels SP may constitute a single pixel PXL, for example.

The gate driver 120 may be coupled to the sub-pixels SP arranged in a row direction through the first to mth gate lines GL1 to GLm. The gate driver 120 may output gate signals to the first to mth gate lines GL1 to GLm in response to a gate control signal GCS. The gate driver 120 may be arranged on one side of the display panel PNL, but is not limited thereto.

In an embodiment, first to mth emission control lines EL1 to ELm which are connected to the sub-pixels SP in the row direction may be further provided. The gate driver 120 may include an emission control driver which controls the first to mth emission control lines EL1 to ELm. The emission control driver may be operable under the control of the controller 150.

The data driver 130 may be connected to the sub-pixels SP arranged in a column direction through the first to nth data lines DL1 to DLn. The data driver 130 may receive image data DATA and data control signals DCS from the controller 150. The data driver 130 may operate in response to the data control signals DCS.

The data driver 130 may apply data signals having grayscale voltages corresponding to the image data DATA to the first to nth data lines DL1 to DLn by the voltages from the voltage generator 140. When a gate signal is applied to each of the first to mth gate lines GL1 to GLm, the data signals corresponding to the image data DATA may be applied to the first to nth data lines DL1 to DLn. Accordingly, the corresponding sub-pixels SP may generate light corresponding to the data signals. Accordingly, an image may be displayed on the display panel PNL.

In an embodiment, the gate driver 120 and the data driver 130 may include complementary metal-oxide semiconductor ("CMOS") circuit elements.

The voltage generator 140 may be operable in response to a voltage control signal VCS from the controller 150. The voltage generator 140 may generate a plurality of voltages and provide the generated voltages to components of the display device DD. In an embodiment, the voltage generator 140 may receive an input voltage from outside the display device DD, control the input voltage, and regulate the controlled voltage to thereby generate the plurality of voltages, for example.

The voltage generator 140 may generate a first power supply voltage ELVDD and a second power supply voltage ELVSS, and the generated first and second power supply voltages ELVDD and ELVSS may be provided to the sub-pixels SP. The first power supply voltage ELVDD may have a relatively high voltage level, and the second power supply voltage ELVSS may have a lower voltage level than the first power supply voltage ELVDD. In other embodiments, the first power supply voltage ELVDD or the second power supply voltage ELVSS may be provided by an external device to the display device DD.

In addition, the voltage generator 140 may generate various voltages. In an embodiment, the voltage generator 140 may generate an initialization voltage which is applied to the sub-pixels SP, for example. In an embodiment, a predetermined reference voltage may be applied to the first to nth data lines DL1 to DLn during a sensing operation to sense the electrical characteristics of the transistors and/or light-emitting elements of the sub-pixels SP, and the voltage generator 140 may generate the reference voltage, for example.

The controller 150 may control various operations of the display device DD. The controller 150 may receive a control signal CTRL from an external source to control the input image data IMG and the display thereof. The controller 150 may provide the gate control signal GCS, the data control signal DCS, and the voltage control signal VCS in response to the control signal CTRL.

The controller 150 may convert the input image data IMG to be suitable for the display device DD or the display panel PNL to output the image data DATA. In an embodiment, the controller 150 may output the image data DATA by aligning the input image data IMG to fit the sub-pixels SP in a row unit.

Two or more components among the data driver 130, the voltage generator 140, and the controller 150 may be disposed (e.g., mounted) on a single integrated circuit. As shown in FIG. 1, the data driver 130, the voltage generator 140, and the controller 150 may be included in a driver integrated circuit DIC. The data driver 130, the voltage generator 140, and the controller 150 may be functionally distinct components within the single driver integrated circuit DIC. In other embodiments, at least one of the data driver 130, the voltage generator 140, and the controller 150 may be provided as a separate component in the driver integrated circuit DIC.

The display device DD may include at least one temperature sensor 160. The temperature sensor 160 may sense temperature in the vicinity thereof and generate temperature data TEP indicative of the sensed temperature. In an embodiment, the temperature sensor 160 may be arranged next (adjacent) to the display panel PNL and/or the driver integrated circuit DIC.

The controller 150 may control various operations of the display device DD in response to the temperature data TEP. In an embodiment, the controller 150 may adjust the brightness of the image output from the display panel PNL in response to the temperature data TEP.

FIG. 2 is a schematic plan view illustrating an embodiment of the display device DD. For convenience, FIG. 2 schematically illustrates the structure of a display area DA of the display device DD where an image is displayed, e.g., the structure of the display panel PNL provided in the display device DD.

Referring to FIG. 2, the display device DD (or the display panel PNL) may include a substrate SUB and the sub-pixels SP.

The display device DD may have various shapes, e.g., but not limited to, a quadrangular, e.g., rectangular plate having two pairs of sides parallel to each other. The embodiments may be applicable when the display device DD is an electronic device with a display surface on at least one side thereof, such as a smartphone, a television, a tablet PC, a mobile phone, a video phone, an e-book reader, a desktop personal computer ("PC"), a laptop PC, a netbook computer, a workstation, a server, a personal digital assistance ("PDA"), a portable multimedia player ("PMP"), a motion pictures expert group audio layer III ("MP3") player, a medical device, a camera, a or wearable device.

The substrate SUB may include a transparent insulating material which allows light to pass therethrough. The substrate SUB may be a rigid substrate or a flexible substrate.

The rigid substrate may be one of, e.g., a glass substrate, a quartz substrate, a glass-ceramic substrate, and a crystalline glass substrate.

The flexible substrate may be one of a film substrate and a plastic substrate which includes a polymer organic material. In an embodiment, the flexible substrate may include at least one of polystyrene, polyvinyl alcohol, polymethylmethacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate, for example.

The sub-pixels SP may be arranged in the display area DA on the substrate SUB. The sub-pixels SP may be arranged in a matrix form along a first direction DR1 and a second direction DR2 crossing the first direction DR1, but the arrangement of the sub-pixels SP is not limited thereto. In an embodiment, the sub-pixels SP may be arranged in a zigzag pattern in the first direction DR1 and the second direction DR2, for example. In an embodiment, the sub-pixels SP may be arranged in a PENTILE™ arrangement structure, for example. The first direction DR1 may be a row direction and the second direction DR2 may be a column direction.

Two or more sub-pixels SP among the plurality of sub-pixels SP may include the single pixel PXL.

One area of the substrate SUB may be provided as the display area DA on which the sub-pixels SP are placed, and the remaining area of the substrate SUB may be provided as a non-display area NDA.

In the non-display area NDA on the substrate SUB, components for controlling the sub-pixels SP may be arranged. In an embodiment, wiring associated with the sub-pixels SP, such as the first to mth gate lines GL1 to GLm and the first to nth data lines DL1 to DLn as shown FIG. 1 may be arranged in the non-display area NDA, for example.

In an embodiment, the display area DA may include a first area DA1 (or a first display area) and a second area DA2 (or second display area) next (adjacent) in the first direction DR1. By bisecting the display area DA around an imaginary line disposed at the center of the display area DA, the display area DA may be divided into the first area DA1 and the second area DA2. When viewed in plan, the first area DA1 may be disposed on the left side and the second area DA2 may be disposed on the right side.

The non-display area NDA may include a first non-display area NDA1 surrounding at least one side of the first area DA1 and a second non-display area NDA2 surrounding at least one side of the second area DA2.

In each of the first and second non-display areas NDA1 and NDA2, two dummy pixels DP corresponding to each pixel row may be arranged. In an embodiment, the non-display area NDA may have two dummy pixels DP corresponding to each pixel row, for example. The dummy pixels DP may include first and second dummy pixels DP1 and DP2 arranged in the first non-display area NDA1 and third and fourth dummy pixels DP3 and DP4 arranged in the second non-display area NDA2.

The first dummy pixel DP1 and a second dummy pixel DP2 may be arranged next (adjacent) in the first direction DR1 in the first non-display area NDA1. The third dummy pixel DP3 and the fourth dummy pixel DP4 may be arranged next (adjacent) in the first direction DR1 in the second non-display area NDA2. The second dummy pixel DP2 may be arranged closer to the first area DA1 than the first dummy pixel DP1, and the third dummy pixel DP3 may be arranged closer to the second area DA2 than the fourth dummy pixel DP4, but the disclosure is not limited thereto. Depending on embodiments, the first dummy pixel DP1 may be arranged closer to the first area DA1 than the second dummy pixel DP2, and the fourth dummy pixel DP4 may be arranged closer to the second area DA2 than the third dummy pixel DP3.

Pads PD may be arranged in the non-display area NDA on the substrate SUB. The pads PD may be electrically connected to the sub-pixels SP through wiring. In an embodiment, the pads PD may be connected to the sub-pixels SP through the first to nth data lines DL1 to DLn as described above with reference to FIG. 1, for example.

The pads PD may interface the display panel PNL to other components of the display device DD. In an embodiment, the voltages and signals desired to operate the components included in the display panel PNL may be provided through the pads PD from the driver integrated circuit DIC of FIG. 1.

In an embodiment, the display device DD may include repair lines RPL provided in common across the display area DA and the non-display area NDA. The repair lines RPL may include a first repair line RPL1, a second repair line RPL2, a third repair line RPL3, and a fourth repair line RPL4. The first repair line RPL1 and the second repair line RPL2 may be provided in common across the first area DA1 and the first non-display area NDA1. The third repair line RPL3 and the fourth repair line RPL4 may be provided in common across the second area DA2 and the second non-display area NDA2.

In the first area DA1, the first repair line RPL1 and the second repair line RPL2 may be arranged between two sub-pixels SP facing each other in the second direction DR2. In the first non-display area NDA1, the first repair line RPL1 and the second repair line RPL2 may be arranged between two first dummy pixels DP1 facing each other in the second direction DR2 and between two second dummy pixels DP2, respectively.

In the second area DA2, the third repair line RPL3 and the fourth repair line RPL4 may be arranged between two sub-pixels SP facing each other in the second direction DR2. In the second non-display area NDA2, the third repair line RPL3 and the fourth repair line RPL4 may be arranged between two third dummy pixels DP3 facing each other in the second direction DR2 and between two fourth dummy pixels DP4, respectively.

Figure 3:
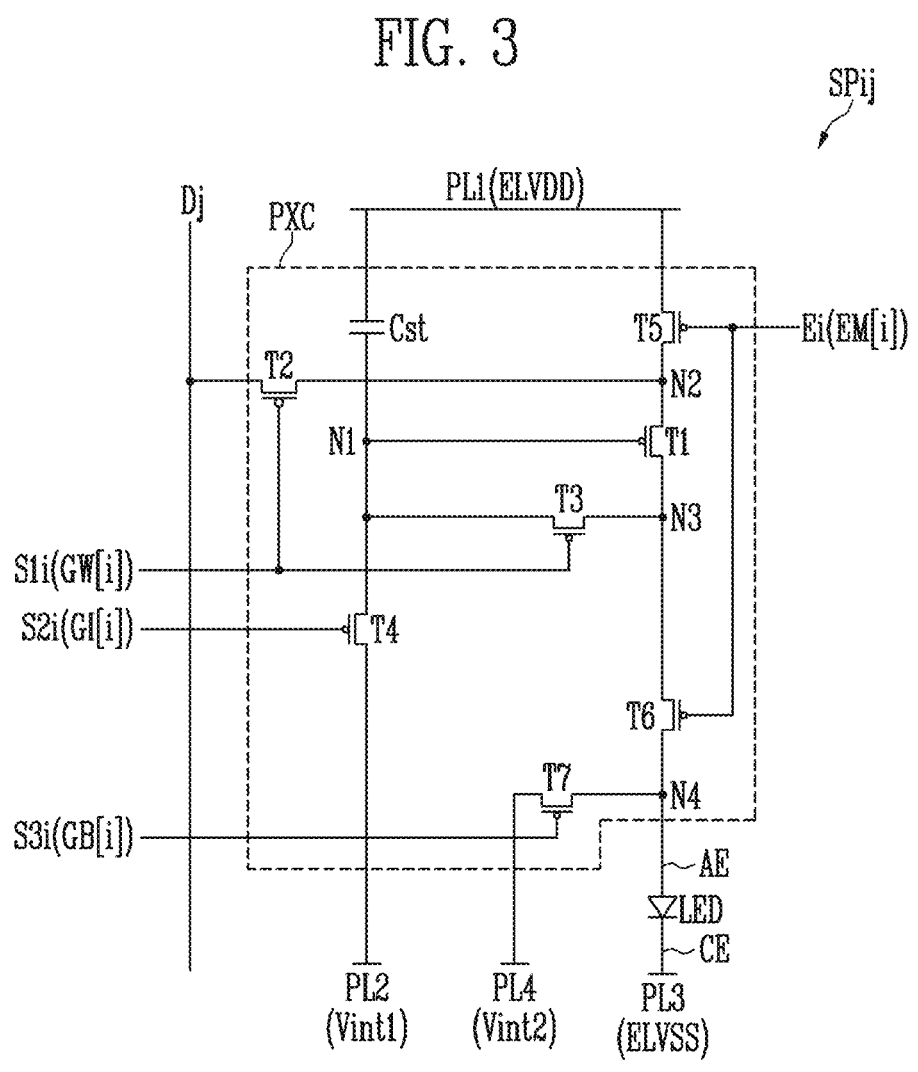
FIG. 3 is a schematic diagram illustrating an embodiment of one sub-pixel among sub-pixels of FIG. 2.

FIG. 3 is a schematic diagram illustrating an embodiment of a sub-pixel SPij which is one of the sub-pixels of FIG. 2. Here, i is a natural number equal to or less than m, and j is a natural number equal to or less than n. For convenience of description, FIG. 3 illustrates a sub-pixel SPij disposed on an i-th horizontal line (or an i-th pixel row) and connected to a j-th data line Dj.

Referring to FIGS. 2 and 3, the sub-pixel Spij may be arranged on the i-th horizontal line.

The sub-pixel SPij may include a light-emitting element LED and a pixel circuit PXC. The pixel circuit PXC may include first, second, third, fourth, fifth, sixth, and seventh transistors T1, T2, T3, T4, T5, T6, and T7, and a storage capacitor Cst.

The first transistor T1 may be electrically connected between the first power line PL1 and an anode electrode AE of the light-emitting element LED. The first transistor T1 may include a gate electrode electrically connected to a first node N1. The first transistor T1 may control the amount of current (or a driving current flowing from the first power line PL1 to the third power line PL3 through the light-emitting element LED based on a voltage at the first node N1). The first power line PL1 is supplied with the first power supply voltage ELVDD, the third power line PL3 is supplied with the second power supply voltage ELVSS, and the first power supply voltage ELVDD may be set to a voltage higher than the second power supply voltage ELVSS.

The second transistor T2 may be electrically connected between a j-th data line Dj and a second node N2. A gate electrode of the second transistor T2 may be connected to a 1i-th scan line S1i (or the first scan line). The second transistor T2 may be turned on when a first scan signal GW[i] (e.g., a low-level first scan signal) is supplied to the 1i-th scan line S1i to electrically connect the j-th data line Dj and the second node N2. When each of the first transistor T1 and the third transistor T3 is in a turn-on state, the second transistor T2 may transfer a data signal of the j-th data line Dj to the second node N2 in response to the first scan signal GW[i].

The third transistor T3 may be electrically connected between the first node N1 and a third node N3. A gate electrode of the third transistor T3 may be electrically connected to the 1i-th scan line S1i. The third transistor T3 may be turned on when the first scan signal GW[i] is supplied to the 1i-th scan line S1i. When the third transistor T3 is turned on, the first transistor T1 may be diode-connected.

The fourth transistor T4 may be electrically connected between the first node N1 and a second power line PL2. A gate electrode of the fourth transistor T4 may be electrically connected to a 2i-th scan line S2i (the second scan line). The second power line PL2 may be provided with a first initialization power supply voltage Vint1. The fourth transistor T4 may be turned on by a second scan signal GI[i] supplied to the 2i-th scan line S2i. When the fourth transistor T4 is turned on, the first initialization power supply voltage Vint1 may be supplied to the first node N1 (i.e., a gate electrode of the first transistor T1).

A fifth transistor T5 may be electrically connected between the first power line PL1 and the second node N2. The gate electrode of the fifth transistor T5 may be electrically connected to an i-th emission control line Ei. The sixth transistor T6 may be electrically connected between the third node N3 and the light-emitting element LED (or a fourth node N4). A gate electrode of the sixth transistor T6 may be electrically connected to the i-th emission control line Ei. The fifth transistor T5 and the sixth transistor T6 may be turned off when an emission control signal EM[i] (e.g., a high-level emission control signal EM[i]) is supplied to the i-th emission control line Ei, and may be turned on otherwise.

The seventh transistor T7 may be electrically connected between the anode electrode AE (i.e., the fourth node N4) of the light-emitting element LED and a fourth power line PL4. A gate electrode of the seventh transistor T7 may be electrically connected to a 3i-th scan line S3i. The fourth power line PL4 may be supplied with a second initialization power supply voltage Vint2. The seventh transistor T7 may be turned on by a third scan signal GB[i] supplied to the 3i-th scan line S3i to supply the second initialization power supply voltage Vint2 to the anode electrode AE of the light-emitting element LED. The second initialization power supply voltage Vint2 may be the same as the first initialization power supply voltage Vint1, but is not limited thereto.

The storage capacitor Cst may be connected or formed between the first power line PL1 and the first node N1.

The light-emitting element LED may include the anode electrode AE and a cathode electrode CE. The anode electrode AE may be connected to the fourth node N4 and the cathode electrode CE may be connected to the third power line PL3. The cathode electrode CE of the light-emitting element LED may be supplied with the second power supply voltage ELVSS. The light-emitting element LED may receive a driving current from the first transistor T1 and emit light.

In an embodiment, the pixel circuit PXC may include a P-type transistor. In an embodiment, the first to seventh transistors T1 to T7 may include polysilicon transistors including silicon semiconductors and may include a polysilicon semiconductor layer as an active layer, for example. In an embodiment, the active layer may be formed through a low-temperature polysilicon process (e.g., a low-temperature poly-silicon ("LTPS") process), for example.

Figure 4:
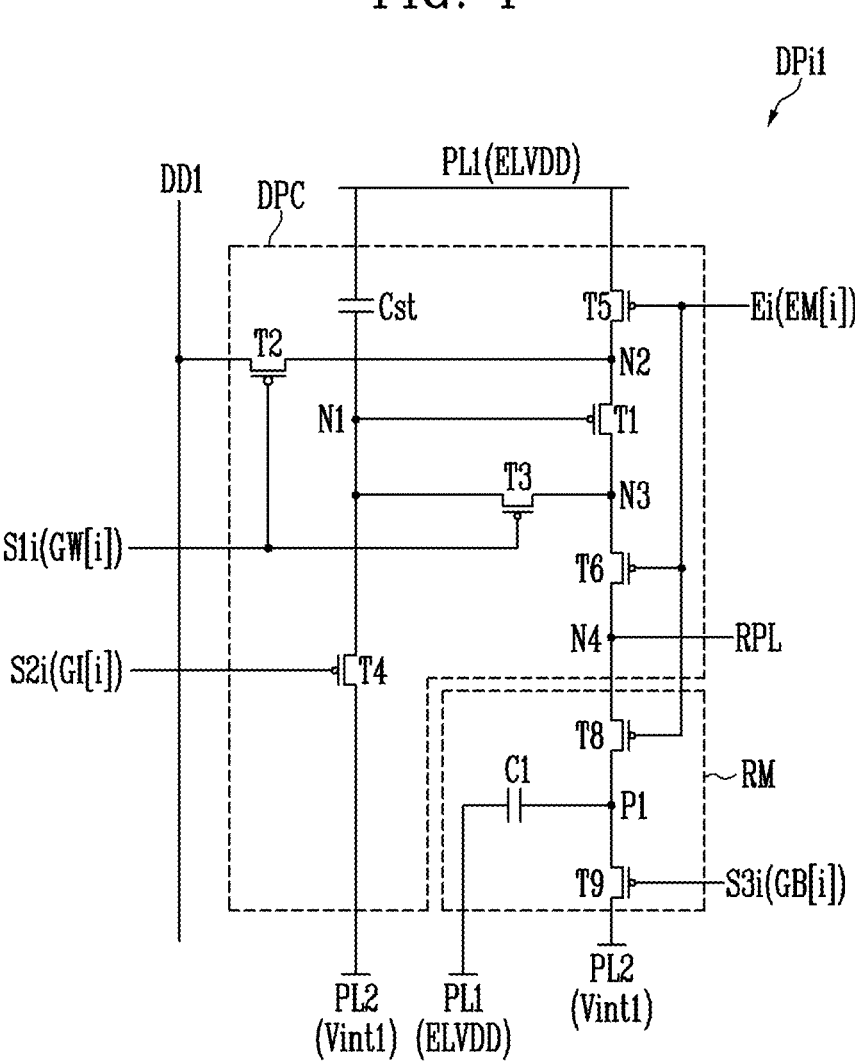
FIG. 4 is a schematic diagram illustrating an embodiment of one dummy pixel among dummy pixels of FIG. 2.

FIG. 4 is a schematic diagram illustrating an embodiment of a dummy pixel DPi1 which is one of the dummy pixels of FIG. 2. For convenience of description, FIG. 4 illustrates the dummy pixel DPi1 disposed on the i-th horizontal line (or the i-th pixel row) in the first non-display area and coupled to a first dummy data line DD1.

Referring to FIG. 4, for convenience of description, an overlapping description with the above-described embodiments will be omitted.

Referring to FIGS. 2 and 4, the dummy pixel DPi1 may be arranged on the i-th horizontal line.

The dummy pixel DPi1 may include a dummy pixel circuit DPC and a repair modulation circuit RM. The dummy pixel circuit DPC may include first, second, third, fourth, fifth, and sixth transistors T1, T2, T3, T4, T5, and T6, and the storage capacitor Cst. In other words, the dummy pixel circuit DPC may include substantially the same configuration as the pixel circuit PXC described with reference to FIG. 3, except for the seventh transistor T7.

The repair modulation circuit RM may include an eighth transistor T8, a ninth transistor T9, and a first capacitor C1. The repair modulation circuit RM is connected to a repair line RPL, the i-th emission control line Ei, and the 3i-th scan line S3i.

The eighth transistor T8 may be electrically connected between the fourth node N4 and a connection node P1. A gate electrode of the eighth transistor T8 may be electrically connected to the i-th emission control line Ei. A first input/output terminal of the eighth transistor T8 may be electrically connected to the fourth node N4 (or a node electrically connecting the repair line RPL and a light-emitting element of a defective sub-pixel), and a second input/output terminal of the eighth transistor T8 may be electrically connected to the first capacitor C1 and the connection node P1 of the ninth transistor T9.

The ninth transistor T9 may be electrically connected between the eighth transistor T8 and the second power line PL2. A gate electrode of the ninth transistor T9 may be electrically connected to the 3i-th scan line S3i. A first input/output terminal of the ninth transistor T9 may be electrically connected to the connection node P1, and a second input/output terminal of the ninth transistor T9 may be electrically connected to the second power line PL2.

One terminal of the first capacitor C1 is connected to the connection node P1 (or between the second input/output terminal of the eighth transistor T8 and the first input/output terminal of the ninth transistor T9), and a remaining (the other) terminal of the first capacitor C1 may be electrically connected to the first power line PL1.

In the dummy pixel DPi1, the fourth node N4 may be electrically connected to the repair line RPL. When the sub-pixel SP of the display area DA fails, the wiring between the anode electrode of the light-emitting element of the defective sub-pixel and the sixth transistor T6 may be disconnected, and the anode electrode and the repair line RPL may be connected so that the light-emitting element of the defective sub-pixel may emit light normally. A detailed description of the repairing method of the defective sub-pixel will be described below.

Figure 5:
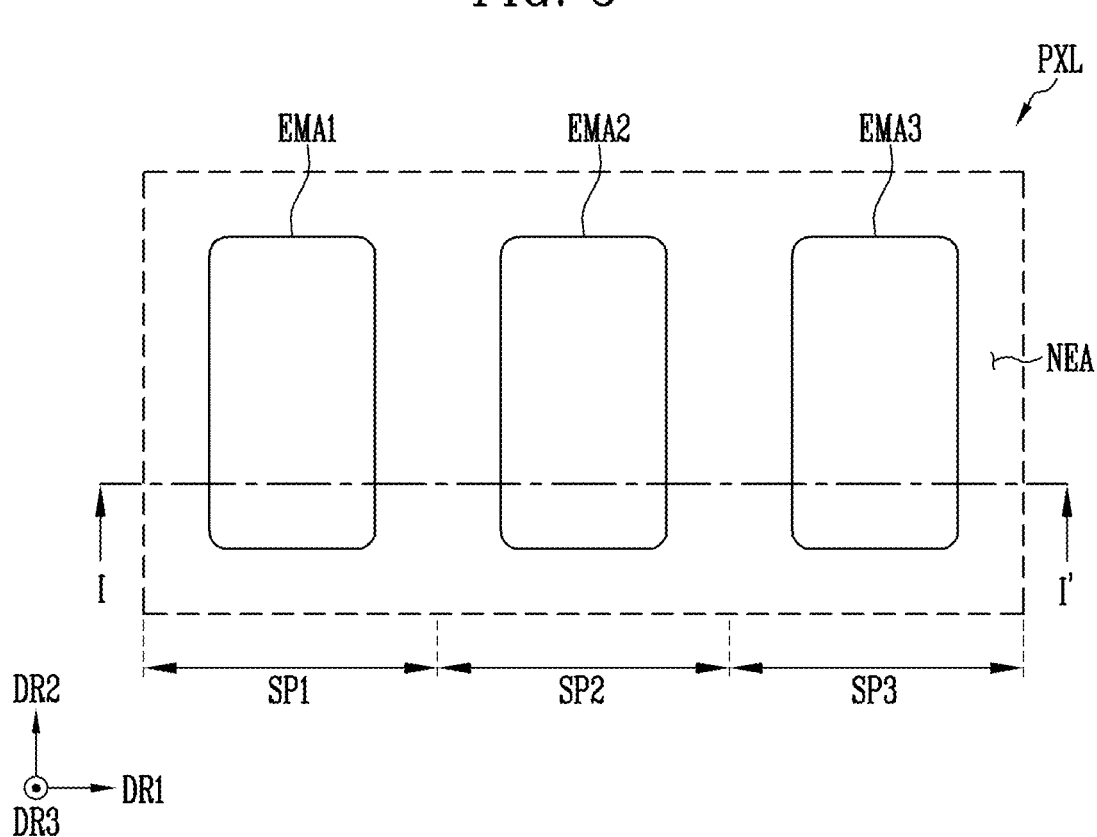
FIG. 5 is a schematic plan view illustrating an embodiment of one pixel among pixels of FIG. 2.

FIG. 5 is a schematic plan view illustrating an embodiment of one pixel among pixels of FIG. 2.

Referring to FIGS. 2 and 5, the pixel PXL may include a first sub-pixel SP1, a second sub-pixel SP2, and a third sub-pixel SP3 arranged in the first direction DR1.

The first sub-pixel SP1 may include a first emission area EMA1 and a non-emission area NEA around the first emission area EMA1. The second sub-pixel SP2 may include a second emission area EMA2 and the non-emission area NEA around the second emission area EMA2. The third sub-pixel SP3 may include a third emission area EMA3 and the non-emission area NEA around the third emission area EMA3.

The first emission area EMA1 may be an area where light is emitted from the light-emitting element (refer to "LED" in FIG. 3) corresponding to the first sub-pixel SP1. The second emission area EMA2 may be an area where light is emitted from the light-emitting element LED corresponding to the second sub-pixel SP2. The third emission area EMA3 may be an area where light is emitted from the light-emitting element LED corresponding to the third sub-pixel SP3.

The first sub-pixel SP1, the second sub-pixel SP2, and the third sub-pixel SP3 may have substantially the same area, but are not limited thereto. In some embodiments, the second sub-pixel SP2 may have a greater area than the first sub-pixel SP1, and the third sub-pixel SP3 may have a greater area than the second sub-pixel SP2.

The first sub-pixel SP1, the second sub-pixel SP2, and the third sub-pixel SP3 may have a polygonal shape. In an embodiment, the first sub-pixel SP1, the second sub-pixel SP2, and the third sub-pixel SP3 may have a square shape or a hexagonal shape, for example, but are not limited thereto.

Figure 6:
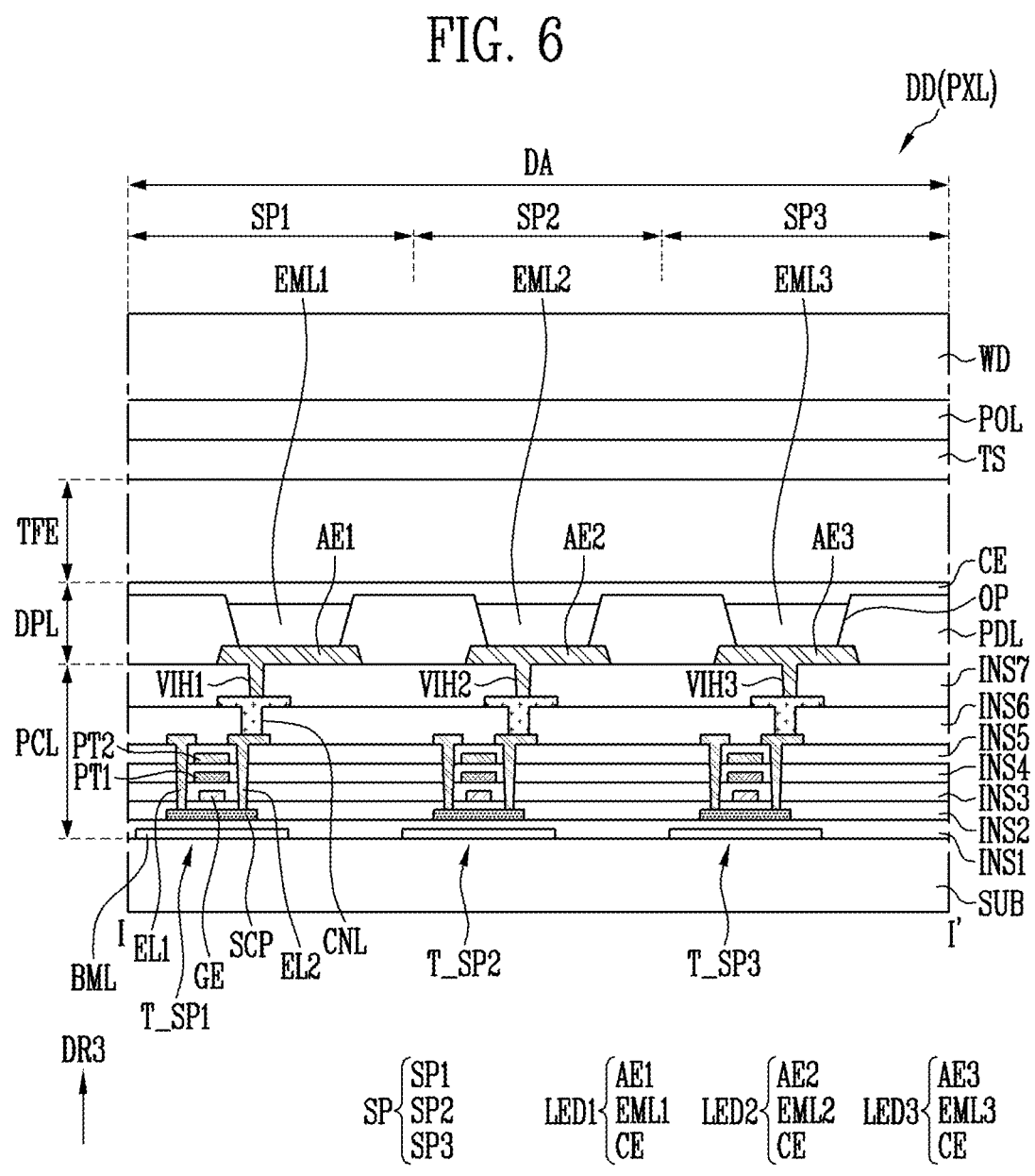
FIG. 6 is a schematic cross-sectional view along line I-I' in FIG. 5.

FIG. 6 is a schematic cross-sectional view along line I-I' in FIG. 5.

In FIG. 6, for convenience of description, a cross-sectional structure or stacked structure of the display device DD, mainly based on the pixels PXL included in the display device DD, is briefly illustrated, and a thickness direction of the substrate SUB is shown as a third direction DR3.

Referring to FIGS. 5 and 6, the display device DD may include one or more pixels PXL arranged in the display area DA.

The pixel PXL may include one or more sub-pixels SP. In an embodiment, the pixel PXL may include the first sub-pixel SP1, the second sub-pixel SP2, and the third sub-pixel SP3, for example. In an embodiment, the first sub-pixel SP1 may be a red sub-pixel, the second sub-pixel SP2 may be a green sub-pixel, and the third sub-pixel SP3 may be a blue sub-pixel, but the disclosure is not limited thereto. Hereinafter, the first sub-pixel SP1, the second sub-pixel SP2, and the third sub-pixel SP3 are collectively referred to as the sub-pixel SP and/or the sub-pixels SP.

Each of the first to third sub-pixels SP1 to SP3 may include the substrate SUB, a pixel circuit layer PCL, a display element layer DPL, a thin film encapsulation layer TFE, and a window WD.

The substrate SUB may include a transparent insulating material which allows light to pass therethrough. The substrate SUB may be a rigid substrate or a flexible substrate.

The pixel circuit layer PCL of the sub-pixels SP may be arranged on the substrate SUB. One or more insulating layers may be arranged on the pixel circuit layer PCL. The insulating layers may include a first insulating layer INS1, a second insulating layer INS2, a third insulating layer INS3, a fourth insulating layer INS4, a fifth insulating layer INS5, a sixth insulating layer INS6, and a seventh insulating layer INS7 stacked sequentially on the substrate SUB in the third direction DR3. The insulating layers arranged on the pixel circuit layer PCL are not limited to the above-described embodiments, and other insulating layers may be added or some insulating layers may be omitted.

The first insulating layer INS1 may be arranged on the substrate SUB. The first insulating layer INS1 may prevent impurities from diffusing into circuit elements (or driving elements) constituting the pixel circuit (refer to "PXC" in FIG. 3), e.g., transistors. The first insulating layer INS1 may be an inorganic layer including an inorganic material (or substance). The first insulating layer INS1 may include at least one of silicon nitride ($SiN_x$), silicon oxide ($SiO_x$), silicon oxynitride ($SiO_xN_y$), and aluminum oxide ($AlO_x$). The first insulating layer INS1 may be provided as a single layer, but may also be provided as multiple layers of at least two or more layers. The first insulating layer INS1 may be omitted depending on the material and process conditions of the substrate SUB.

The second insulating layer INS2 may be arranged on the first insulating layer INS1. The second insulating layer INS2 may include the same material as that of the first insulating layer INS1 or may include a material suitable (or selected) from among the materials exemplified as the constituents of the first insulating layer INS1. In an embodiment, the second insulating layer INS2 may be an inorganic layer including an inorganic material, for example.

The third insulating layer INS3 may be arranged on the second insulating layer INS2. The third insulating layer INS3 may include the same material as that of the first insulating layer INS1 or may include one or more materials suitable (or selected) from among the materials exemplified as the constituents of the first insulating layer INS1.

The fourth insulating layer INS4 may be arranged on the third insulating layer INS3. The fourth insulating layer INS4 may be an inorganic layer including an inorganic material or an organic layer including an organic material.

The fifth insulating layer INS5 may be arranged on the fourth insulating layer INS4. The fifth insulating layer INS5 may include the same material as that of the first insulating layer INS1 or may include one or more materials suitable (or selected) from among the materials exemplified as the constituents of the first insulating layer INS1.

The sixth insulating layer INS6 (or a first via layer) may be arranged on the fifth insulating layer INS5. The sixth insulating layer INS6 may be an inorganic layer including an inorganic material or an organic layer including an organic material. The inorganic layer may include, e.g., at least one of silicon oxide (SiO$_x$), silicon nitride (SiN$_x$), silicon oxynitride (SiO$_x$N$_y$), and aluminum oxide (AlO$_x$). The organic layer may be, e.g., a polyacrylates resin, an epoxy resin, a phenolic resin, a polyamides resin, a polyimides resin, an unsaturated polyesters resin, an unsaturated polyester resin, a poly-phenylen ethers resin, a poly-phenylene sulfides resin, and a benzocyclobutene resin. In an embodiment, the sixth insulating layer INS6 may be an organic layer including an organic material.

The seventh insulating layer INS7 (or a second through layer) may be arranged on the sixth insulating layer INS6. The seventh insulating layer INS7 may include the same material as that of the sixth insulating layer INS6 or may include one or more materials suitable (or selected) from among the materials exemplified as the constituents of the sixth insulating layer INS6. In an embodiment, the seventh insulating layer INS7 may be an organic layer including an organic material, for example.

The pixel circuit layer PCL may include one or more conductive layers arranged between the above-described insulating layers. In an embodiment, the conductive layers may include a first conductive layer arranged between the second insulating layer INS2 and the third insulating layer INS3, a second conductive layer arranged between the third insulating layer INS3 and the fourth insulating layer INS4, a third conductive layer arranged between the fourth insulating layer INS4 and the fifth insulating layer INS5, a fourth conductive layer arranged between the fifth insulating layer INS5 and the sixth insulating layer INS6, and a fifth conductive layer arranged between the sixth insulating layer INS6 and the seventh insulating layer INS7, for example. However, the insulating layers and the conductive layers are not limited to the above-described embodiments, and other insulating layers and other conductive layers in addition to the above insulating layers and the above conductive layers may be arranged in the pixel circuit layer PCL in embodiments.

The pixel circuit layer PCL may include circuit elements (or driving elements) of each of the first to third sub-pixels SP1 to SP3. In an embodiment, the pixel circuit layer PCL may include a transistor T_SP1 of the first sub-pixel SP1, a transistor T_SP2 of the second sub-pixel SP2, and a transistor T_SP3 of the third sub-pixel SP3, for example. The transistor T_SP1 of the first sub-pixel SP1 is one of the transistors included in the pixel circuit PXC of the first sub-pixel SP1. The transistor T_SP2 of the second sub-pixel SP2 is one of the transistors included in the pixel circuit PXC of the second sub-pixel SP2. The transistor T_SP3 of the third sub-pixel SP3 is one of the transistors included in the pixel circuit PXC of the third sub-pixel SP3. In FIG. 6, one of the transistors of each sub-pixel SP is shown, and remaining (the other) circuit elements are omitted for clarity and simplicity.

The transistor T_SP1 of the first sub-pixel SP1 may include a semiconductor pattern SCP, a gate electrode GE, a first terminal EL1, and a second terminal EL2.

The gate electrode GE may be arranged on the second insulating layer INS2 and covered by the third insulating layer INS3. In an embodiment, the gate electrode GE may be a first conductive layer (or a first gate conductive layer) disposed between the second insulating layer INS2 and the third insulating layer INS3, for example. The gate electrode GE may overlap a portion of the semiconductor pattern SCP. In an embodiment, the gate electrode GE may overlap an active pattern of the semiconductor pattern SCP, for example.

The pixel circuit layer PCL may include a first pattern PT1 arranged between the third insulating layer INS3 and the fourth insulating layer INS4. The first pattern PT1 may include a second conductive layer (or a second gate conductive layer). In embodiments, the first pattern PT1 may overlap the gate electrode GE between the third insulating layer INS3 interposed therebetween to form a capacitor. Further, the pixel circuit layer PCL may include a second pattern PT2 arranged between the fourth insulating layer INS4 and the fifth insulating layer INS5. The second pattern PT2 may include a third conductive layer (or a third gate conductive layer). In embodiments, the second pattern PT2 may be utilized as signal lines, connection means, etc. which are electrically connected to the transistors.

The semiconductor pattern SCP may be arranged on the first insulating layer INS1 and covered by the second insulating layer INS2. The semiconductor pattern SCP may be a semiconductor layer including polysilicon, amorphous silicon, oxide semiconductor, or the like. The semiconductor pattern SCP may include an active pattern, a first contact region, and a second contact region. The active pattern, the first contact region, and the second contact region may include an undoped or impurity-doped semiconductor layer. In an embodiment, the first contact region and the second contact region may include a semiconductor layer doped with an impurity, and the active pattern may be a region doped at a lower concentration than the first and second contact regions, for example. Accordingly, the conductivity of the first and second contact regions may be greater than the conductivity of the active pattern. The first and second contact regions may be source/drain regions (or source/drain electrodes) of the transistor T_SP1 of the first sub-pixel SP1.

The active pattern of the semiconductor pattern SCP may be a channel region of the transistor T_SP1 of the first sub pixel SP1 which overlaps the gate electrode GE. A first contact region of the semiconductor pattern SCP may contact one end of the active pattern. The first contact region may be electrically connected to the first terminal EL1. A second contact area of the semiconductor pattern SCP may contact an opposite end of the active pattern. The second contact area may be electrically connected to the second terminal EL2.

The first terminal EL1 may be provided and/or formed on the fifth insulating layer INS5. In an embodiment, the first terminal EL1 may include a fourth conductive layer (or a first source-drain conductive layer) formed between the fifth insulating layer INS5 and the sixth insulating layer INS6, for example. The first terminal EL1 may contact the first contact region of the semiconductor pattern SCP through contact holes passing through the fifth insulating layer INS5, the fourth insulating layer INS4, the third insulating layer INS3, and the second insulating layer INS2.

The second terminal EL2 may be provided and/or formed on the fifth insulating layer INS5. The second terminal EL2 may include a fourth conductive layer formed between the fifth insulating layer INS5 and the sixth insulating layer INS6. The second terminal EL2 may contact the second contact region of the semiconductor pattern SCP through contact holes passing through the fifth insulating layer INS5, the fourth insulating layer INS4, the third insulating layer INS3, and the second insulating layer INS2.

The second terminal EL2 may be electrically connected to a connection line CNL arranged on the sixth insulating layer INS6. The connection line CNL may be a fifth conductive layer (or a second source-drain conductive layer) arranged between the sixth insulating layer INS6 and the seventh insulating layer INS7.

In an embodiment, a bottom metal pattern BML may be arranged on a lower side of the transistor T_SP1 of the first sub-pixel SP1 as described above. The bottom metal pattern BML may be a dummy conductive layer disposed between the substrate SUB and the first insulating layer INS1.

As the gate electrode GE, the first terminal EL1, and the second terminal EL2 are electrically connected to other circuit elements and/or wiring, the transistor T_SP1 of the first sub-pixel SP1 may be provided as one of the transistors constituting the pixel circuit PXC of the first sub-pixel SP1.

Each of the transistor T_SP2 of the second sub-pixel SP2 and the transistor T_SP3 of the third sub-pixel SP3 may be configured substantially the same as the transistor T_SP1 of the first sub-pixel SP1.

As described above, the pixel circuit layer PCL may include circuit elements for each of the first to third sub-pixels SP1 to SP3.

The display element layer DPL may be arranged on the pixel circuit layer PCL. The display element layer DPL may include a light-emitting element (refer to "LED" in FIG. 3) and a pixel defining layer PDL. The light-emitting element LED may include an anode electrode, a light-emitting layer, and the cathode electrode CE. The light-emitting element LED may be provided in each of Each of the first to third sub-pixels SP1 to SP3 may be equipped with the. The light-emitting element LED provided in the first sub-pixel SP1 may be a first light-emitting element LED1, the light-emitting element LED provided in the second sub-pixel SP2 may be a second light-emitting element LED2, and the light-emitting element LED provided in the third sub-pixel SP3 may be a third light-emitting element LED3.

A first anode electrode AE1 may be arranged on the pixel circuit layer PCL (or the seventh insulating layer INS7) of the first sub-pixel SP1, a second anode electrode AE2 may be arranged on the pixel circuit layer PCL of the second sub-pixel SP2, and a third anode electrode AE3 may be arranged on the pixel circuit layer PCL of the third sub-pixel SP3. Each of the first to third anode electrodes AE1 to AE3 may be electrically connected to a circuit element arranged on the pixel circuit layer PCL through a via hole passing through the seventh insulating layer INS7. In an embodiment, the first anode electrode AE1 is electrically connected to the transistor T_SP1 of the first sub-pixel SP1 through a first via hole VIH1 penetrating the seventh insulating layer INS7, the second anode electrode AE2 may be electrically connected to the transistor T_SP2 of the second sub-pixel SP2 through a second via hole VIH2 penetrating the seventh insulating layer INS7, and the third anode electrode AE3 may be electrically connected to the transistor T_SP3 of the third sub-pixel SP3 through a third via hole VIH3 penetrating the seventh insulating layer INS7, for example.

Each of the first, second, and third anode electrodes AE1, AE2, and AE3 may have a shape similar to that of each of the first, second, and third emission areas EMA1, EMA2, and EMA3 of FIG. 5 when viewed from the third direction DR3. In an embodiment, the first anode electrode AE1 may have a shape similar to that of the first emission area EMA1 when viewed from the third direction DR3, the second anode electrode AE2 may have a shape similar to that of the second emission area EMA2 when viewed from the third direction DR3, and the third anode electrode AE3 may have a shape similar to that of the third emission area EMA3 when viewed from the third direction DR3, for example. However, the disclosure is not limited thereto.

Each of the first to third anode electrodes AE1 to AE3 may be electrically connected to the corresponding pixel circuit PXC and receive a driving current. Each of the first to third anode electrodes AE1 to AE3 may include, but is not limited to, an opaque conductive material capable of reflecting light. By embodiments, the first to third anode electrodes AE1 to AE3 may include a transparent conductive material.

The pixel defining layer PDL may be disposed on the first to third anode electrodes AE1 to AE3. The pixel defining layer PDL may define an opening OP exposing a portion of the first anode electrode AE1, a portion of the second anode electrode AE2, and a portion of the third anode electrode AE3. The pixel defining layer PDL may be a structure which defines (or partitions) a light-emitting region of each of the first to third sub-pixels SP1 to SP3. In an embodiment, the pixel defining layer PDL may define the first emission area EMA1 of the first sub-pixel SP1, the second emission area EMA2 of the second sub-pixel SP2, and the third emission area EMA3 of the third sub-pixel SP3, for example.

The pixel defining layer PDL may include an organic insulating layer including an organic material. The organic material (or an organic substance) may include, e.g., acrylic resin, epoxy resin, phenolic resin, polyamide resin, polyimide resin, or the like. In embodiments, the pixel defining layer PDL may include a light-absorbing material, or a light absorber may be applied thereto such that the pixel defining layer PDL may absorb light from an external source. In an embodiment, the pixel defining layer PDL may include a carbon-based black pigment of the carbon family, for example. However, the disclosure is not limited thereto.

A first light-emitting layer EML1 may be arranged on the first anode electrode AE1 exposed by the opening OP in the pixel defining layer PDL, and a second light-emitting layer EML2 may be arranged on the second anode electrode AE2 exposed by another opening OP in the pixel defining layer PDL, a third light-emitting layer EML3 may be arranged on the third anode electrode AE3 exposed by another opening OP of the pixel defining layer PDL. Each of the first to third light-emitting layers EML1 to EML3 may have a multilayer structure including a hole injection layer, a hole transport layer, an organic light-emitting layer, an electron transport layer, and an electron injection layer.

The first to third light-emitting layers EML1 to EML3 may include at least one of the light-emitting materials which emit different colors of light depending on the corresponding sub-pixel SP. In an embodiment, the first light-emitting layer EML1 may include at least one of the red light-emitting materials, the second light-emitting layer EML2 may include at least one of the green light-emitting materials, and the third light-emitting layer EML3 may include at least one of the blue light-emitting materials, for example. In an embodiment, each of the first to third light-emitting layers EML1 to EML3 may emit white light as a whole by stacking a plurality of light-emitting materials capable of generating different colors of light, such as red light, green light, blue light, or the like. A color filter may be further arranged on each of the first to third light-emitting layers EML1 to EML3. The color filter may include at least one of a red color filter, a green color filter, and a blue color filter.

The cathode electrode CE may be arranged on the first to third emission layers EML1 to EML3 and the pixel defining layer PDL. The cathode electrode CE may be a common layer which is provided in common to the first to third sub-pixels SP1 to SP3. The cathode electrode CE may be provided in the form of a plate across the entirety of the area of the display area DA. In embodiments, the cathode electrode CE may function as a half mirror which partially transmits and partially reflects light emitted from the corresponding light-emitting layer.

The cathode electrode CE may be a thin metal layer which is thick enough to transmit the light emitted from the corresponding light-emitting layer. The cathode electrode CE may include a metallic material to have a relatively small thickness or may include a transparent conductive material. In an embodiment, the cathode electrode CE may include at least one of various transparent conductive materials, including indium tin oxide, indium zinc oxide, indium tin zinc oxide, aluminum zinc oxide, gallium zinc oxide, zinc tin oxide, or gallium tin oxide. In other embodiments, the cathode electrode CE may include at least one of magnesium, silver, and any combinations thereof. However, the material of the cathode electrode CE is not limited to the above-described embodiments.

The first anode electrode AE1, the first light-emitting layer EML1, and the portion of the cathode electrode CE overlapping the first anode electrode AE1 may constitute the first light-emitting element LED1. The second anode electrode AE2, the second light-emitting layer EML2, and the portion of the cathode electrode CE overlapping the second anode electrode AE2 may constitute the second light-emitting element LED2. The third anode electrode AE3, the third light-emitting layer EML3, and the portion of the cathode electrode CE overlapping the third anode electrode AE3 may constitute the third light-emitting element LED3.

The thin film encapsulation layer TFE may be arranged on the cathode electrode CE. The thin film encapsulation layer TFE may cover the display element layer DPL. The thin film encapsulation layer TFE may prevent oxygen and/or moisture from permeating into the display element layer DPL. In an embodiment, the thin film encapsulation layer TFE may include a structure of one or more inorganic layers stacked alternately with one or more organic layers. In an embodiment, the inorganic layers may include silicon nitride, silicon oxide, or silicon oxynitride, for example. In an embodiment, the organic layer may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene, for example. However, the materials of the organic and inorganic layers of the thin film encapsulation layer TFE are not limited thereto.

A touch sensor layer TS may be arranged on the thin film encapsulation layer TFE. The touch sensor layer TS may be arranged directly on the thin film encapsulation layer TFE.

The touch sensor layer TS may be arranged on a surface of the display device DD on which an image is projected and may receive touch input from a user. The touch sensor layer TS may recognize a touch event of the display device DD through a user's hand, a separate input unit, or the like. In an embodiment, the touch sensor layer TS may recognize the touch event in a capacitive manner, for example.

The window WD may be arranged on the touch sensor layer TS. The window WD may be a protective member arranged on top of the touch sensor layer TS to protect the configuration of the display device DD. The window WD may be glass or plastic. When the window WD includes glass, ultra thin glass ("UTG") having a thickness of 0.1 millimeter (mm) or less may be applicable in order to obtain flexibility. However, the disclosure is not limited thereto.

By embodiments, the display device DD may further include a polarizing layer POL arranged between the touch sensor layer TS and the window WD. The polarizing layer POL may serve to reduce external light reflection. The polarizing layer POL may be coupled to the window WD using an optically clear adhesive member or the like.

Figure 7:
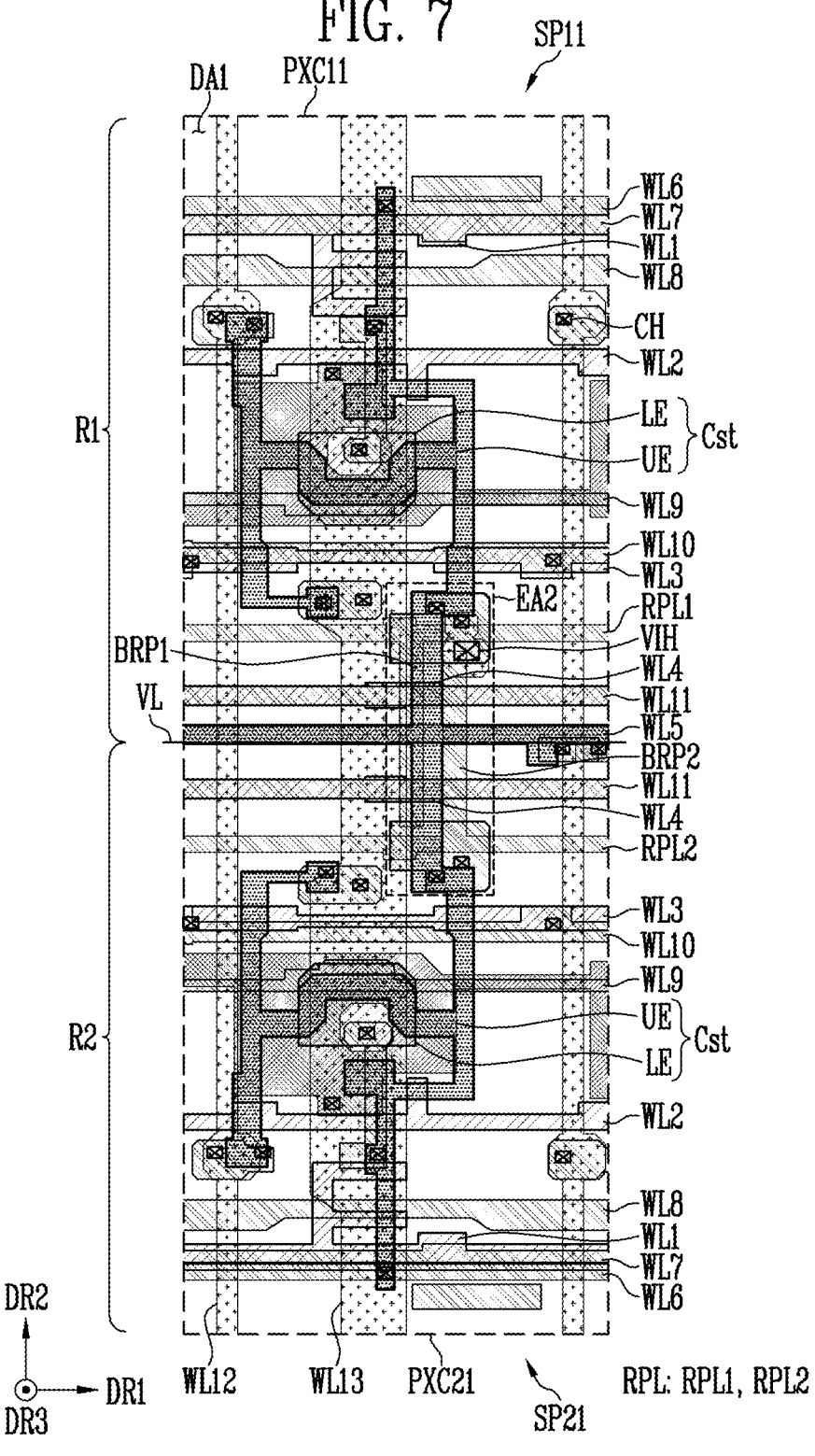
FIG. 7 is a schematic plan view illustrating an embodiment of sub-pixels arranged in a first row and a second row disposed in a portion of a first area of a display area of a display device.
Figure 8:
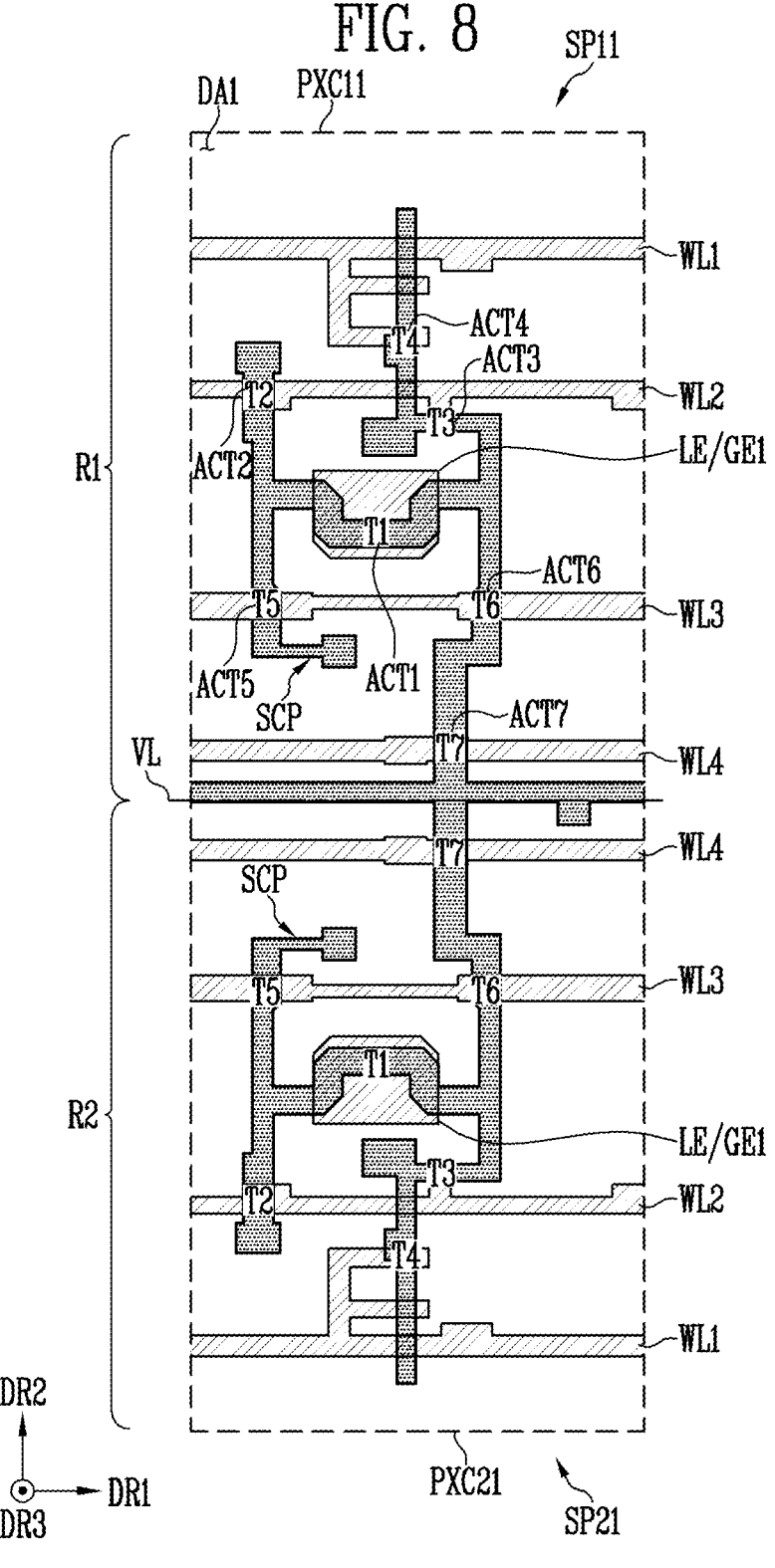
FIG. 8 is a schematic plan view illustrating only the configurations included in first to seventh transistors of FIG. 7 and a first conductive layer.
Figure 9:
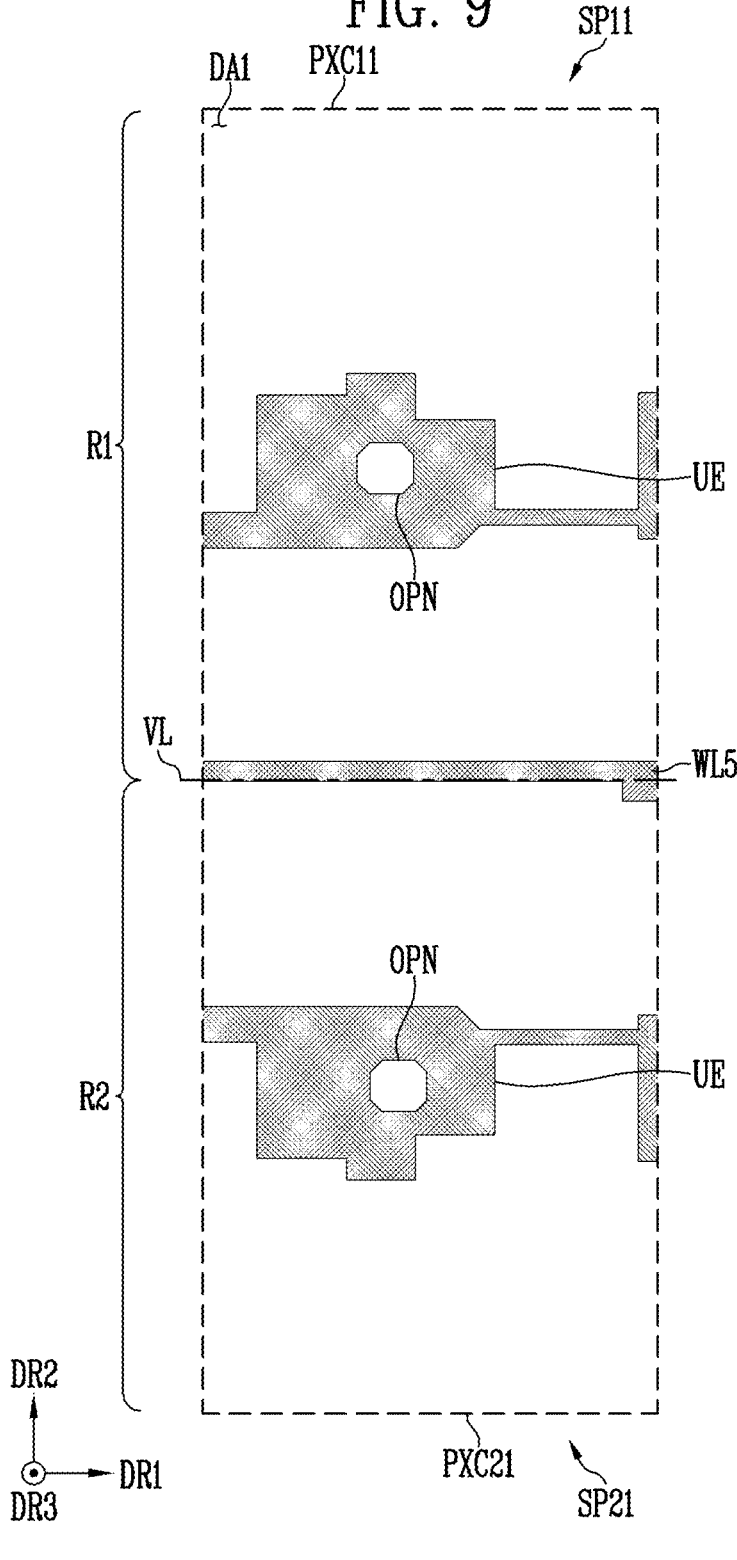
FIG. 9 is a schematic plan view illustrating only the configurations included in a second conductive layer of FIG. 7.
Figure 10:
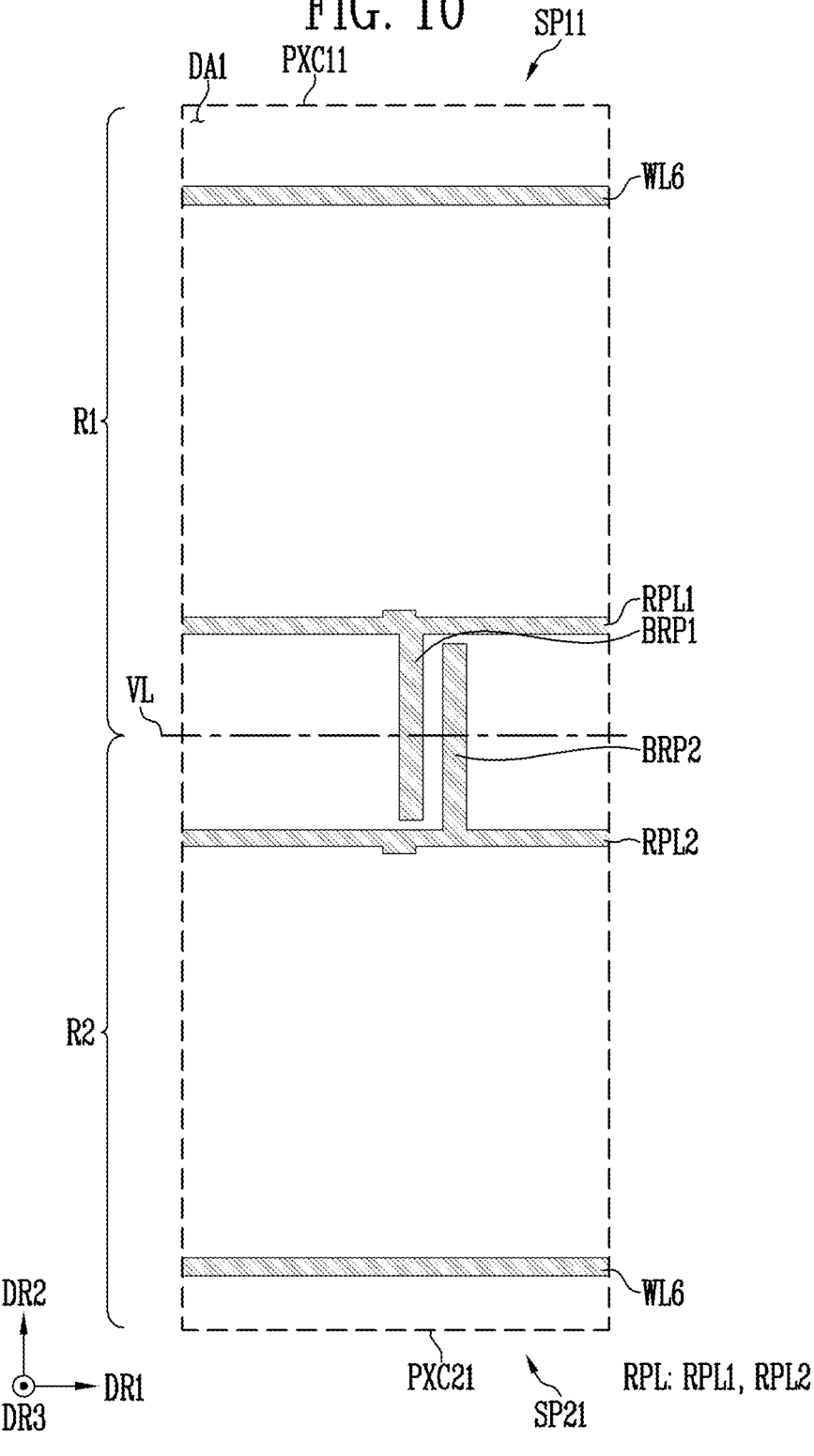
FIG. 10 is a schematic plan view illustrating only the configurations included in a third conductive layer of FIG. 7.
Figure 11:
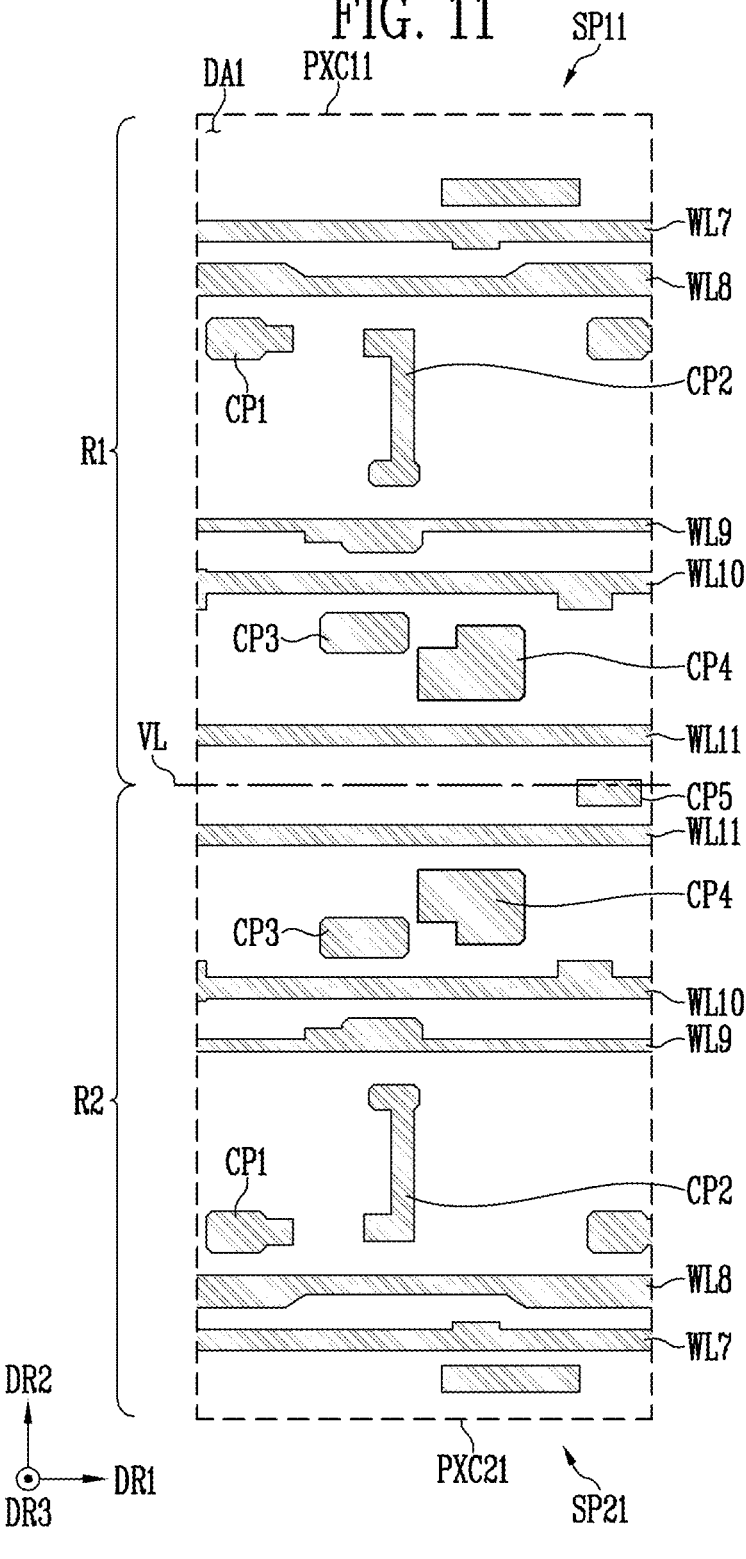
FIG. 11 is a schematic plan view illustrating only the configurations included in a fourth conductive layer of FIG. 7.
Figure 12:
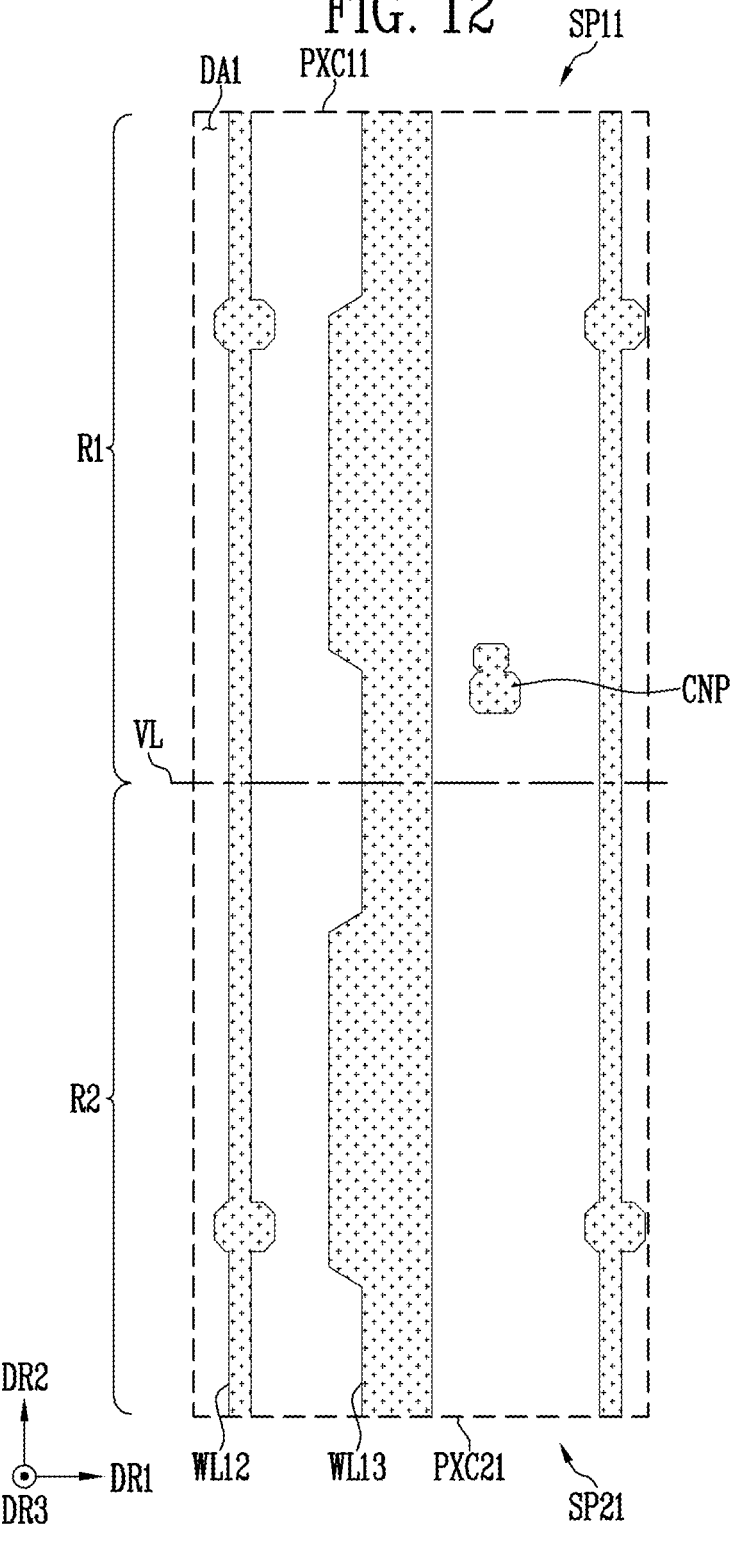
FIG. 12 is a schematic plan view illustrating only the configurations included in a fifth conductive layer of FIG. 7.
Figure 13:
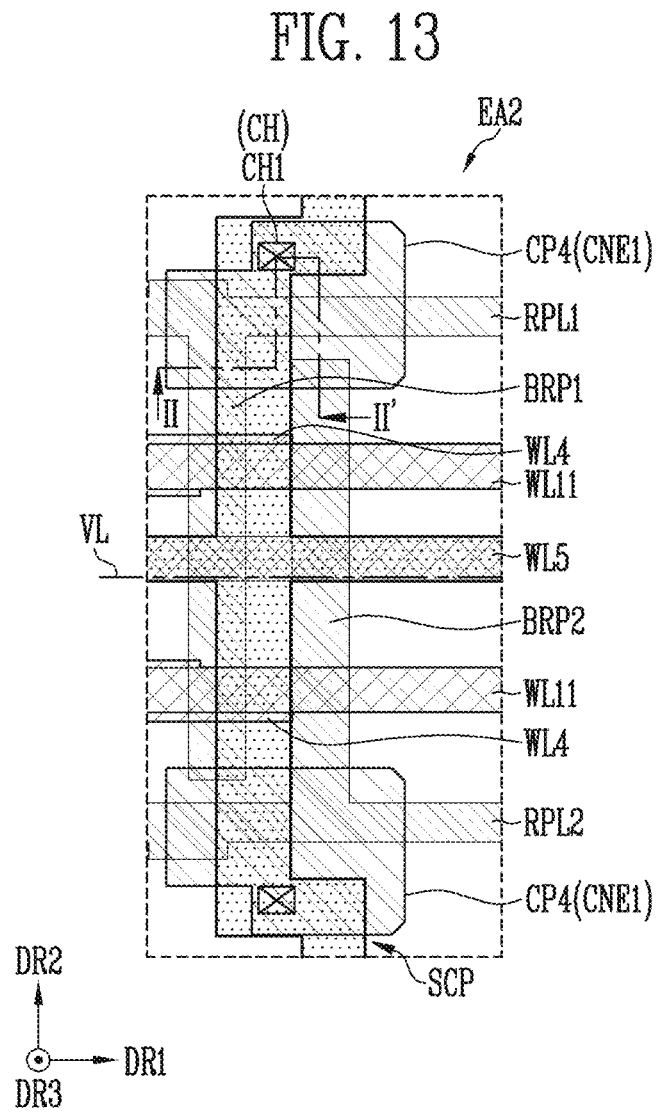
Figure 14:
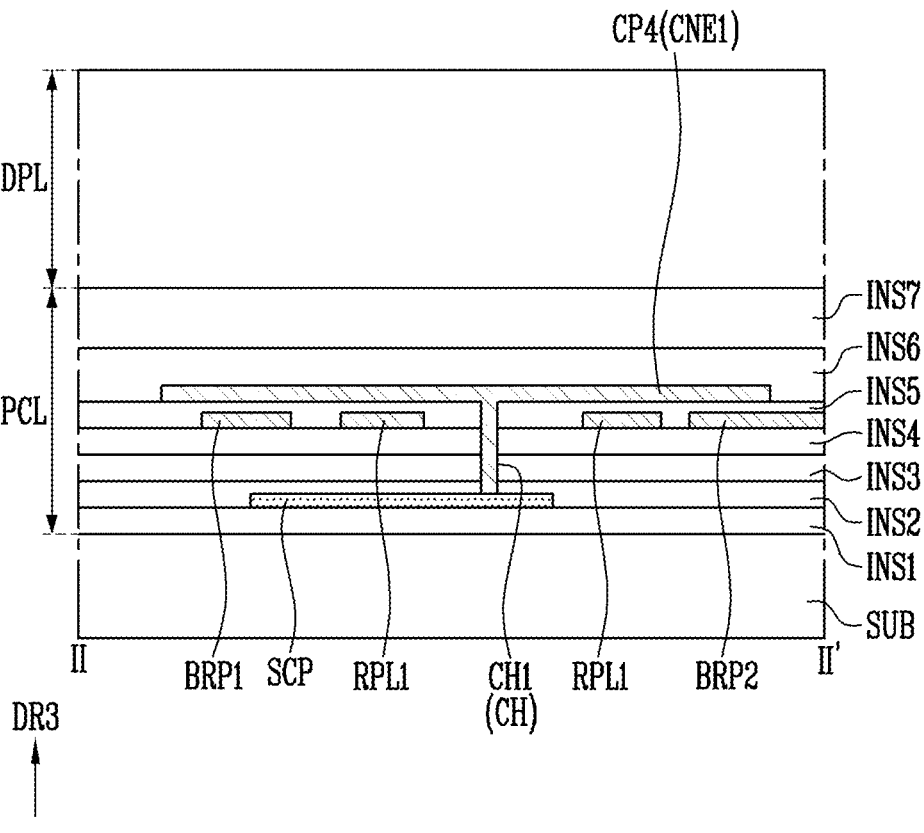
FIG. 14 is a schematic cross-sectional view along line II-II' of FIG. 13.
Figure 15:
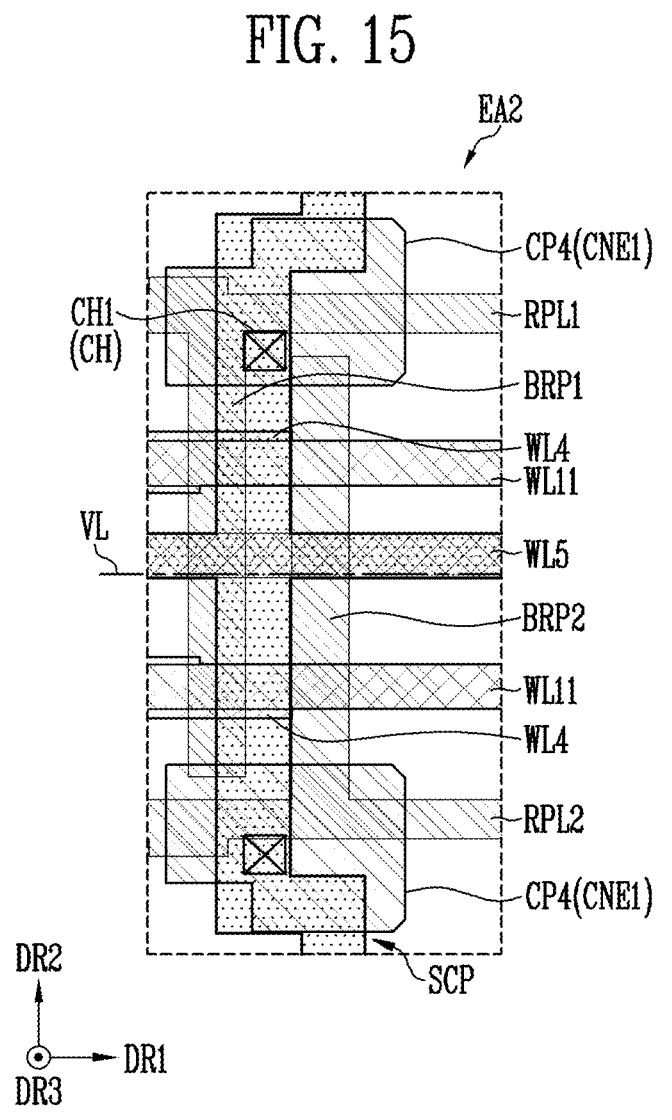

FIG. 7 is a schematic plan view illustrating an embodiment of sub-pixels arranged in a first row R1 and a second row R2 disposed in a portion of the first area DA1 of a display area of a display device. FIG. 8 is a schematic plan view illustrating only the configurations included in the first to seventh transistors T1 to T7 and the first conductive layer in FIG. 7. FIG. 9 is a schematic plan view of only the configurations included in the second conductive layer of FIG. 7. FIG. 10 is a schematic plan view of only the configurations included in the third conductive layer of FIG. 7. FIG. 11 is a schematic plan view of only the configurations included in the fourth conductive layer of FIG. 7. FIG. 12 is a schematic plan view of only the configurations included in the fifth conductive layer of FIG. 7. FIG. 13 is a schematic enlarged plan view of a portion EA2 of FIG. 7. FIG. 14 is a schematic cross-sectional view along line II-II' of FIG. 13. FIG. 15 is a schematic enlarged plan view of a portion of a first area, corresponding to the portion EA2 of FIG. 7.

In FIGS. 13 and 15, the configurations included in the fifth conductive layer are omitted for convenience of explanation.

Differences from the above-described embodiments are described below with reference to FIGS. 7 to 15 so as to avoid redundancy.

Referring to FIGS. 2 and 7 to 15, the sub-pixel (refer to "SP" in FIG. 2) may be arranged in each of the first row R1 (or a first pixel row) and the second row R2 (or a second pixel row) disposed in the same column in the second direction DR2 in the first area DA1. In an embodiment, an 11th sub-pixel SP11 (or the first sub-pixel) may be arranged in the first row R1, and a 21st sub-pixel SP21 (or the first sub-pixel) may be arranged in the second row R2, for example. The 11th sub-pixel SP11 may include an 11th pixel circuit PXC11, and the 21st sub-pixel SP21 may include a 21st pixel circuit PXC21.

In an embodiment, the 11th pixel circuit PXC11 and the 21st pixel circuit PXC21 are arranged in the second direction DR2 and may face each other with respect to the repair line RPL. In an embodiment, the 11th pixel circuit PXC11 and the 21st pixel circuit PXC21 may be mutually symmetrical and substantially identical with respect to the repair line RPL, for example. The 11th pixel circuit PXC11 and the 21st pixel circuit PXC21 may be mirror symmetrical with respect to the repair line RPL.

Signal lines may be arranged in the first area DA1 where the 11th sub-pixel SP11 and the 21st sub-pixel SP21 are disposed. In an embodiment, first to thirteenth wiring lines WL1 to WL13 may be arranged in the first area DA1, for example.

The first wiring line WL1 may extend in the first direction DR1 and may include a first conductive layer arranged between the second insulating layer INS2 and the third insulating layer INS3. The first wiring line WL1 may be the 2i-th scan line S2i as described above with reference to FIG. 3. One region of the first wiring line WL1 may be the gate electrode (hereinafter, also referred to as a "fourth gate electrode") of the fourth transistor T4 of each of the 11th and 21st pixel circuits PXC11 and PXC21.

A second wiring line WL2 may extend in the first direction DR1 and be spaced apart from the first wiring line WL1. The second wiring line WL2 may include a first conductive layer. The second wiring line WL2 may be the 1i-th scan line S1i as described above with reference to FIG. 3. One region of the second wiring line WL2 may be the gate electrode (hereinafter, also referred to as a "second gate electrode") of the second transistor T2 of each of the 11th and 21st pixel circuits PXC11 and PXC21. Further, another area of the second wiring line WL2 may be the gate electrode (hereinafter, also referred to as a "third gate electrode") of the third transistor T3 of each of the 11th and 21st pixel circuits PXC11 and PXC21.

A third wiring line WL3 may extend in the first direction DR1 and be spaced apart from the first and second wires WL1 and WL2. The third wiring line WL3 may include a first conductive layer. The third wiring line WL3 may be the i-th emission control line Ei as described with reference to FIG. 3. A region of the third wiring line WL3 may be the gate electrode (hereinafter, also referred to as a "fifth gate electrode") of the fifth transistor T5 of each of the 11th and 21st pixel circuits PXC11 and PXC21. In addition, another area of the third wiring line WL3 may be the gate electrode (hereinafter, also referred to as a "sixth gate electrode") of the sixth transistor T6 of each of the 11th and 21st pixel circuits PXC11 and PXC21.

A fourth wiring line WL4 may extend in the first direction DR1 and be spaced apart from the first to third wires WL1 through WL3. The fourth wiring line WL4 may include a first conductive layer. The fourth wiring line WL4 may be the 3i-th scan line S3i as described with reference to FIG. 3. One region of the fourth wiring line WL4 may be the gate electrode (hereinafter, also referred to as a "seventh gate electrode") of the seventh transistor T7 of each of the 11th and 21st pixel circuits PXC11 and PXC21.

A fifth wiring line WL5 extends in the first direction DR1 and may include a second conductive layer arranged between the third insulating layer INS3 and the fourth insulating layer INS4. The fifth wiring line WL5 may be the fourth power line PL4 described with reference to FIG. 3.

A sixth wiring line WL6 extends in the first direction DR1 and may include a third conductive layer arranged between the fourth insulating layer INS4 and the fifth insulating layer INS5. The sixth wiring line WL6 may be the second power line PL2 as described with reference to FIG. 3.

A seventh wiring line WL7 extends in the first direction DR1 and may include a fourth conductive layer arranged between the fifth insulating layer INS5 and the sixth insulating layer INS6. The seventh wiring line WL7 may be, but is not limited to, a dummy line overlapping the first wiring line WL1 including the first conductive layer. In an embodiment, the seventh wiring line WL7 may be electrically connected to the first wiring line WL1 to realize the first wiring line WL1 as a dual structure.

An eighth wiring line WL8 may extend in the first direction DR1 and be spaced apart from the seventh wiring line WL7. The eighth wiring line WL8 may include a fourth conductive layer. The eighth wiring line WL8 may be a dummy line. In an embodiment, the eighth wiring line WL8 may be electrically connected to the second wiring line WL2 including the first conductive layer, thereby realizing the second wiring line WL2 as a dual structure.

The ninth wiring line WL9 may extend in the first direction DR1 and be spaced apart from the seventh and eighth wiring lines WL7 and WL8. The ninth wiring line WL9 may include a fourth conductive layer. The ninth wiring line WL9 may be the first power line PL1 as described with reference to FIG. 3.

A tenth wiring line WL10 may extend in the first direction DR1 and be spaced apart from the seventh through ninth wiring lines WL7 through WL9. The tenth wiring line WL10 may include a fourth conductive layer. The tenth wiring line WL10 may be a dummy line overlapping the third wiring line WL3 including the first conductive layer. In an embodiment, the tenth wiring line WL10 may be electrically connected to the third wiring line WL3 to realize the third wiring line WL3 as a dual structure.

An eleventh wiring line WL11 may extend in the first direction DR1 and be spaced apart from the seventh through tenth wiring lines WL7 to WL10. The eleventh wiring line WL11 may include a fourth conductive layer. The eleventh wiring line WL11 may be a dummy line overlapping the fourth wiring line WL4 including the first conductive layer. In an embodiment, the eleventh wiring line WL11 may be electrically connected to the fourth wiring line WL4 through the corresponding contact hole CH to realize the fourth wiring line WL4 as a dual structure.

A twelfth wiring line WL12 may extend in the second direction DR2 crossing the first direction DR1 and may include a fifth conductive layer arranged between the sixth insulating layer INS6 and the seventh insulating layer INS7. The twelfth wiring line WL12 may be the j-th data line Dj as described with reference to FIG. 3. The twelfth wiring line WL12 may be electrically connected to the second transistor T2 of each of the 11th and 21st pixel circuits PXC11 and PXC21 through a first conductive pattern CP1.

The first conductive pattern CP1 may include a fourth conductive layer. The first conductive pattern CP1 may be electrically connected to the twelfth wiring line WL12 through the contact hole CH passing through the sixth insulating layer INS6. Further, the first conductive pattern CP1 may be electrically connected to the semiconductor pattern SCP of the second transistor T2 of each of the 11th and 21st pixel circuits PXC11 and PXC21 through the contact hole CH passing through the fifth insulating layer INS5, the fourth insulating layer INS4, the third insulating layer INS3, and the second insulating layer INS2.

A thirteenth wiring line WL13 may extend in the second direction DR2 and may be spaced apart from the twelfth wiring line WL12. The thirteenth wiring line WL13 may include a fifth conductive layer. The thirteenth wiring line WL13 may be electrically connected to the fifth transistor T5 of each of the 11th and 21st pixel circuits PXC11 and PXC21 through a third conductive pattern CP3.

The third conductive pattern CP3 may include a fourth conductive layer. The third conductive pattern CP3 may be electrically connected to the thirteenth wiring line WL13 through the contact hole CH passing through the sixth insulating layer INS6. Further, the third conductive pattern CP3 may be electrically connected to the semiconductor pattern SCP of the fifth transistor T5 of each of the 11th and 21st pixel circuits PXC11 and PXC21 through the contact hole CH which sequentially penetrates the fifth insulating layer INS5, the fourth insulating layer INS4, the third insulating layer INS3, and the second insulating layer INS2.

The thirteenth wiring line WL13 may be the first power line PL1 as described with reference to FIG. 3. The thirteenth wiring line WL13 may be a vertical power line of the first power line PL1, and the ninth wiring line WL9 may be a horizontal power line of the first power line PL1. The ninth wiring line WL9 and the thirteenth wiring line WL13 may be electrically connected to each other to form a mesh structure of the first power line PL1.

A connection pattern CNP including the same layer as the thirteenth wiring line WL13, e.g., the fifth conductive layer, may be arranged spaced apart from the thirteenth wiring line WL13. The connection pattern CNP may be the connection line CNL described with reference to FIG. 6. The connection pattern CNP may be electrically connected to a corresponding anode electrode (refer to "AE" in FIG. 3) of the light-emitting element (refer to "LED" in FIG. 3) through a via hole VIH passing through the seventh insulating layer INS7. Further, the connection pattern CNP may be electrically connected to a fourth conductive pattern CP4 through the contact hole CH passing through the sixth insulating layer INS6.

The 11th pixel circuit PXC11 and the 21st pixel circuit PXC21 may have substantially similar or identical structures. In an embodiment, the 11th pixel circuit PXC11 and the 21st pixel circuit PXC21 may be mirror symmetrical based on an imaginary line VL extending in the first direction DR1 between the first row R1 and the second row R2, for example. Hereinafter, for convenience, a description will be mainly made on the 11th pixel circuit PXC11 and an overlapping description will be omitted.

The 11th pixel circuit PXC11 may include the first, second, third, fourth, fifth, sixth, and seventh transistors T1, T2, T3, T4, T5, T6, and T7 and the storage capacitor Cst.

The first transistor T1 may include a first active pattern ACT1 and a first gate electrode GE1.

The first active pattern ACT1 may be a region of the semiconductor pattern SCP which overlaps the first gate electrode GE1. The first active pattern ACT1 may be a channel region of the first transistor T1.

A region of the semiconductor pattern SCP which does not overlap the first gate electrode GE1 and is connected to one side of the first active pattern ACT1 (e.g., the left side of the first active pattern ACT1 in the plan view) may be a first input/output terminal. A region of the semiconductor pattern SCP which does not overlap the first gate electrode GE1 and is connected to an opposite side of the first active pattern ACT1 (e.g., the right side of the first active pattern ACT1 in the plan view) may be a second input/output terminal. The first input/output terminal may be connected to one side of the first active pattern ACT1, and may be connected to each of the semiconductor pattern SCP of the second transistor T2 and the semiconductor pattern SCP of the fifth transistor T5. The second input/output terminal may be connected to an opposite side of the first active pattern ACT1 and may be connected to the semiconductor pattern SCP of the sixth transistor T6.

The first gate electrode GE1 overlaps the first active pattern ACT1 and may include a first conductive layer. The first gate electrode GE1 may be an island-shaped conductive pattern. The first gate electrode GE1 may be electrically connected to the third transistor T3 and the fourth transistor T4 through a second conductive pattern CP2.

The second conductive pattern CP2 may include a fourth conductive layer. One end of the second conductive pattern CP2 may be electrically connected to the first gate electrode GE1 through the contact hole CH passing through the fifth insulating layer INS5, the fourth insulating layer INS4, and the third insulating layer INS3. An opposite end of the second conductive pattern CP2 may be electrically connected to a region of the semiconductor pattern SCP shared by the third transistor T3 and the fourth transistor T4 through the contact hole CH passing through the fifth insulating layer INS5, the fourth insulating layer INS4, the third insulating layer INS3, and the second insulating layer INS2.

The second transistor T2 may include a second active pattern ACT2 and a second gate electrode.

The second active pattern ACT2 may be a region of the semiconductor pattern SCP which overlaps the second wiring line WL2. The second active pattern ACT2 may be a channel region of the second transistor T2.

A region of the semiconductor pattern SCP which does not overlap the second wiring line WL2 and is connected to one side of the second active pattern ACT2 (e.g., the upper side of the second active pattern ACT2 in the plan view) may be a first input/output terminal. A region of the semiconductor pattern SCP which does not overlap the second wiring line WL2 and is connected to an opposite side of the second active pattern ACT2 (e.g., the lower side of the second active pattern ACT2 in the plan view) may be a second input/output terminal. The first input/output terminal may be connected to one side of the second active pattern ACT2 and may be electrically connected to the first conductive pattern CP1. The first input/output terminal may be electrically connected to the twelfth wiring line WL12 (or data line) through the first conductive pattern CP1. The second input/output terminal may be connected to an opposite side of the second active pattern ACT2, and may be connected to the first input/output terminal of the first transistor T1.

The second gate electrode may be a region of the second wiring line WL2 which overlaps the second active pattern ACT2.

The third transistor T3 may be configured in which sub-transistors are connected in series to prevent leakage current. For convenience of description, the third transistor T3 formed on the protrusion of the second wiring line WL2 among the above sub-transistors will be described as an illustrative embodiment.

The third transistor T3 may include a third active pattern ACT3 and a third gate electrode.

The third active pattern ACT3 is a region of the semiconductor pattern SCP which overlaps a protrusion projecting from the second wiring line WL2 in the second direction DR2, and may form a channel region of the third transistor T3.

A region of the semiconductor pattern SCP which does not overlap the second wiring line WL2 and is connected to one side of the third active pattern ACT3 (e.g., the right side of the third active pattern ACT3 in the plan view) may be a first input/output terminal. A region of the semiconductor pattern SCP which does not overlap the second wiring line WL2 and is connected to an opposite side of the third active pattern ACT3 (e.g., the left side of the third active pattern ACT3 in the plan view) may be a second input/output terminal. The first input/output terminal may be connected to one side of the third active pattern ACT3 and may be electrically connected to the semiconductor pattern SCP of the first and sixth transistors T1 and T6. The second input/output terminal may be connected to an opposite side of the third active pattern ACT3 and electrically coupled to the semiconductor pattern SCP of the fourth transistor T4.

The third gate electrode may be a region of the second wiring line WL2 which overlaps the third active pattern ACT3.

The fourth transistor T4 may be configured with sub-transistors connected in series to prevent leakage current. For convenience of description, the fourth transistor T4, which is arranged closest to the third transistor T3 among the above sub-transistors, will be described as an illustrative embodiment.

The fourth transistor T4 may include a fourth active pattern ACT4 and a fourth gate electrode.

The fourth active pattern ACT4 is a region of the semiconductor pattern SCP which overlaps the first wiring line WL1, and may form a channel region of the fourth transistor T4.

A region of the semiconductor pattern SCP which does not overlap the first wiring line WL1 and is connected to one side of the fourth active pattern ACT4 (e.g., the lower side of the fourth active pattern ACT4 in the plan view) may be a first input/output terminal. A region of the semiconductor pattern SCP which does not overlap the first wiring line WL1 and is connected to an opposite side of the fourth active pattern ACT4 (e.g., the upper side of the fourth active pattern ACT4 in the plan view) may be a second input/output terminal. The first input/output terminal may be connected to one side of the fourth active pattern ACT4 and may be connected to the semiconductor pattern SCP of the third transistor T3. The second input/output terminal may be connected to an opposite side of the fourth active pattern ACT4 and electrically connected to the sixth wiring line WL6 through the contact hole CH passing through the fourth insulating layer INS4, the third insulating layer INS3, and the second insulating layer INS2.

The fourth gate electrode may be a region of the first wiring line WL1 which overlaps the fourth active pattern ACT4.

The fifth transistor T5 may include a fifth active pattern ACT5 and a fifth gate electrode.

The fifth active pattern ACT5 is a region of the semiconductor pattern SCP which overlaps the third wiring line WL3, and may form a channel region of the fifth transistor T5.

A region of the semiconductor pattern SCP which does not overlap the third wiring line WL3 and is connected to one side of the fifth active pattern ACT5 (e.g., the lower side of the fifth active pattern ACT5 in the plan view may be a first input/output terminal. A region of the semiconductor pattern SCP which does not overlap the third wiring line WL3 and is connected to an opposite side of the fifth active pattern ACT5 (e.g., the upper side of the fifth active pattern ACT5 in the plan view) may be a second input/output terminal. The first input/output terminal may be connected to one side of the fifth active pattern ACT5 and electrically connected to the first conductive pattern CP1 through the corresponding contact hole CH. The second input/output terminal may be connected to an opposite side of the fifth active pattern ACT5 and may be connected to the semiconductor pattern SCP of each of the first and second transistors T1 and T2.

The fifth gate electrode may be a region of the third wiring line WL3 which overlaps the fifth active pattern ACT5.

The sixth transistor T6 may include a sixth active pattern ACT6 and a sixth gate electrode.

The sixth active pattern ACT6 is a region of the semiconductor pattern SCP which overlaps the third wiring line WL3, and may be a channel region of the sixth transistor T6.

A region of the semiconductor pattern SCP which does not overlap the third wiring line WL3 and is connected to one side of the sixth active pattern ACT6 (e.g., the upper side of the sixth active pattern ACT6 in the plan view) may be a first input/output terminal. A region of the semiconductor pattern SCP which does not overlap the third wiring line WL3 and is connected to an opposite side of the sixth active pattern ACT6 (e.g., the lower side of the sixth active pattern ACT6 in a plan view) may be a second input/output terminal. The first input/output terminal may be connected to one side of the sixth active pattern ACT6 and the semiconductor pattern SCP of the first transistor T1. The second input/output terminal may be connected to an opposite side of the sixth active pattern ACT6 and the semiconductor pattern SCP of the seventh transistor T7. Further, the second input/output terminal may be electrically connected to the fourth conductive pattern CP4 through the corresponding contact hole CH.

The fourth conductive pattern CP4 (or a first contact electrode CNE1) may include a fourth conductive layer. The fourth conductive pattern CP4 may be electrically connected to a second input/output terminal of the sixth transistor T6 through the contact hole CH passing through the fifth insulating layer INS5, the fourth insulating layer INS4, the third insulating layer INS3, and the second insulating layer INS2. Further, the fourth conductive pattern CP4 may be electrically connected to the connection pattern CNP through the corresponding contact hole CH. The fourth conductive pattern CP4 may be electrically connected to the anode electrode AE of the light-emitting element LED.

The sixth gate electrode may be a region of the third wiring line WL3 which overlaps the sixth active pattern ACT6.

The seventh transistor T7 may include a seventh active pattern ACT7 and a seventh gate electrode.

The seventh active pattern ACT7 is a region of the semiconductor pattern SCP which overlaps the fourth wiring line WL4, and may be a channel region of the seventh transistor T7.

A region of the semiconductor pattern SCP which does not overlap the fourth wiring line WL4 and is connected to one side of the seventh active pattern ACT7 (e.g., the upper side of the seventh active pattern ACT7 in the plan view) may be a first input/output terminal. A region of the semiconductor pattern SCP which does not overlap the fourth wiring line WL4 and is connected to an opposite side of the seventh active pattern ACT7 (e.g., the lower side of the seventh active pattern ACT7 in the plan view) may be a second input/output terminal. The first input/output terminal may be connected to one side of the seventh active pattern ACT7 and the semiconductor pattern SCPs of the sixth transistor T6. The second input/output terminal may be connected to an opposite side of the seventh active pattern ACT7 and a fifth conductive pattern CP5.

The fifth conductive pattern CP5 may include a fourth conductive layer. The fifth conductive pattern CP5 may be electrically connected to the semiconductor pattern SCP of the seventh transistor T7 through the contact hole CH sequentially passing through the fifth insulating layer INS5, the fourth insulating layer INS4, the third insulating layer INS3, and the second insulating layer INS2. Further, the fifth conductive pattern CP5 may be connected to the fifth wiring line WL5 through the contact hole CH passing through the fifth insulating layer INS5 and the fourth insulating layer INS4.

The seventh gate electrode may be a region of the fourth wiring line WL4 which overlaps the seventh active pattern ACT7.

The storage capacitor Cst may include a lower electrode LE and an upper electrode UE.

The lower electrode LE may be unitary with the first gate electrode GE1. The lower electrode LE may include a first conductive layer.

The upper electrode UE overlaps the lower electrode LE and may include a second conductive layer. The upper electrode UE may define an opening OPN by removing a portion thereof. A region of the lower electrode LE overlapping the upper electrode UE may be exposed by the opening OPN. The upper electrode UE may be electrically connected to the thirteenth wiring line WL13 through the contact hole CH which sequentially penetrates the sixth insulating layer INS6, the fifth insulating layer INS5, and the fourth insulating layer INS4.

In the first area DA1, the repair lines RPL may be arranged between the first row R1 and the second row R2. The repair lines RPL may include the first repair line RPL1 and the second repair line RPL2 spaced apart relative to the imaginary line VL extending in the first direction DR1. The first repair line RPL1 may be disposed above the imaginary line VL and the second repair line RPL2 may be disposed below the imaginary line VL. The first repair line RPL1 and the second repair line RPL2 may be spaced apart from each other and may be electrically isolated from each other.

The first and second repair lines RPL1 and RPL2 may extend in the first direction DR1. The first and second repair lines RPL1 and RPL2 may include a third conductive layer. The first and second repair lines RPL1 and RPL2 may be formed by the same process as the sixth wiring line WL6. The first and second repair lines RPL1 and RPL2 may be arranged in the same layer as the sixth wiring line WL6 and may include the same material as that of the sixth wiring line WL6.

The first repair line RPL1 may be electrically connected to a first bridge pattern BRP1. The first bridge pattern BRP1 may be unitary with the first repair line RPL1. The first bridge pattern BRP1 may extend in the second direction DR2 and may protrude from the first repair line RPL1 in a direction toward the second repair line RPL2 (or the second row R2). In an embodiment, the first repair line RPL1 may be electrically connected to one of the first and second dummy pixels (refer to "DP1 and DP2" in FIG. 2) arranged in each of the first and second rows R1 and R2 of the first non-display area (refer to "NDA1" in FIG. 2) next (adjacent) to the first area DA1.

The second repair line RPL2 may be electrically connected to a second bridge pattern BRP2. The second bridge pattern BRP2 may be unitary with the second repair line RPL2. The second bridge pattern BRP2 may extend in the second direction DR2 and may protrude from the second repair line RPL2 in a direction toward the first repair line RPL1 or the first row R1. In an embodiment, the second repair line RPL2 may be electrically connected to a remaining (the other) dummy pixel between the first and second dummy pixels DP1 and DP2 arranged in the first and second rows R1 and R2 of the first non-display area NDA1.

The first bridge pattern BRP1 and the second bridge pattern BRP2 are spaced apart and face each other in the first direction DR1. The first bridge pattern BRP1 and the first repair line RPL1 may be electrically isolated from the second bridge pattern BRP2 and the second repair line RPL2, respectively.

The fourth conductive pattern CP4 (or the first contact electrode CNE1) and the connection pattern CNP may be disposed at a connection point (or the fourth node (refer to "N4" in FIG. 3)) electrically connecting the anode electrode AE of the 11th sub-pixel SP11 and the 11th pixel circuit PXC11. Further, the semiconductor pattern SCP of the sixth transistor T6 electrically connected to the fourth conductive pattern CP4 may be disposed at the connection point. The fourth conductive pattern CP4 may be electrically connected to the semiconductor pattern SCP of the sixth transistor T6 through the contact hole CH passing through the insulating layer. In an embodiment, the fourth conductive pattern CP4 may be electrically connected to the semiconductor pattern SCP of the sixth transistor T6 through the contact hole CH (or a first contact hole CH1) passing through the fifth insulating layer INS5, the fourth insulating layer INS4, the third insulating layer INS3, and the second insulating layer INS2, for example.

In each of the first and second rows R1 and R2, based on the first contact hole CH1, the first bridge pattern BRP1 and the second bridge pattern BRP2 may be arranged. In an embodiment, as shown in FIG. 13, the first bridge pattern BRP1 is arranged on one side of the first contact hole CH1 (e.g., the left side of the first contact hole CH1 in a plan view), based on the first contact hole CH1, and the second bridge pattern BRP2 may be arranged on an opposite side of the first contact hole CH1 (e.g., the right side of the first contact hole CH1 in a plan view), based on the first contact hole CH1, for example. However, the disclosure is not limited thereto. In some embodiments, the second bridge pattern BRP2 may be disposed on one side of the first contact hole CH1 (e.g., the left side of the first contact hole CH1 in the plan view), based on the first contact hole H1, and the first bridge pattern BRP1 may be arranged on an opposite side of the first contact hole CH1 (e.g., the right side of the first contact hole CH1 in the plan view), based on the first contact hole CH1.

When viewed in plan, the first contact hole CH1 may overlap the semiconductor pattern SCP and the fourth conductive pattern CP4 of the sixth transistor T6 disposed above the first repair line RPL1 as shown in FIG. 13. In an embodiment, the first contact hole CH1 may overlap the semiconductor pattern SC and the fourth conductive pattern (or the first contact electrode CNE1) of the sixth transistor T6 disposed under the first repair line RPL1 as shown in FIG. 15.

In an embodiment, one end of each of the first and second bridge patterns BRP1 and BRP2 disposed between the first row R1 and the second row R2 may overlap the fourth conductive pattern CP4 of the 11th sub-pixel SP11 of the first row R1, and an opposite end of each of the first and second bridge patterns BRP1 and BRP2 may overlap the fourth conductive pattern CP4 of the 21st sub-pixel SP21 of the second row R2.

The corresponding repair line RPL between the first and second repair lines RPL1 and RPL2, the first bridge pattern BRP1, and the second bridge pattern BRP2 may overlap the fourth conductive pattern CP4 of each of the 11th and 21st sub-pixels SP11 and SP21. The first and second repair lines RPL1 and RPL2, the first bridge pattern BRP1, and the second bridge pattern BRP2 may be electrically isolated from the fourth conductive pattern CP4.

When a dark spot failure occurs in the 11th sub-pixel SP11, the electrical connection between the semiconductor pattern SCP shared by the sixth transistor T6 and the seventh transistor T7 of the 11th sub-pixel SP11 and the anode electrode AE of the light-emitting element LED may be disconnected, and the fourth conductive pattern CP4 (or the first contact electrode CNE1) and one of the first and second bridge patterns BRP1 and BRP2 of the 11th sub-pixel SP11 may be electrically connected to each other, whereby the light-emitting element LED of the 11th sub-pixel SP11 may operate normally.

Figure 16:
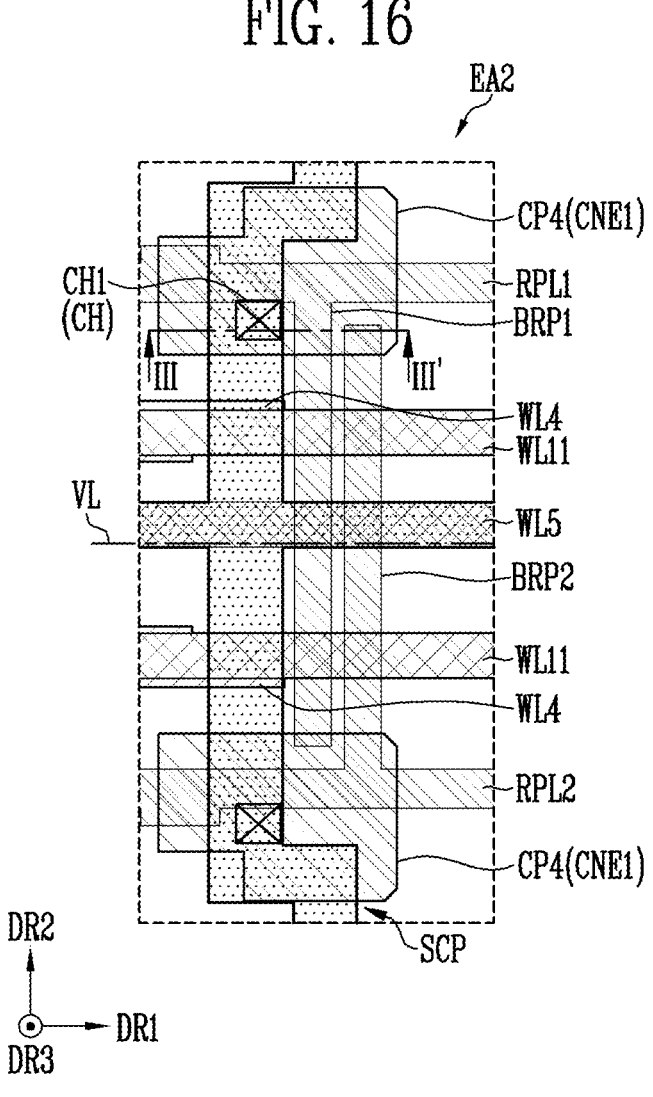
FIG. 16 is a schematic enlarged plan view of a portion of the first area, corresponding to the portion EA2 of FIG. 7.
Figure 17:
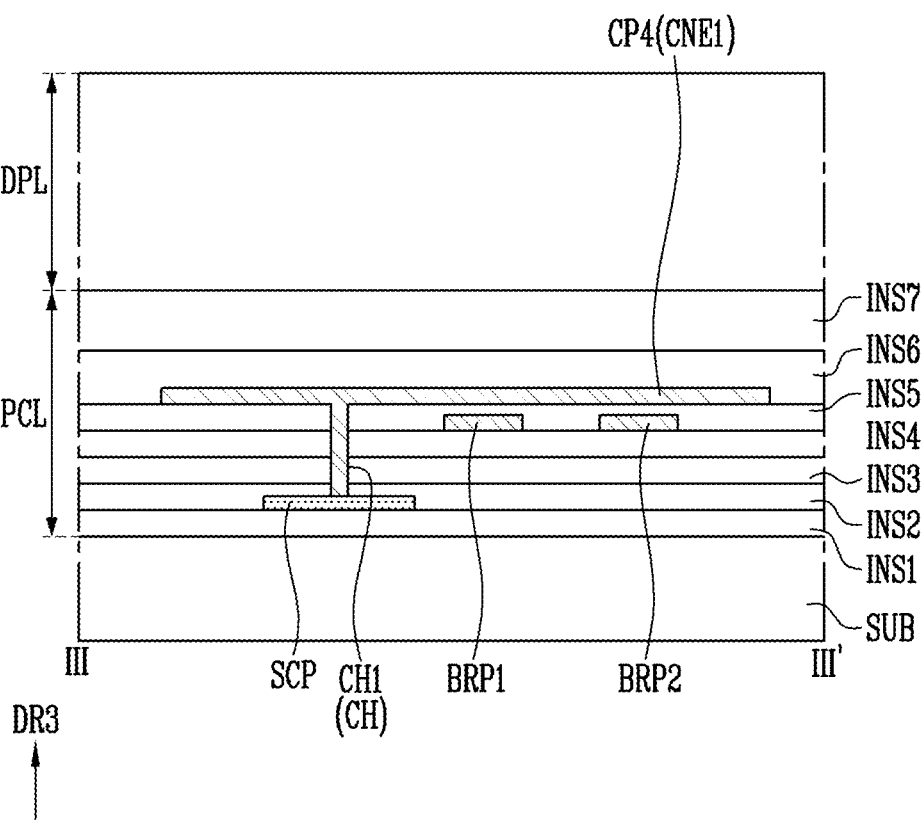
FIG. 17 is a schematic cross-sectional view along line III-III' of FIG. 16.

FIG. 16 is a schematic enlarged plan view of a portion of the first area, corresponding to the portion EA2 of FIG. 7. FIG. 17 is a schematic cross-sectional view along line III-III' of FIG. 16.

Referring now to FIGS. 16 and 17, for convenience of explanation, overlapping descriptions with the above-described embodiments will be omitted.

Referring to FIGS. 7, 16, and 17, the first and second bridge patterns BRP1 and BRP2 may be disposed on one side of the first contact hole CH1, based on the first contact hole CH1 electrically connecting the semiconductor pattern SCP of the sixth transistor T6 and the fourth conductive pattern CP4 (the first contact electrode CNE1). In an embodiment, the first and second bridge patterns BRP1 and BRP2 may be disposed on the right side of the first contact hole CH1 based on the first contact hole CH) when viewed in plan and cross-section, for example. However, the disclosure is not limited thereto. In some embodiments, the first and second bridge patterns BRP1 and BRP2 may be disposed to the left of the first contact hole CH1, based on the first contact hole CH1.

Figure 18:
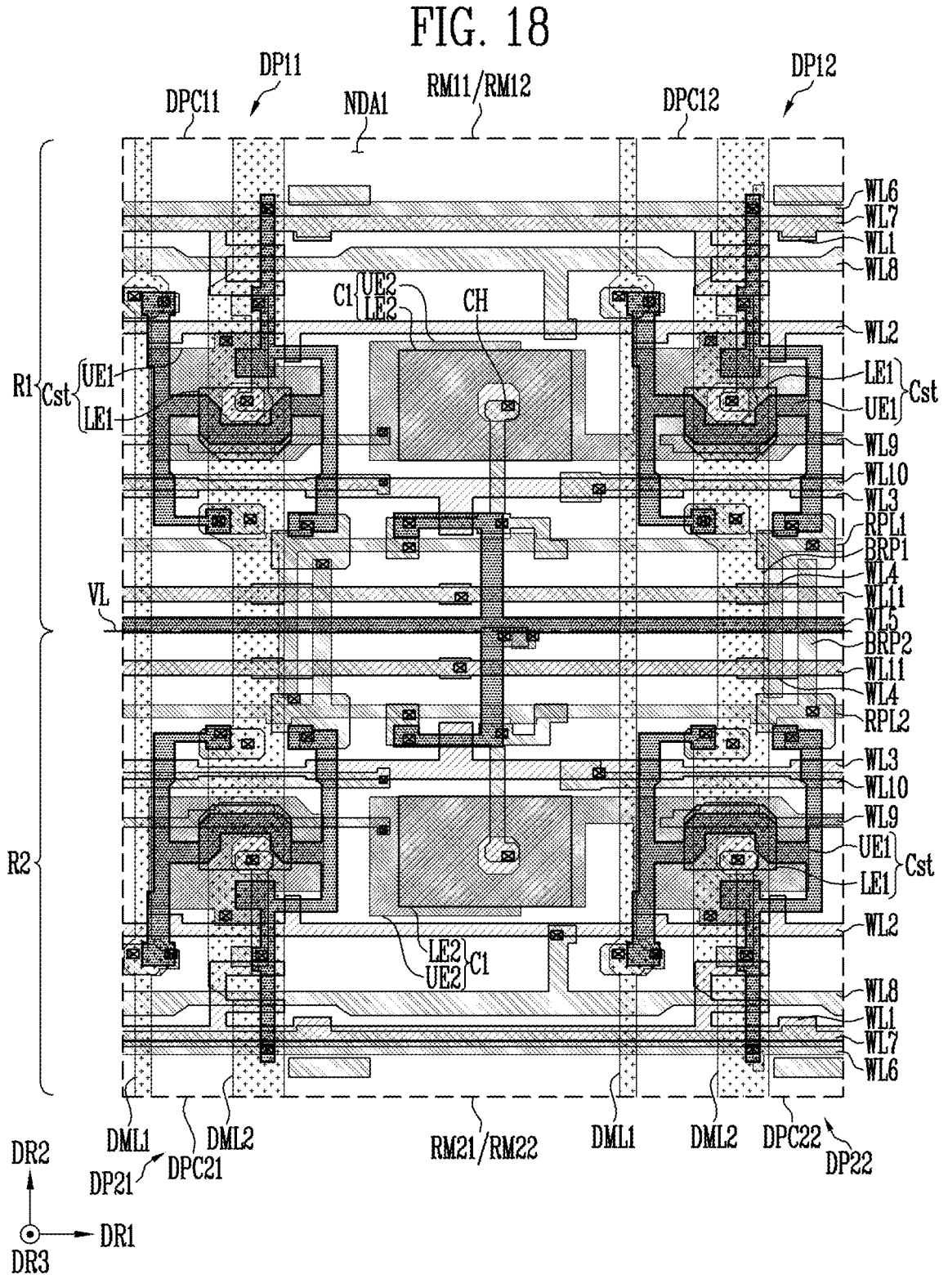
FIG. 18 is a schematic plan view illustrating an embodiment of dummy pixels arranged in first and second rows disposed in a first area of a first non-display area of a display device.
Figure 19:
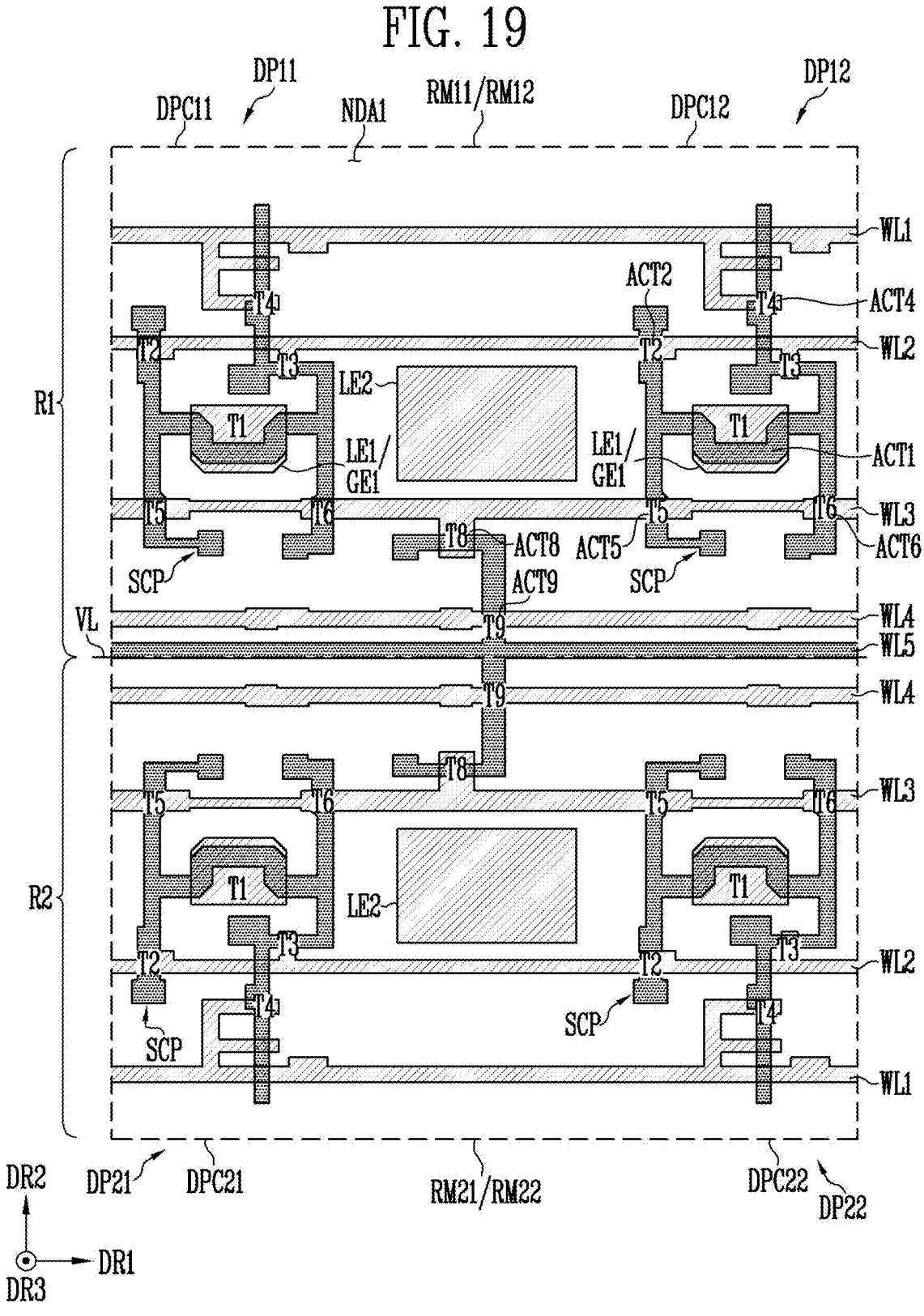
FIG. 19 is a schematic plan view illustrating only the configurations of first to sixth transistors, eighth and ninth transistors, and a first conductive layer of FIG. 18.
Figure 20:
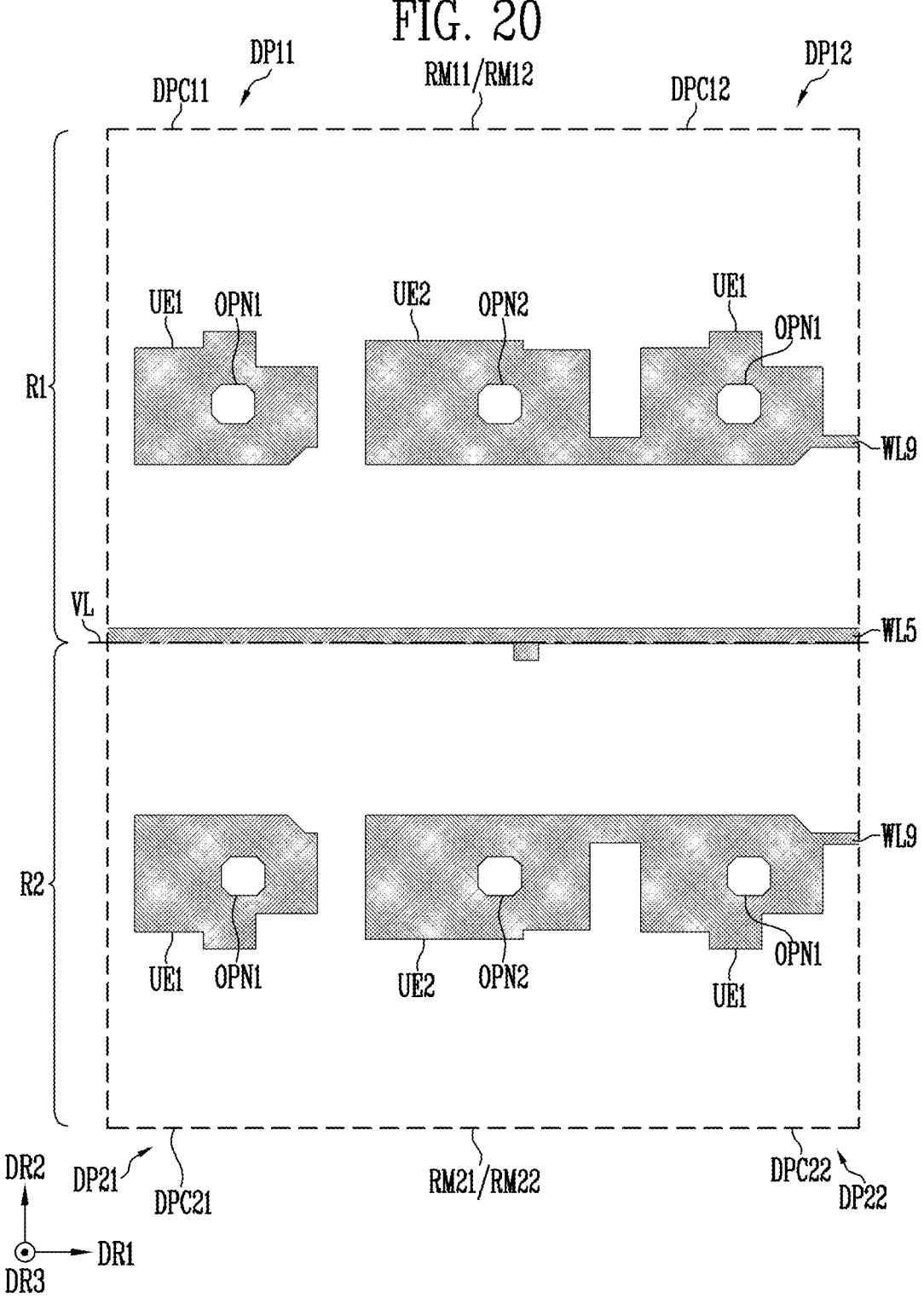
FIG. 20 is a schematic plan view illustrating only the configurations included in the second conductive layer of FIG. 18.
Figure 21:
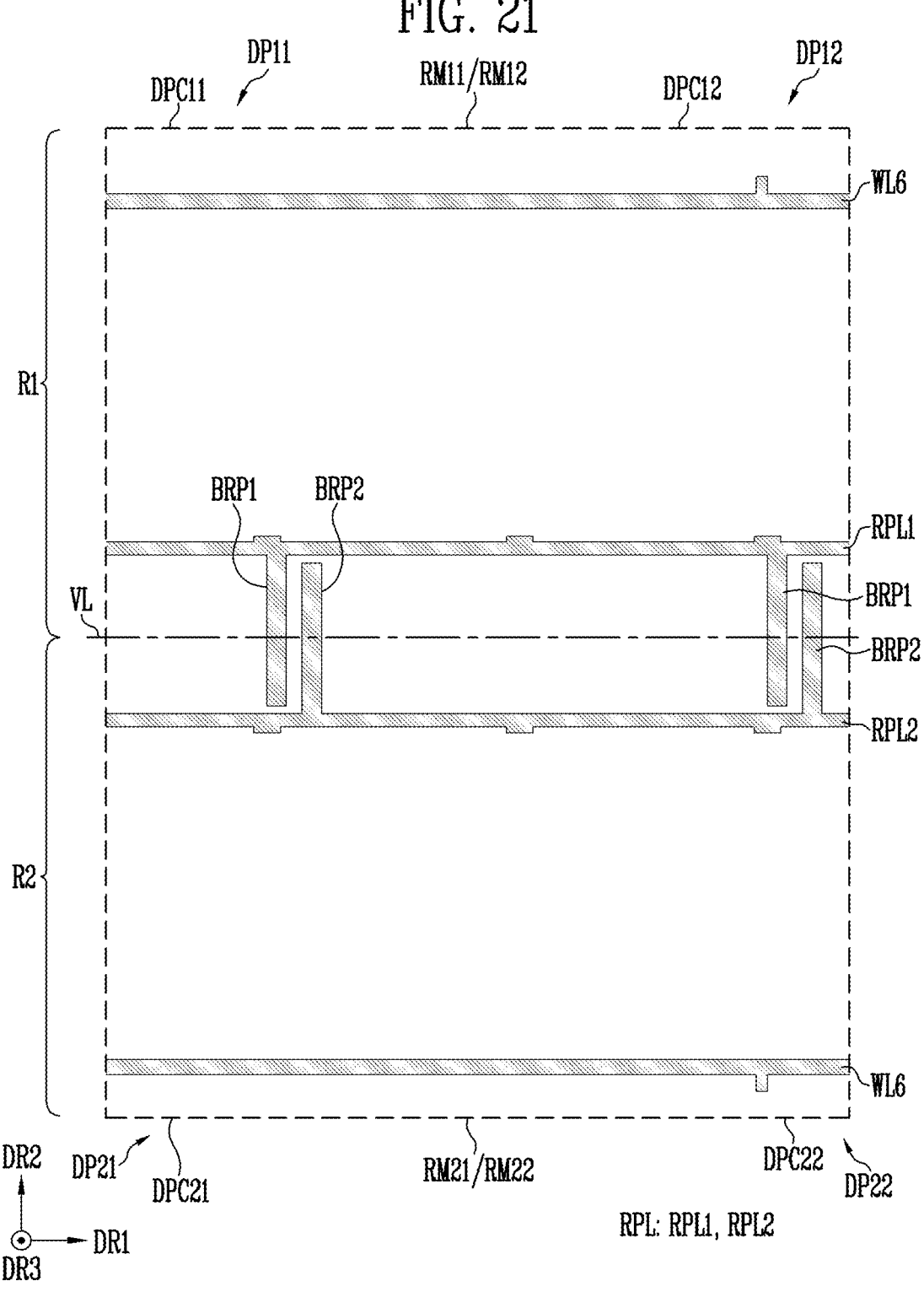
FIG. 21 is a schematic plan view illustrating only the configurations included in a third conductive layer of FIG. 18.
Figure 22:
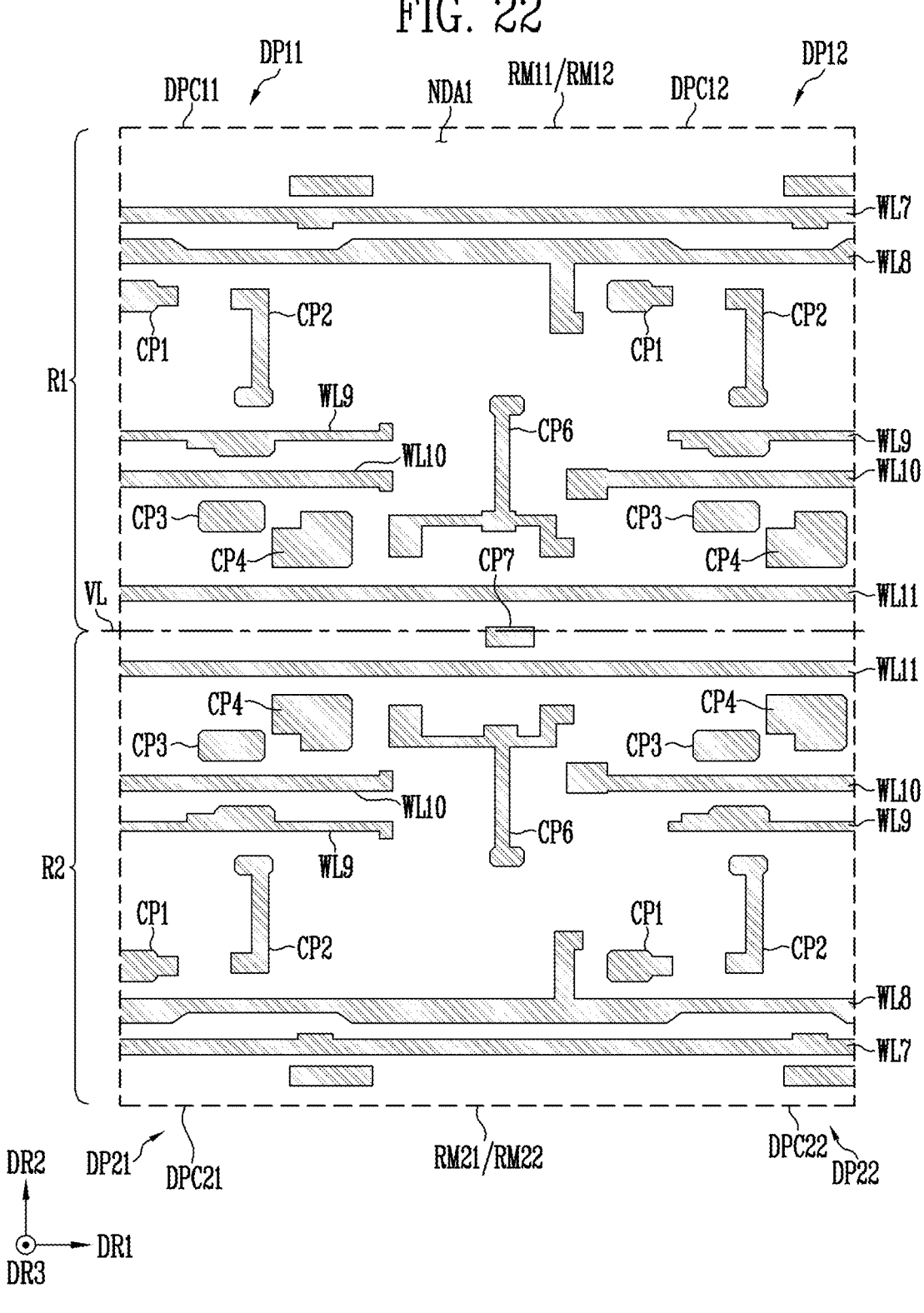
FIG. 22 is a schematic plan view illustrating only the configurations included in a fourth conductive layer of FIG. 18.
Figure 23:
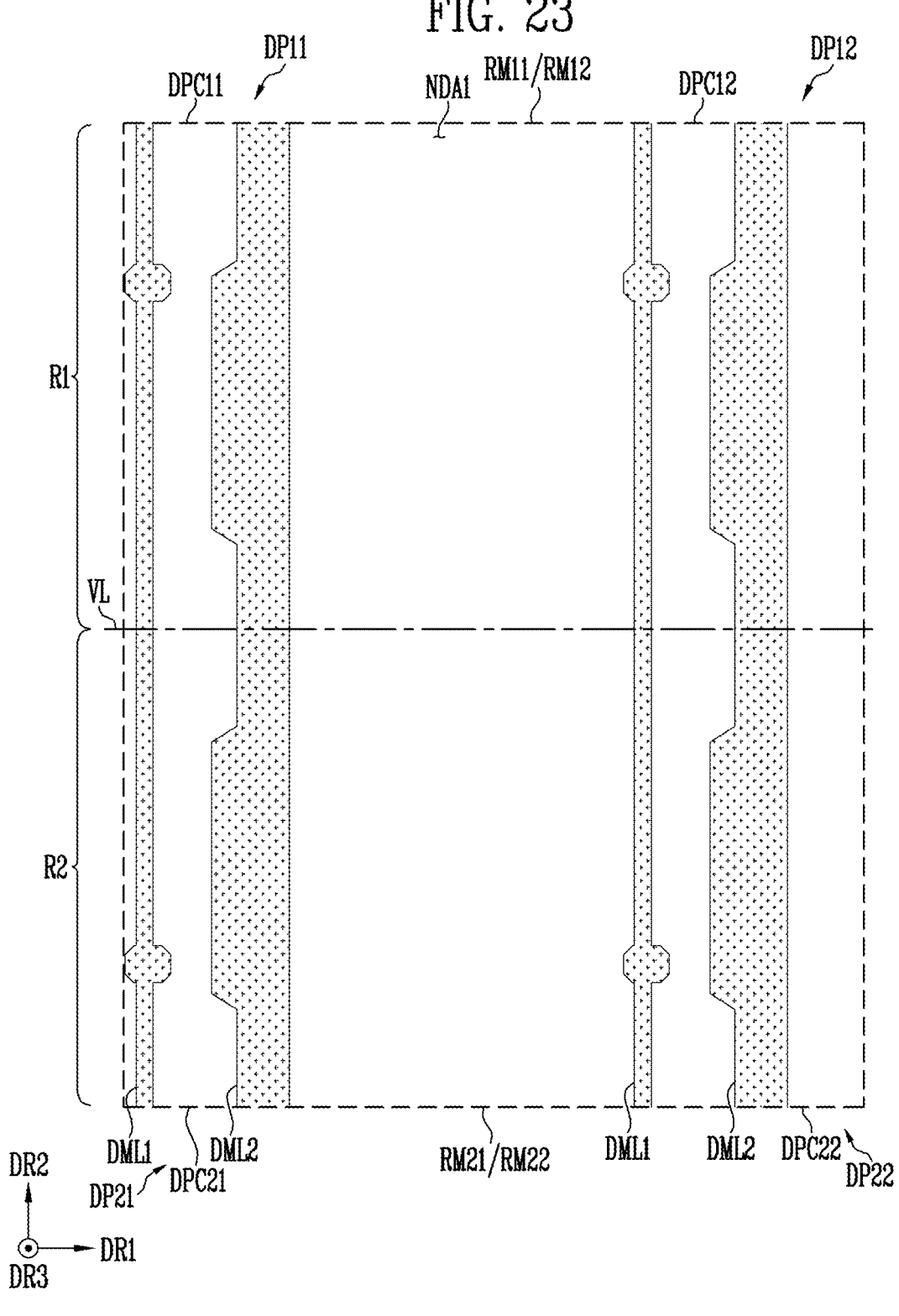
FIG. 23 is a schematic plan view of only the configurations included in a fifth conductive layer in FIG. 18.

FIG. 18 is a schematic plan view illustrating an embodiment of dummy pixels arranged in the first row R1 and the second row R2 disposed in one region of the first non-display area NDA1 of the display device. FIG. 19 is a schematic plan view illustrating only the configurations included in the first to sixth transistors T1 to T6, the eighth and ninth transistors T8 and T9, and the first conductive layer in FIG. 18. FIG. 20 is a schematic plan view of only the configurations included in the second conductive layer of FIG. 18. FIG. 21 is a schematic plan view of only the configurations included in the third conductive layer of FIG. 18. FIG. 22 is a schematic plan view of only the configurations included in the fourth conductive layer of FIG. 18. FIG. 23 is a schematic plan view of only the configurations included in the fifth conductive layer of FIG. 18.

Differences from the above-described embodiments will be mainly described with reference to FIGS. 18 to 23 so as to avoid redundant descriptions.

Referring to FIGS. 2, 4, and 18 to 23, the dummy pixels (refer to "DP" in FIG. 2) may be arranged in each of the first row R1 and the second row R2 disposed in the same column in the second direction DR2 in the first non-display area NDA1. In an embodiment, an 11th dummy pixel DP11 (or a first dummy pixel) and a 12th dummy pixel DP12 (or a second dummy pixel) may be arranged in the first row R1, and a 21th dummy pixel DP21 (or a first dummy pixel) and a 22nd dummy pixel DP22 (or a second dummy pixel) may be arranged in the second row R2, for example. The 11th dummy pixel DP11 and the 12th dummy pixel DP12 may be next (adjacent) in the first direction DR1, and the 21st dummy pixel DP21 and the 22nd dummy pixel DP22 may be next (adjacent) in the first direction DR1. The 11th dummy pixel DP11 in the first row R1 and the 21st dummy pixel DP21 in the second row R2 may be disposed in the same column, and the 12th dummy pixel DP12 in the first row R1 and the 22nd dummy pixel DP22 in the second row R2 may be disposed in the same column. The 12th dummy pixel DP12 may be directly next (adjacent) to the 11th sub-pixel SP11 as described with reference to FIG. 7, and the 22nd dummy pixel DP22 may be directly next (adjacent) to the 21st sub-pixel SP21 as described with reference to FIG. 7.

The dummy pixel DP may include a dummy pixel circuit and a repair modulation circuit. In an embodiment, the 11th dummy pixel DP11 includes an 11th dummy pixel circuit DPC11 and an 11th repair modulation circuit RM11, and a 12th dummy pixel DP12 includes a 12th dummy pixel circuit DPC12 and a 12th repair modulation circuit RM12, a 21st dummy pixel DP21 includes a 21st dummy pixel circuit DPC21 and a 21st repair modulation circuit RM21, and a 22nd dummy pixel DP22 may include a 22nd dummy pixel circuit DPC22 and a 22nd repair modulation circuit RM22, for example.

In an embodiment, the 11th dummy pixel DP11 and the 21st dummy pixel DP21 are arranged in the second direction DR2 and may face each other with respect to the repair line RPL. The 12th dummy pixel DP12 and the 22nd dummy pixel DP22 are arranged in the second direction DR2 and may face each other with respect to the repair line RPL. The 11th dummy pixel circuit DPC11 and the 21st dummy pixel circuit DPC21 may be mutually symmetrical and substantially identical with respect to the repair line RPL, but are not limited thereto. The 11th dummy pixel circuit DPC11 and the 21st dummy pixel circuit DPC21 may be mirror symmetrical with respect to the repair line RPL. The 12th dummy pixel circuit DPC12 and the 22nd dummy pixel circuit DPC22 may be mirror symmetrical with respect to the repair line RPL.

Signal lines connected to the 11th dummy pixel DP11, the 12th dummy pixel DP12, the 21st dummy pixel DP21, and the 22nd dummy pixel DP22. may be arranged in the first non-display area NDA1. In an embodiment, first to eleventh wiring lines WL1 to WL11 may be arranged in the first non-display area NDA1, for example. The first to eleventh wiring lines WL1 to WL11 may be the first to eleventh wiring lines WL1 to WL11 as described with reference to FIGS. 7 to 12.

Further, a first dummy line DML1 and a second dummy line DML2 may be arranged in the first non-display area NDA1. The first dummy line DML1 extends in the second direction DR2 and may include a fifth conductive layer arranged between the sixth insulating layer (refer to "INS6" in FIG. 6) and the seventh insulating layer (refer to "INS7") in FIG. 6. The first dummy line DML1 may be the first dummy data line DD1 as described with reference to FIG. 4. The second dummy line DML2 may extend in the second direction DR2 and may include a fifth conductive layer. The second dummy line DML2 may be the thirteenth wiring line WL13 as described with reference to FIGS. 7 to 15. The second dummy line DML2 may be electrically connected to the fifth transistor T5 of each of the 11th, 12th, 21st, and 22nd dummy pixel circuits DPC11, DPC12, DPC21, and DPC22 through the third conductive pattern CP3.

The 11th, 12th, 21st, and 22nd dummy pixel circuits DPC11, DPC12, DPC21, and DPC22 may have substantially similar or identical structures. Hereinafter, for convenience, a description will be mainly made based on the 12th dummy pixel DP12 and an overlapping description will be omitted.

The 12th dummy pixel DP12 may include the 12th dummy pixel circuit DPC12 and the 12th repair modulation circuit RM12.

The 12th dummy pixel circuit DPC12 may include the first, second, third, fourth, fifth, and sixth transistors T1, T2, T3, T4, T5, and T6, and the storage capacitor Cst. The first to sixth transistors T1 to T6 are identical to the first to sixth transistors T1 to T6 as described with reference to FIGS. 7 to 15, and therefore will not be described herein. The storage capacitor Cst may include a first lower electrode LE1 and a first upper electrode UE1. The storage capacitor Cst may include a first lower electrode LE1 and a first upper electrode UE1. The storage capacitor Cst may be the same as the storage capacitor Cst described with reference to FIGS. 7 to 15. The first lower electrode LE1 may be the lower electrode LE as described with reference to FIGS. 7 to 15, and the first upper electrode UE1 may be the upper electrode UE as described with reference to FIGS. 7 to 15. The first upper electrode UE1 may define a first opening OPN1 by removing one first portion thereof. One region of the first lower electrode LE1 overlapping the first upper electrode UE1 may be exposed by the first opening OPN1. The first upper electrode UE1 may be electrically connected to the second dummy line DML2 through the contact hole CH passing through the sixth insulating layer INS6, the fifth insulating layer INS5, and the fourth insulating layer INS4.

The 12th repair modulation circuit RM12 may include the eighth and ninth transistors T8 and T9 and the first capacitor C1.

The eighth transistor T8 may include an eighth active pattern ACT8 and an eighth gate electrode.

The eighth active pattern ACT8 may be a region of the semiconductor pattern SCP which overlaps the third wiring line WL3. The eighth active pattern ACT8 may be a channel region of the eighth transistor T8.

A region of the semiconductor pattern SCP which does not overlap the third wiring line WL3 and is connected to one side of the eighth active pattern ACT8 (e.g., the left side of the eighth active pattern ACT8 in the plan view) may be a first input/output terminal. A region of the semiconductor pattern SCP which does not overlap the third wiring line WL3 and is connected to an opposite side of the eighth active pattern ACT8 (e.g., the right side of the eighth active pattern ACT8 in the plan view) may be a second input/output terminal. The first input/output terminal may be connected to one side of the eighth active pattern ACT8 and to a sixth conductive pattern CP6. The second input/output terminal may be connected to an opposite side of the eighth active pattern ACT8 and the semiconductor pattern SCP of the ninth transistor T9.

The sixth conductive pattern CP6 may include a fourth conductive layer. The sixth conductive pattern CP6 may be electrically connected to the first input/output terminal of the eighth transistor T8 through the contact hole CH passing through the fifth insulating layer (refer to "INS5" in FIG. 6), the fourth insulating layer (refer to "INS4" in FIG. 6), the third insulating layer (refer to "INS3" in FIG. 6), and the second insulating layer (refer to "INS2" in FIG. 6). Further, the sixth conductive pattern CP6 may be electrically connected to the first repair line RPL1 through the contact hole CH passing through the fifth insulating layer INS5.

The sixth conductive pattern CP6 may be electrically connected to the second lower electrode LE2 through the contact hole CH passing through the fifth insulating layer INS5, the fourth insulating layer INS4, and the third insulating layer INS3. Further, the sixth conductive pattern CP6 may be electrically connected to the semiconductor pattern SCP shared by the eighth transistor T8 and the ninth transistor T9 through the contact hole CH passing through the fifth insulating layer INS5, the fourth insulating layer INS4, the third insulating layer INS3, and the second insulating layer INS2.

The eight gate electrode may be a region of the third wiring line WL3 which overlaps the eighth active pattern ACT8.

The ninth transistor T9 may include a ninth active pattern ACT9 and a ninth gate electrode.

The ninth active pattern ACT9 may be a region of the semiconductor pattern SCP which overlaps the fourth wiring line WL4. The ninth active pattern ACT9 may be a channel region of the ninth transistor T9.

A region of the semiconductor pattern SCP which does not overlap the fourth wiring line WL4 and is connected to one side of the ninth active pattern ACT9 (e.g., the upper side of the ninth active pattern ACT9 in the plan view) may be a first input/output terminal. A region of the semiconductor pattern SCP which does not overlap the fourth wiring line WL4 and is connected to an opposite side of the ninth active pattern ACT9 (e.g., the lower side of the ninth active pattern ACT9 in the plan view) may be a second input/output terminal. The first input/output terminal may be electrically connected to one side of the ninth active pattern ACT9 and the semiconductor pattern SCP of the eighth transistor T8. The second input/output terminal may be electrically connected to an opposite side of the ninth active pattern ACT9 and a seventh conductive pattern CP7.

The seventh conductive pattern CP7 may include a fourth conductive layer. The seventh conductive pattern CP7 may be electrically connected to the semiconductor pattern SCP of the ninth transistor T9 through the contact hole CH passing through the fifth insulating layer INS5, the fourth insulating layer INS4, the third insulating layer INS3, and the second insulating layer INS2. Further, the seventh conductive pattern CP7 may be electrically connected to the fifth wiring line WL5 through the contact hole CH passing through the fifth insulating layer INS5 and the fourth insulating layer INS4. The first initialization power voltage (refer to "Vint1" in FIG. 4) may be provided to the fifth wiring line WL5. The fifth wiring line WL5 may be the second power line PL2 or the fourth power line PL4 as described above with reference to FIG. 4. The fifth wiring line WL5 may be electrically connected to a region of the semiconductor pattern SCP of the ninth transistor T9 (e.g., the second input/output terminal) through the seventh conductive pattern CP7.

The ninth gate electrode may be a region of the fourth wiring line WL4 which overlaps the ninth active pattern ACT9.

The first capacitor C1 may include a second lower electrode LE2 and a second upper electrode UE2.

The second lower electrode LE2 may be spaced apart from the first lower electrode LE1. The second lower electrode LE2 may include a first conductive layer. In an embodiment, the second lower electrode LE2 may be formed by the same processes as the first lower electrode LE1 (or the first gate electrode GE1), may be arranged in the same layer as the first lower electrode LE1, and may include the same material as that of the first lower electrode LE1, for example. The second lower electrode LE2 may be electrically connected to the semiconductor pattern SCP shared by the eighth transistor T8 and the ninth transistor T9 through the sixth conductive pattern CP6.

The second upper electrode UE2 may overlap the second lower electrode LE2 and may include a second conductive layer. The second upper electrode UE2 may define a second opening OPN2 by removing a portion thereof. One region of the second lower electrode LE2 overlapping the second upper electrode UE2 may be exposed by the second opening OPN2. The second upper electrode UE2 may be unitary with the first upper electrode UE1 and electrically connected to the second dummy line DML2.

In an embodiment, the 11th dummy pixel DP11 and the 12th dummy pixel DP12 arranged next (adjacent) to each other in the first direction DR1 may include the same repair modulation circuit. In other words, the repair modulation circuit of the 11th dummy pixel DP11 and the repair modulation circuit of the 12th dummy pixel DP12 may be provided as a single body. In an embodiment, the 11th repair modulation circuit RM11 of the 11th dummy pixel DP11 and the 12th repair modulation circuit RM12 of the 12th dummy pixel DP12 may be provided as a single body, for example. The 11th dummy pixel DP11 and the 12th dummy pixel DP12 may share the same first capacitor C1. The first capacitor C1 may be arranged in a boundary region between the 11th dummy pixel circuit DPC11 of the 11th dummy pixel DP11 and the 12th dummy pixel circuit DPC12 of the 12th dummy pixel DP12.

The second lower electrode LE2 of the first capacitor C1 of each of the 11th and 12th repair modulation circuits RM11 and RM12 may be spaced apart from the first lower electrode LE1 of the storage capacitor Cst of each of the 11th and 12th dummy pixel circuits DPC11 and DPC12. The second upper electrode UE2 of the first capacitor C1 of each of the 11th and 12th repair modulation circuits RM11 and RM12 may be formed integrally with the first upper electrode UE1 of the storage capacitor Cst of each of the 11th and 12th dummy pixel circuits DPC11 and DPC12. The second upper electrode UE2 may be electrically connected to the ninth wiring line WL arranged on the 11th dummy pixel DP11 through the contact hole CH passing through the fifth insulating layer INS5 and the fourth insulating layer INS4.

As described above, the first capacitor C1 may be arranged between the 11th dummy pixel circuit DPC11 and the 12th dummy pixel circuit DPC12 so that the 11th dummy pixel DP11 and the 12th dummy pixel DP12 may share the first capacitor C1. The area occupied by the first capacitor C1 of each dummy pixel DP in the first non-display area NDA1 may be reduced. Accordingly, the dead space of the first non-display area NDA1 may be reduced.

Further, the first dummy pixel DP21 and the second dummy pixel DP22 next (adjacent) in the first direction DR1 in the second row R2 may share the first capacitor C1. In an embodiment, the 21st dummy pixel DP21 and the 22nd dummy pixel DP22 may share the same first capacitor C1, for example. The first capacitor C1 may be arranged between the first dummy pixel circuit DPC21 of the 21st dummy pixel DP21 and the second dummy pixel circuit DPC2 of the 22nd dummy pixel DP22.

In the first non-display area NDA1, the repair line RPL may be arranged between the first row R1 and the second row R2. The repair line RPL may include the first repair line RPL1 and the second repair line RPL2 spaced apart relative to the imaginary line VL extending in the first direction DR1. The first repair line RPL1 may be disposed above with respect to the imaginary line VL, and the second repair line RPL2 may be disposed below with respect to the imaginary line VL. The first repair line RPL1 and the second repair line RPL2 may be spaced apart from each other and may be electrically isolated from each other.

The first and second repair lines RPL1 and RPL2 may include a third conductive layer arranged between the fourth insulating layer INS4 and the fifth insulating layer INS5. The first and second repair lines RPL1 and RPL2 may be the same as the first and second repair lines RPL1 and RPL2 as described with reference to FIGS. 7 to 15. In other words, the first and second repair lines RPL1 and RPL2 may be common lines provided in common to the first non-display area NDA1 and the first area DA1.

Each of the first and second repair lines RPL1 and RPL2 may be electrically connected to the dummy pixel circuit of the dummy pixel DP. In an embodiment, the 11th dummy pixel circuit DPC11 of the 11th dummy pixel DP11 of the first row R1 may be electrically connected to the second repair line RPL2, and the 12th dummy pixel circuit DPC12 of the 12th dummy pixel DP12 of the first row R1 may be electrically connected to the first repair line RPL1, for example. The 21st dummy pixel circuit DPC21 of the 21st dummy pixel DP21 of the second row R2 may be electrically connected to the first repair line RPL1, and the 22nd dummy pixel circuit DPC22 of the 22nd dummy pixel DP22 of the second row R2 may be electrically connected to the second repair line RPL2.

The first bridge pattern BRP1 and the second bridge pattern BRP2 may be arranged between the first repair line RPL1 and the second repair line RPL2. The first bridge pattern BRP1 and the second bridge pattern BRP2 may be spaced apart from each other.

The first bridge pattern BRP1 may be formed integrally with each other the first repair line RPL1. The first bridge pattern BRP1 may be electrically and/or physically connected to the first repair line RPL1. The first bridge pattern BRP1 may extend in the second direction DR2 and may protrude from the first repair line RPL1 in a direction toward the second repair line RPL2. The second bridge pattern BRP2 may be unitary with the second repair line RPL2. The second bridge pattern BRP2 may be electrically and/or physically connected to the second repair line RPL2. The second bridge pattern BRP2 may extend in the second direction DR2 and may protrude from the second repair line RPL2 in a direction toward the first repair line RPL1.

The first bridge pattern BRP1 and the second bridge pattern BRP2 are spaced apart and may face each other in the first direction DR1. The first bridge pattern BRP1 and the first repair line RPL1 may be electrically isolated from the second bridge pattern BRP2 and the second repair line RPL2, respectively.

In an embodiment, the first repair line RPL1, one end of the first bridge pattern BRP1, and one end of the second bridge pattern BRP2 may overlap the fourth conductive pattern CP4 or of each of the 11th and 12th dummy pixels DP11 and DP12 arranged in the first row R1. The first repair line RPL1, the first bridge pattern BRP1, and the second bridge pattern BRP2 may be electrically isolated from the fourth conductive pattern CP4 of each of the 11th and 12th dummy pixels DP11 and DP12.

The second repair line RPL2, an opposite end of the first bridge pattern BRP1, and an opposite end of the second bridge pattern BRP2 may overlap the fourth conductive pattern CP4 (or the second contact electrode CNE2) of each of the 21st and 22nd dummy pixels DP21 and DP22 arranged in the second row R2. The second repair line RPL2, the first bridge pattern BRP1, and the second bridge pattern BRP2 may be electrically isolated from the fourth conductive pattern CP4 of each of the 21st and 22nd dummy pixels DP21 and DP22.

The dummy pixel DP of the first row R1 and the dummy pixel DP of the second row R2 disposed in the same column may be electrically connected to different bridge patterns (or repair lines). In an embodiment, the fourth conductive pattern CP4 of the 11th dummy pixel DP1 of the first row R1 may be electrically connected to the second bridge pattern BRP2 (or the second repair line RPL2) through the corresponding contact hole CH, and the fourth conductive pattern CP4 of the 21st dummy pixel DP21 of the second row R2 may be electrically connected to the first bridge pattern BRP1 (or the first repair line RPL1) through the corresponding contact hole CH, for example. Further, the fourth conductive pattern CP4 of the 12th dummy pixel DP12 of the first row R1 may be electrically connected to the first repair line RPL1 (or the first bridge pattern BRP1) through the corresponding contact hole CH, and the fourth conductive pattern CP4 of the 22nd dummy pixel DP22 of the second row R2 may be electrically connected to the second repair line RPL2 (or the second bridge pattern BRP2) through the corresponding contact hole CH.

Figure 24:
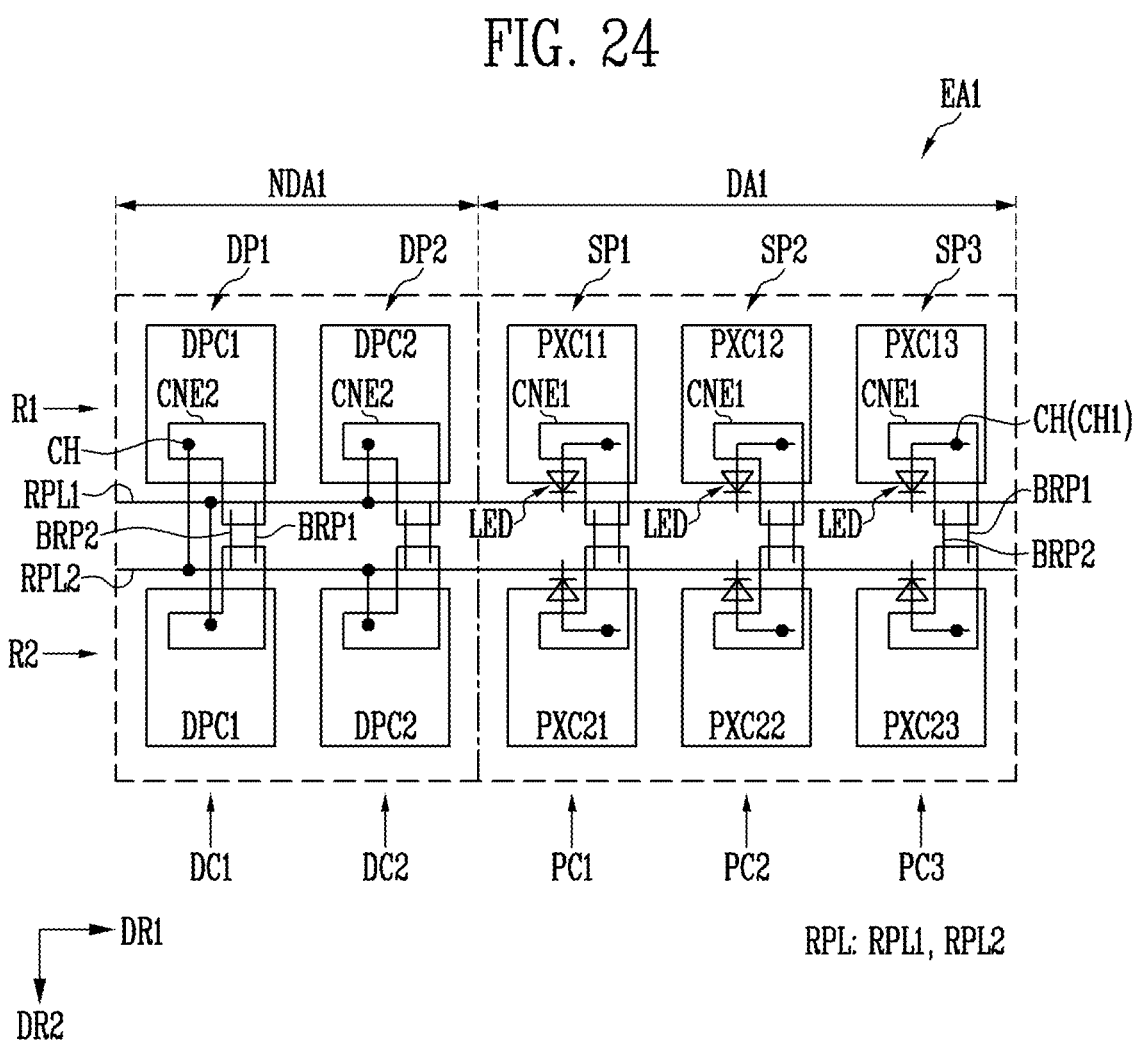
FIG. 24 is a schematic view of an embodiment of a portion EA1 of FIG. 2 for illustrating sub-pixels in a first area and dummy pixels in a first non-display area in a display device.

FIG. 24 is a schematic view of an embodiment of the portion EA1 of FIG. 2 for illustrating sub-pixels in the first area DA1 and dummy pixels in the first non-display area NDA1 in the display device.

In FIG. 24, only the first repair line RPL1 and the second repair line RPL2 arranged between the first row R1 and the second row R2 of the signal wiring lines in each of the first display area DA1 and the first non-display area NDA1 are shown for convenience of description.

Referring to FIG. 24, differences from the above-described embodiments are mainly described so as to avoid overlapping descriptions.

Referring to FIGS. 2 and 24, in the first area DA1, each of the first and second rows R1 and R2 may include the first sub-pixel SP1, the second sub-pixel SP2, and the third sub-pixel SP3 arranged in the first direction DR1. The first sub-pixel SP1 including the 11th pixel circuit PXC11 and the 21st pixel circuit PXC21 may be arranged in a first pixel column PC1, the second sub-pixel SP2 including the 12th pixel circuit PXC12 and the 22nd pixel circuit PXC22 may be arranged in a second pixel column PC2, and the third sub-pixel SP3 including the 13th pixel circuit PXC13 and the 23rd pixel circuit PXC23 may be arranged in a third pixel column PC3. Each of the first to third sub-pixels SP1 to SP3 may include a pixel circuit and the light-emitting element LED electrically connected to the pixel circuit. The pixel circuit of each of the first to third sub-pixels SP1 to SP3 may include the first contact electrode CNE1. The first contact electrode CNE1 may be electrically connected to the light-emitting element LED. The first contact electrode CNE1 may be the fourth conductive pattern CP4 as described with reference to FIGS. 7 to 15.

The first contact electrode CNE1 may electrically connect the light-emitting element LED and some configurations of the pixel circuit. In an embodiment, the first contact electrode CNE1 may electrically connect the light-emitting element LED and the sixth transistor (refer to "T6" in FIG. 7) of the pixel circuit (refer to "PXC" in FIG. 3) through the corresponding contact hole CH, for example. The first contact electrode CNE1 may be disposed at a connection point (or the "fourth node N4" in FIG. 3) which electrically connects the light-emitting element LED and the pixel circuit PXC in each sub-pixel. Hereinafter, for convenience of description, the contact hole CH electrically connecting the light-emitting element LED, the first contact electrode CNE1, and the sixth transistor T6 of the pixel circuit PXC will be also referred to as the first contact hole CH1.

In the first non-display area NDA1, each of the first and second rows R1 and R2 may include a first dummy pixel DP1 and the second dummy pixel DP2. The first dummy pixel DP1 may be arranged in a first dummy column DC1, and the second dummy pixel DP2 may be arranged in a second dummy column DC2. Each of the first and second dummy pixels DP1 and DP2 may include a dummy pixel circuit. In an embodiment, a first dummy pixel circuit DPC1 may be arranged in the first dummy pixel DP1, and a second dummy pixel circuit DPC2 may be arranged in the second dummy pixel DP2, for example. The dummy pixel circuit of each of the first and second dummy pixels DP1 and DP2 may include a second contact electrode CNE2 electrically connected to the repair line RPL. The second contact electrode CNE2 may be the fourth conductive pattern CP4 as described with reference to FIGS. 18 to 23.

The second contact electrode CNE2 may be electrically connected to the repair line RPL through the corresponding contact hole CH. The contact hole CH may be disposed at a connection point (or a connection node) electrically connecting the repair line RPL and the second contact electrode CNE2 at each dummy pixel.

In each of the first non-display area NDA1 and the first area DA1, the first repair line RPL1 and the second repair line RPL2 may be arranged between the first row R1 and the second row R2. The first repair line RPL1 may be formed integrally with the first bridge pattern BRP1, and the second repair line RPL2 may be formed integrally with the second bridge pattern BRP2.

In the first area DA1, the first bridge pattern BRP1 and the second bridge pattern BRP2 may extend in the second direction DR2 between the sub-pixels in the first row R1 and the sub-pixels in the second row R2. In an embodiment, the first bridge pattern BRP1 and the second bridge pattern BRP2 may extend in the second direction DR2 between the first sub-pixel SP1 in the first row R1 and the first sub-pixel SP1 in the second row R2, between the second sub-pixel SP2 in the first row R1 and the second sub-pixel SP2 in the second row R2, and between the third sub-pixel SP3 in the first row R1 and the third sub-pixel SP3 in the second row R2, for example.

In the first area DA1, the first and second bridge patterns BRP1 and BRP2 may overlap the first contact electrode CNE1 of each sub-pixel. Each of the first and second bridge patterns BRP1 and BRP2 may be electrically isolated from the first contact electrode CNE1. The first bridge pattern BRP1 and the second bridge pattern BRP2, which are spaced apart from each other between the sub-pixel of the first row R1 and the sub-pixel of the second row R2 disposed in the same pixel column, may be disposed on one side and an opposite side of the first contact hole CH1, respectively, with respect to the first contact hole CH1. In an embodiment, between the first row R1 and the second row R2 of each of the first to third pixel columns PC1 to PC3, the second bridge pattern BRP2 may be disposed on the left side of the first contact hole CH1 and the first bridge pattern BRP1 may be disposed on the right side of the first contact hole CH1 on the basis of the first contact hole CH1 of the sub-pixels disposed in each of the first and second rows R1 and R2, for example.

In an embodiment, the first repair line RPL1 may be electrically connected to a dummy pixel circuit of one of the first and second dummy pixels DP1 and DP2, and the second repair line RPL2 may be electrically connected to a dummy pixel circuit of the remaining dummy pixels among the first and second dummy pixels DP1 and DP2. In an embodiment, each of the second dummy pixel DP2 (or the second dummy pixel circuit DPC2) of the first row R1 and the first dummy pixel DP1 (or the first dummy pixel circuit DPC1) of the second row R2 is electrically connected to the first repair line RPL1 through the corresponding second contact electrode CNE2, for example. Each of the first dummy pixel DP1 (or the first dummy pixel circuit DPC1) of the first row R1 and the second dummy pixel DP2 (or the second dummy pixel circuit DPC2) of the second row R2 may be electrically connected to the second repair line RPL2 through the corresponding second contact electrode CNE2.

The first and second repair lines RPL1 and RPL2 may be electrically isolated from the pixel circuit of each of the first to third sub-pixels SP1 to SP3 disposed in the first area DA1.

Generally, the display device (refer to "DD" in FIG. 2) may perform a lighting check on the light-emitting element LED of the sub-pixel (refer to "SP" in FIG. 2) arranged in the display area (refer to "DA" in FIG. 2). When the lighting check indicates that some of the light-emitting elements LED are not lit and the sub-pixel SP is darkened, a repair process may be performed by electrically connecting the non-lit light-emitting elements LED to the first and second dummy pixels DP1 and DP2 to drive the light-emitting element LED.

Hereinafter, the repairing method of the sub-pixel SP which is defective in the first area DA1 will be described below.

Figure 26:
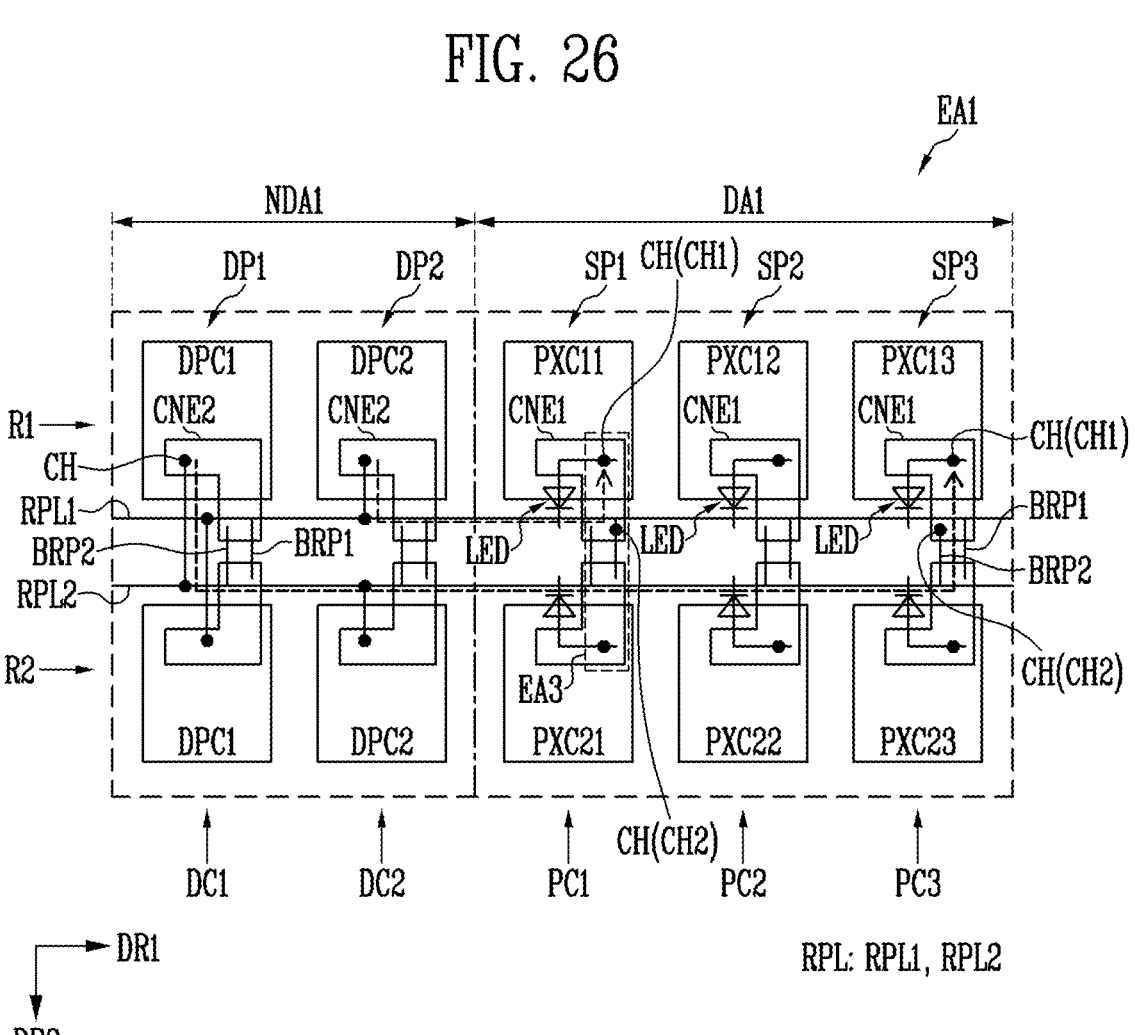
FIG. 26 is a schematic view for illustrating a method of repairing a bad sub-pixel corresponding to the portion EA1 of FIG. 2.
Figure 27:
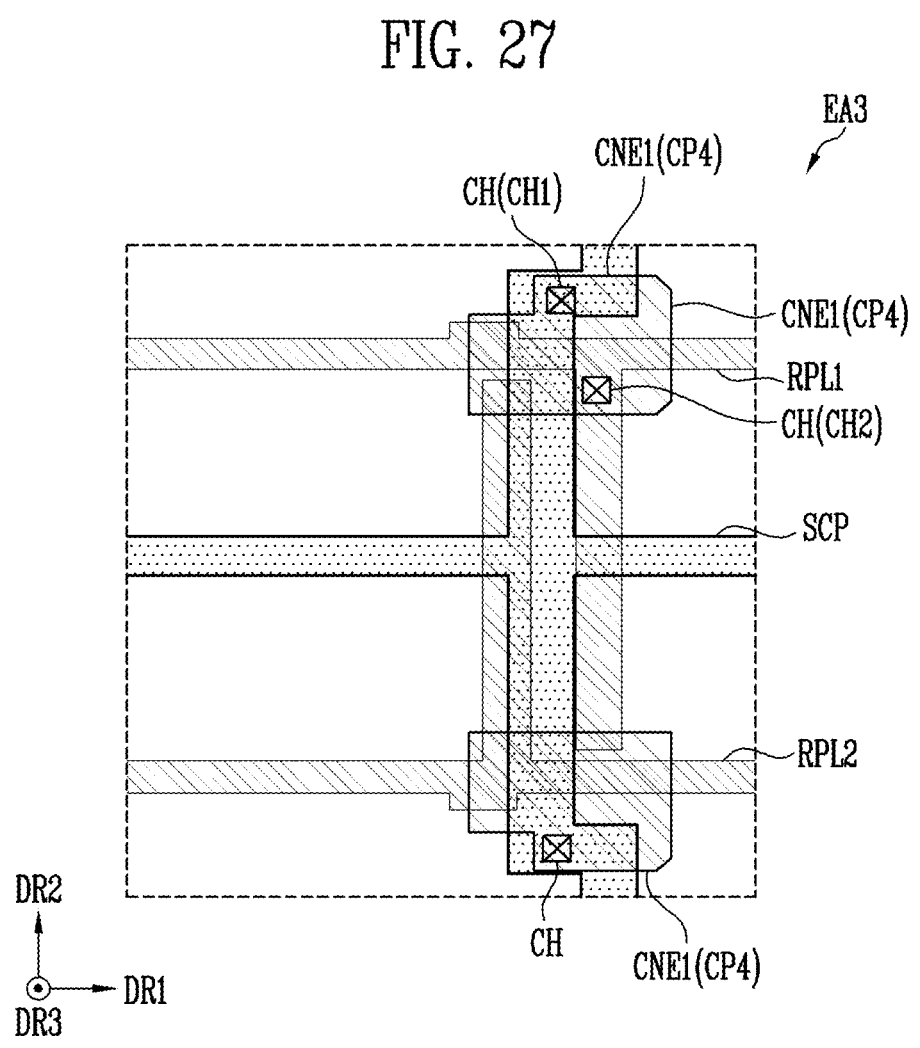
Figure 28:
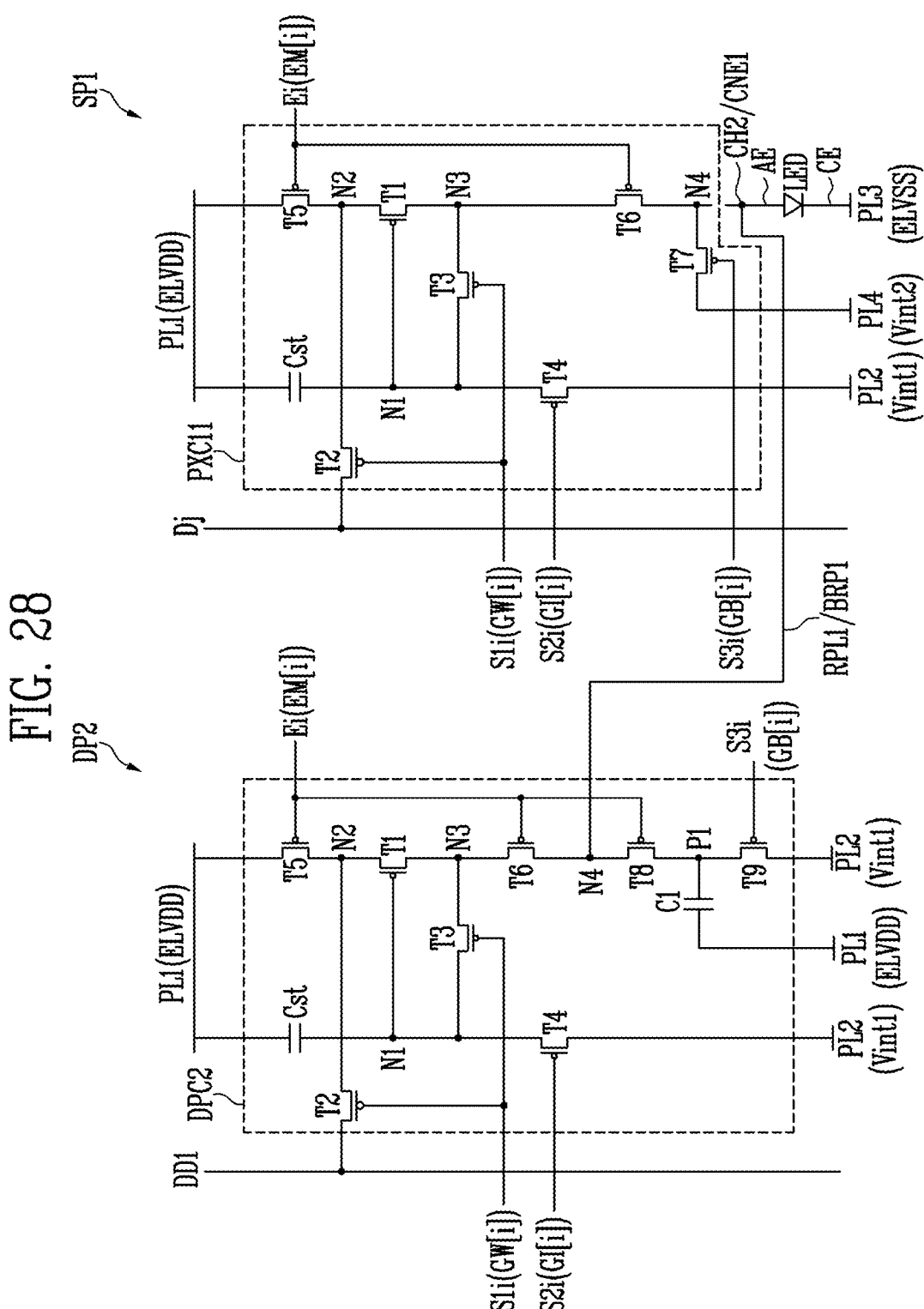
FIG. 28 is a schematic circuit diagram illustrating electrical connections of a first sub-pixel and a second dummy pixel arranged in a first row of FIG. 26.

FIG. 25 is a schematic flow diagram illustrating an embodiment of a method of repairing a display device. FIG. 26 is a schematic view corresponding to the portion EA1 of FIG. 2 for illustrating a method of repairing a defective sub-pixel. FIG. 27 is a schematic view of a portion EA3 of FIG. 26. FIG. 28 is a schematic circuit diagram illustrating electrical connections of the first sub-pixel SP1 and the second dummy pixel DP2 arranged in the first row of FIG. 26.

Differences from the above-described embodiments will be mainly described with reference to the embodiments of FIGS. 25 to 28 so as to avoid overlapping descriptions.

Referring to FIGS. 25 to 28, the display device (refer to "DD" in FIG. 2 including the dummy pixel (refer to "DP" in FIG. 2) and the sub-pixel (refer to "SP" in FIG. 2) may be provided at operation S100.

By the repairing method, dark spot defects of the sub-pixels SP arranged in each of the first area DA1 (or the first display area) and the second area (refer to "DA2" in FIG. 2) (or the second display area) may be detected at operation S200.

When two sub-pixels in the first row R1 of the first area DA1 have dark spot failures, the first dummy pixel (refer to "DP1" in FIG. 2) and the second dummy pixel (refer to "DP2" in FIG. 2) arranged in the first row R1 of the first non-display area NDA1 may be electrically connected to the two sub-pixels to repair the dark spot failures of the two sub-pixels at operation S300.

The repair process may include, e.g., using a laser to disconnect the electrical connection of the light-emitting element from the pixel circuit and the pixel circuit in the sub-pixel with the dark spot failure, and performing a bonding process using a laser to electrically connect the light-emitting element to the dummy pixel DP arranged in the same row as the sub-pixel with the dark spot failure through the repair line ("RPL"), so that the light-emitting element may operating normally.

As shown in FIG. 26, when dark spot failures occur simultaneously in the first sub-pixel SP1 and the third sub-pixel SP3 arranged in the first row R1, a repair process may be performed in which the first sub-pixel SP1 is electrically connected to the second dummy pixel DP2 arranged in the first row R1, and the third sub-pixel SP3 is electrically connected to the first dummy pixel DP1 arranged in the first row R1. The dark spot failure of each of the first and third sub-pixels SP1 and SP3 may be caused by, e.g., a defect in the pixel circuit.

When the 11th pixel circuit PXC11 of the first sub-pixel SP1 is defective, the anode electrode AE of the light-emitting element LED (hereinafter, also referred to as a "first light-emitting element") electrically connected to the 11th pixel circuit PXC11 and the sixth and seventh transistors T6 and T7 of the 11th pixel circuit PXC11 may be disconnected from each other using a laser. As a result, the anode electrode AE and the sixth and seventh transistors T6 and T7 may be electrically disconnected from each other. The contact hole CH (or a second contact hole CH2) may be formed between the first contact electrode CNE1 and the first bridge pattern BRP1 electrically connected to the anode electrode AE (or the first light-emitting element LED) through the first contact hole CH1 by destroying the insulating layer using a laser bonding process. The contact hole CH (or the second contact hole CH2) may be disposed on the right side of the first contact hole CH1 on the basis of the first contact hole CH1 in the plan view.

Through the contact hole CH (or the second contact hole CH2), the first contact electrode CNE1, and the first contact hole CH1, the first bridge pattern BRP1 (or the first repair line RPL1) and the anode electrode AE (or the (1-1)th light-emitting element LED) may be electrically connected. The first repair line RPL1 is electrically connected to the second dummy pixel DP2 arranged in the first row R1 of the first non-display area NDA1, so that the second dummy pixel circuit DPC2 of the second dummy pixel DP2 and the (1-1)th light-emitting element LED of the first sub-pixel SP1 may be electrically connected. Accordingly, an electrical path is formed from the second dummy pixel DP2 to the first light-emitting element LED of the first sub-pixel SP1 through the first repair line RPL1 such that the first light-emitting element LED may operate normally and the first sub-pixel SP1 having a dark spot defect may be repaired.

When a dark spot failure occurs in the third sub-pixel SP3 arranged in the same row as the first sub-pixel SP1, the light-emitting element LED (hereinafter, a "second light-emitting element") electrically connected to the 13th pixel circuit PXC13 of the third sub-pixel SP3 may be disconnected from the anode electrode (refer to "AE" in FIG. 3) and the sixth and seventh transistors (refer to "T6 and T7" in FIG. 3) of the 13th pixel circuit PXC13. As a result, the anode electrode AE of the third light-emitting element LED and the sixth and seventh transistors T6 and T7 may be electrically disconnected from each other. The contact hole CH (or the second contact hole CH2) may be formed by destroying the insulating layer using a laser bonding process between the first contact electrode CNE1 and the second bridge pattern BRP2 electrically connected to the anode electrode AE of the second light-emitting element LED through the first contact hole CH1. The first contact hole CH (or the second contact hole CH2) may be disposed on the left side of the first contact hole CH1 on the basis of the first contact hole CH1 in the plan view.

Through the contact hole CH, the first contact electrode CNE1, and the first contact hole CH1, the second bridge pattern BRP2 (or the second repair line RPL2) and anode electrode AE of the second light-emitting element LED may be electrically connected. The second repair line RPL2 is electrically connected to the first dummy pixel DP1 arranged in the first row R1 of the first non-display area NDA1, so that the first dummy pixel circuit DPC1 of the first dummy pixel DP1 and the (3-1)th light-emitting element LED of the third sub-pixel SP3 may be electrically connected. Accordingly, an electrical path is formed from the first dummy pixel DP1 to the second light-emitting element LED of the third sub-pixel SP3 through the second repair line RPL2 such that the second light-emitting element LED may operate normally, and the third sub-pixel SP3 having a dark spot defect may be repaired.

As described above, when a dark spot failure occurs in the two sub-pixels arranged in the first row R1 of the first area DA1, the light-emitting element LED of one of the two sub-pixels for one horizontal time is electrically connected to the dummy pixel circuit of one of the first and second dummy pixels DP1 and DP2 arranged in the first row R1 of the first non-display area NDA1, and the light-emitting element LED of remaining (the other) two sub-pixels may be electrically connected to the dummy pixel circuit of one of the first and second dummy pixels DP1 and DP2. Accordingly, the dark spot defects of the two sub-pixels in one row (or one pixel row) in the first area DA1 may be repaired.

In the embodiment described above, the first area DA1 is described mainly for convenience of description, but the disclosure is not limited thereto, and any sub-pixels with dark spot defects may also be repaired in the second area (refer to "DA2" in FIG. 2). In an embodiment, when two sub-pixels in the first row in the second area DA2 (or the second display area) have dark spot failures, the light-emitting element LED of one of the two sub-pixels is electrically connected to the dummy pixel circuit of one of the third and fourth dummy pixels (refer to "DP3 and DP4" in FIG. 2) arranged in the first row of the second non-display area (refer to "NDA2" in FIG. 2), and the light-emitting elements LED of a remaining (the other) sub-pixel may be electrically connected to the dummy pixel circuit of a remaining (the other) dummy pixel between the third and fourth dummy pixels DP3 and DP4, for example. Accordingly, the dark spot defects of the two sub-pixels in one row (or one pixel row) in the second area DA2 may be repaired.

According to the embodiment described above, by simultaneously repairing the dark spot defects of two sub-pixels in one row (or one pixel row) of each of the first area DA1 (or the first display area) and the second area DA2 (or the second display area), the number of repairable sub-pixels for one horizontal time may be increased, thereby improving the product yield.

Figure 29:
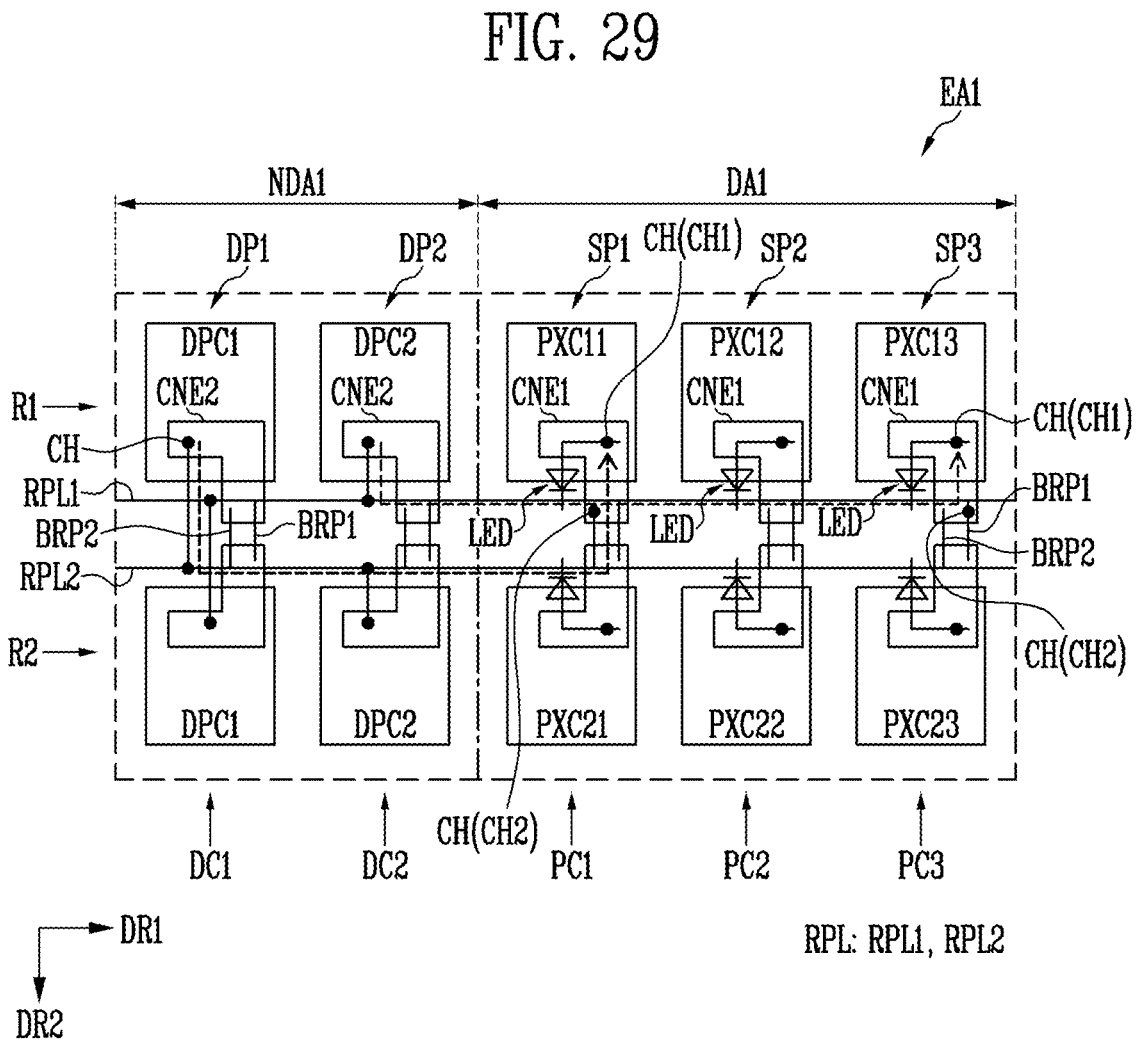
FIG. 29 is a schematic view for illustrating a method of repairing a bad sub-pixel corresponding to a portion EA1 of FIG. 2.

FIG. 29 is a schematic view corresponding to the portion EA1 of FIG. 2 for illustrating a method of repairing a bad sub-pixel. In particular, FIG. 29 illustrates a modification embodiment of FIG. 26 with respect to an electrical path of a dummy pixel and the bad sub-pixel.

With respect to the embodiment of FIG. 29, to avoid redundant descriptions, the differences from the above-described embodiments will be mainly described.

Referring to FIGS. 2 and 29, in the first row R1, when the 11th pixel circuit PXC11 of the first sub-pixel SP1 and the 13th pixel circuit PXC13 of the third sub-pixel SP3 are defective, the light-emitting element LED of the first sub-pixel SP1 (hereinafter, also referred to as a "(1-1)th light-emitting element") is electrically connected to the first dummy pixel DP1 arranged in the first row R1, and the light-emitting element LED of the third sub-pixel SP3 (hereinafter, also referred to as the "(1-1)th light-emitting element") of the first sub-pixel SP1 is electrically connected to the first dummy pixel DP1 arranged in the first row R1, and the light-emitting element LED of the third sub-pixel SP3 (hereinafter, also referred to as the "second light-emitting element") is electrically connected to the second dummy pixel DP2 arranged in the first row R1. The first dummy pixel circuit DPC1 of the first dummy pixel DP1 may be electrically connected to the second repair line RPL2, and the second dummy pixel circuit DPC2 of the second dummy pixel DP2 may be electrically connected to the first repair line RPL1.

More specifically, an electrical connection between the first light-emitting element LED and some configuration of the 11th pixel circuit PXC11 is released, and the contact hole CH (or the second contact hole CH2) is formed between the first contact electrode CNE1 of the first sub-pixel SP1 and the second bridge pattern BRP2 to electrically connect the first light-emitting element LED and the second repair line RPL2 connected to the second bridge pattern BRP2, so that the first light-emitting element LED and the first dummy pixel circuit DPC1 of the first dummy pixel DP1 may be electrically connected. The contact hole CH (or the second contact hole CH2) may be disposed on the left side of the contact hole CH1 of the sub-pixel SP1 on the basis of the first contact hole CH1.

Further, the electrical connection between the second light-emitting element LED and some configurations of the 13th pixel circuit PXC13 is released, and the contact hole CH (or the second contact hole CH2) is formed between the first contact electrode CNE1 and the first bridge pattern BRP1 of the third sub-pixel SP3 to electrically connect the second light-emitting element LED and the first repair line RPL1 connected to the first bridge pattern BRP1, so that the second light-emitting element LED and the second dummy pixel circuit DPC2 of the second dummy pixel DP2 may be electrically connected. The contact hole CH (or the second contact hole CH2) may be disposed on the right side of the first contact hole CH1 on the basis of the first contact hole CH1 of the third sub-pixel SP3.

As described above, an electrical path is formed from the first dummy pixel DP1 to the first light-emitting element LED of the first sub-pixel SP1 having a dark spot defect through the second repair line RPL2, and an electrical path is formed from the second dummy pixel DP2 to the second light-emitting element LED of the third sub-pixel SP3 having a dark spot defect through the first repair line RPL1. Thus, signal delay phenomenon due to the difference in the electrical path between the dummy pixel and the sub-pixel in which the dark spot defect occurs may be reduced or prevented. In other words, the signal delay phenomenon due to the difference in length between the first repair line RPL1 and the second repair line RPL2 electrically connecting the dummy pixel and the defective sub-pixel may be reduced or prevented.

Figure 30:
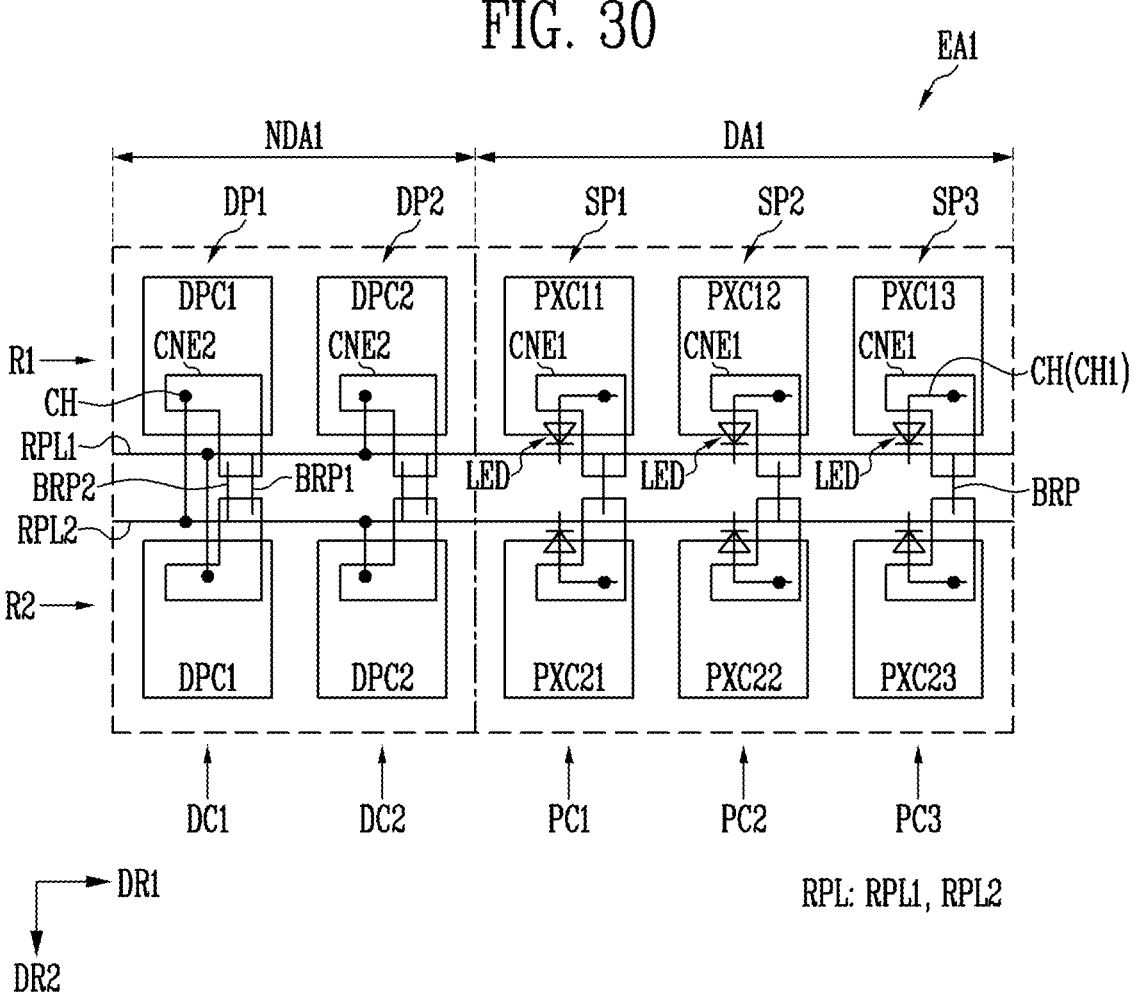
FIG. 30 is a schematic view of an embodiment of one area of a display device in an embodiment, corresponding to the portion EA1 of FIG. 2.

FIG. 30 is a schematic view of view of an embodiment of one area of a display device, corresponding to the portion EA1 of FIG. 2.

With respect to the embodiment of FIG. 30, to avoid redundant descriptions, the differences from the embodiments described above will be main described.

Referring to FIGS. 2 and 30, in the first area DA1 (or the first display area), a bridge pattern BRP may be arranged between the sub-pixel (refer to "SP" in FIG. 2) in the first row R1 and the sub-pixel SP in the second row R2. In an embodiment, the bridge pattern BRP may be arranged between the first sub-pixel SP1 arranged in the first row R1 and the second sub-pixel SP2 arranged in the second row R2, between the second sub-pixel SP2 arranged in the first row R1 and the second sub-pixel SP2 arranged in the second row R2, and between the third sub-pixel SP3 arranged in the first row R1 and the third sub-pixel SP3 arranged in the second row R2, for example.

In each of the first to third pixel columns PC1 to PC3, one end of the bridge pattern BRP may overlap some configuration (e.g., the first contact electrode CNE1) of the sub-pixel SP of the first row R1, and an opposite end of the bridge pattern BRP may overlap some configuration (e.g., the first contact electrode CNE1) of the sub-pixel SP of the second row R2.

In the first pixel column PC1, the bridge pattern BRP may be unitary with the first repair line RPL1 and electrically and/or physically connected to the first repair line RPL1. In the second pixel column PC2, the bridge pattern BRP may be unitary with the second repair line RPL2 and electrically and/or physically connected to the second repair line RPL2. In the third pixel column PC3, the bridge pattern BRP may be unitary with the first repair line RPL1 and electrically and/or physically connected to the first repair line RPL1. However, the electrical connection between the bridge pattern BRP and the repair line RPL in each pixel column is not limited to the above-described embodiment.

Figure 31:
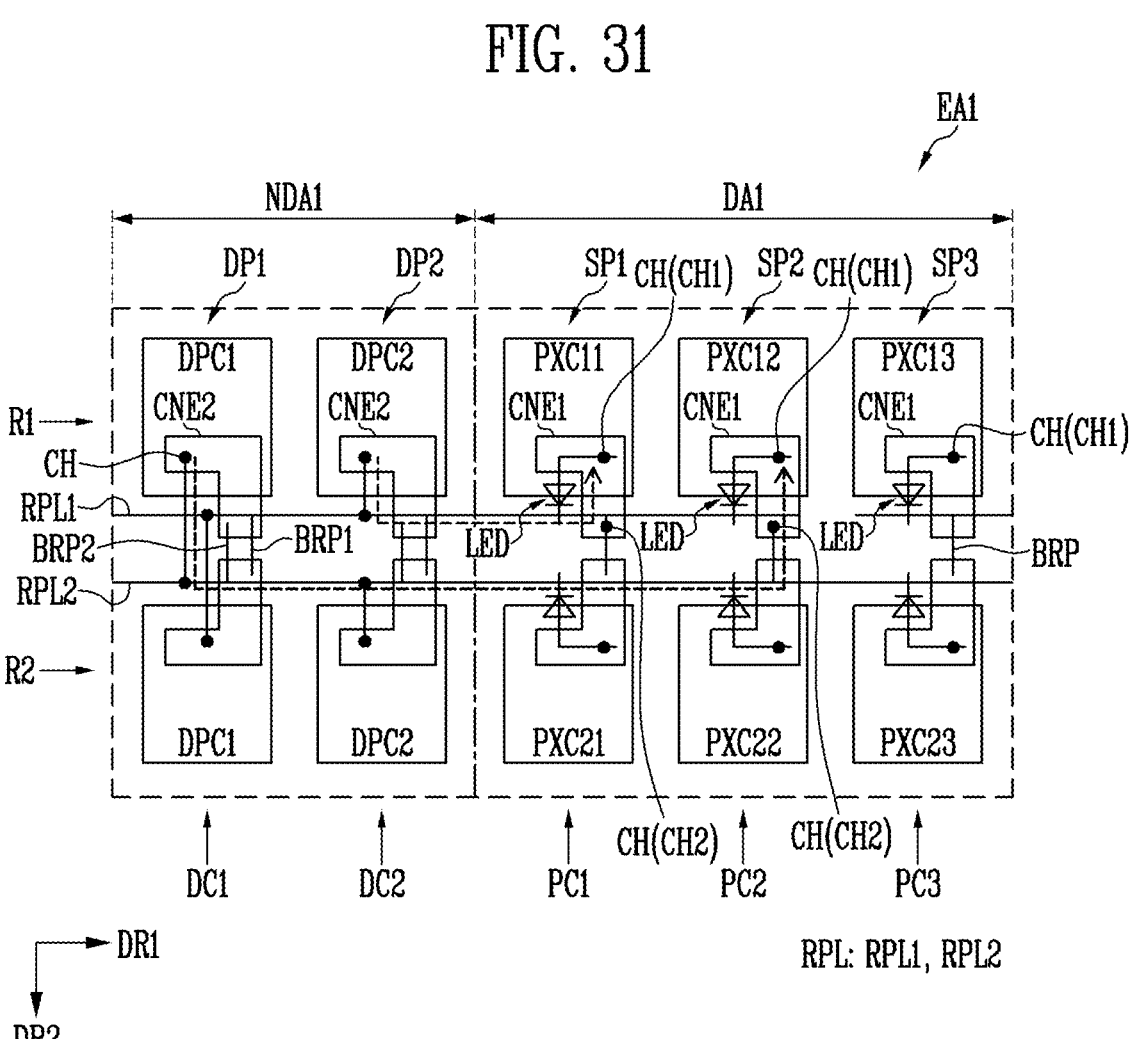
FIG. 31 is a schematic view for illustrating a method of repairing a bad sub-pixel corresponding to the portion EA1 of FIG. 2.

FIG. 31 is a schematic view for illustrating a method of repairing a bad sub-pixel corresponding to the portion EA1 of FIG. 2.

With respect to the embodiment of FIG. 31, to avoid redundant descriptions, the differences from the embodiments described above will be mainly described.

Referring to FIGS. 2, 30, and 31, when the 11th pixel circuit PXC11 of the first sub-pixel SP1 and the 12th pixel circuit PXC12 of the second sub-pixel SP2 in the first row R1 are defective, the light-emitting element LED of the first sub-pixel SP1 (hereinafter, also referred to as the "first light-emitting element") is electrically connected to the second dummy pixel DP2 (or the second dummy pixel circuit DPC2) arranged in the first row R1, and the light-emitting element LED of the second sub-pixel SP2 (hereinafter, also referred to as the "second light-emitting element") is electrically connected to the first dummy pixel DP1 (or the first dummy pixel circuit DPC1) arranged in the first row R1. The first dummy pixel circuit DPC1 may be electrically connected to the second repair line RPL2, and the second dummy pixel circuit DPC2 may be electrically connected to the first repair line RPL1.

More specifically, the electrical connection between the first light-emitting element LED and some configuration of the 11th pixel circuit PXC11, and the contact hole CH (or the second contact hole CH2) is formed between one end of the bridge pattern BRP disposed in the first pixel column PC1 and the first contact electrode CNE1 of the first sub-pixel SP1 to thereby electrically connect the first light-emitting element LED and the first repair line RPL1 connected to the bridge pattern BRP, so that the first light-emitting element LED and the second dummy pixel circuit DPC2 of the second dummy pixel DP2 may be electrically connected. Accordingly, an electrical path is formed from the second dummy pixel DP2 to the first light-emitting element LED of the first sub-pixel SP1 through the first repair line RPL1, so that the first light-emitting element LED may operate normally and the first sub-pixel SP1 having a dark spot defect may be repaired. Subsequently, a portion of the first repair line RPL1 between the second sub-pixel SP2 of the first row R1 and the third sub-pixel SP3 is removed to electrically disconnect the bridge pattern BRP arranged in the third pixel row PC3 and the first repair line RPL1 connected to the first light-emitting element LED from each other. The first repair line RPL1 electrically disconnected from the first light-emitting element LED and connected to the bridge pattern BRP arranged in the third pixel column PC3 may be electrically connected to the fourth power line (refer to "PL4" in FIG. 3) (or the fifth wiring line (refer to "WL5" in FIG. 7)) to which the second initialization power supply voltage Vint2 as described with reference to FIG. 3 is applied.

Further, the electrical connection between the second light-emitting element LED and some configuration of the 12th pixel circuit PXC12 is released, and the contact hole CH (or the second contact hole CH2) is formed between one end of the bridge pattern BRP disposed in the second pixel column PC2 and the first contact electrode CNE1 of the second sub-pixel SP2 to electrically connect the second light-emitting element LED and the second repair line RPL2 connected to the bridge pattern BRP, so that the second light-emitting element LED and the first dummy pixel circuit DPC1 of the first dummy pixel DP1 may be electrically connected. Accordingly, an electrical path is formed from the first dummy pixel DP1 to the second light-emitting element LED of the second sub-pixel SP2 through the second repair line RPL2, so that the second light-emitting element LED may operate normally and the second sub-pixel SP2 having the dark spot failure may be repaired.

Figure 32:
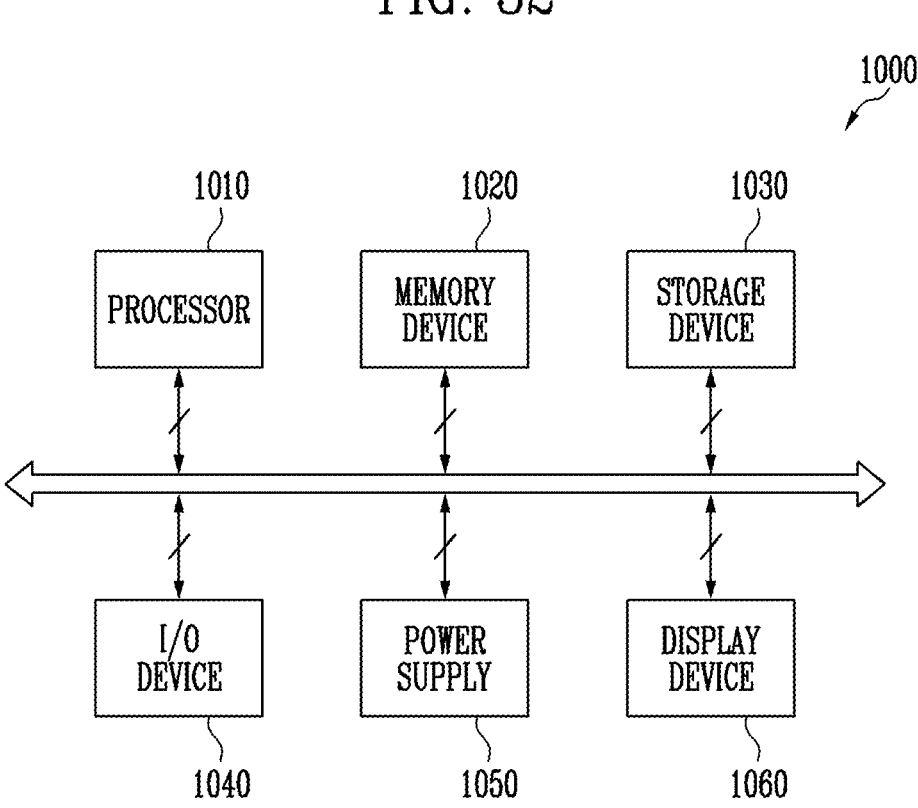
FIG. 32 is a schematic block diagram illustrating an embodiment of an electronic device.
Figure 33:
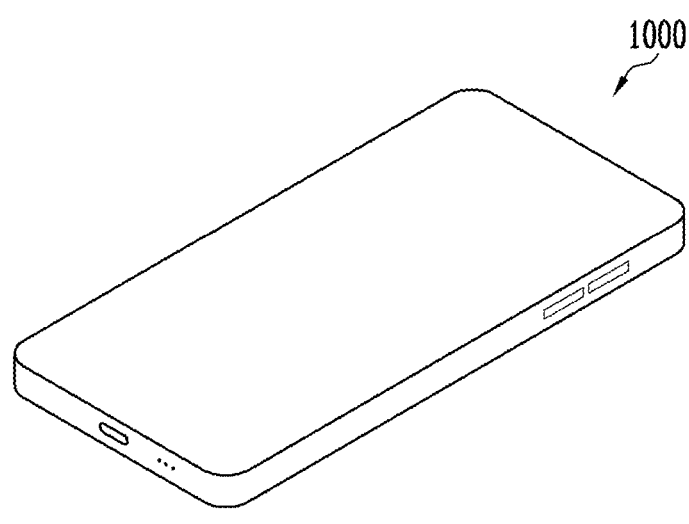
FIG. 33 is a schematic diagram illustrating an embodiment in which an electronic device of FIG. 32 is a smartphone.
Figure 34:
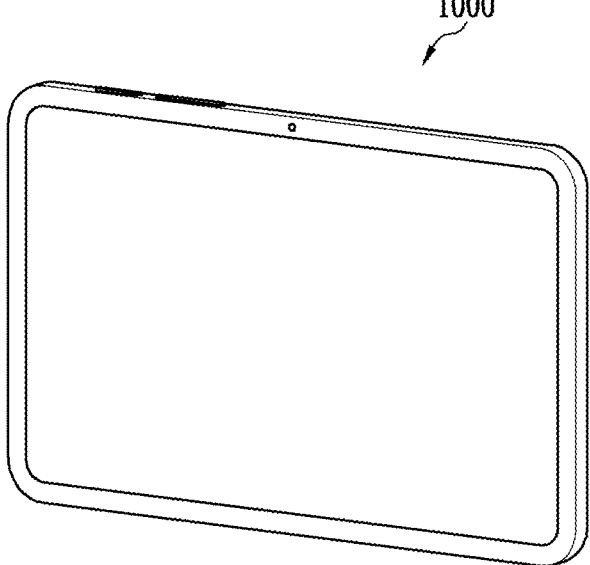
FIG. 34 is a schematic view illustrating an embodiment in which an electronic device of FIG. 32 is a tablet PC.

FIG. 32 is a schematic block diagram illustrating an embodiment of an electronic device. FIG. 33 is a schematic diagram illustrating an embodiment in which an electronic device of FIG. 32 is a smartphone. FIG. 34 is a schematic view illustrating an embodiment in which an electronic device of FIG. 32 is a tablet PC.

Referring to FIGS. 32 to 34, the electronic device 1000 may include a processor 1010, a memory device 1020, a storage device 1030, an input/output ("I/O") device 1040, a power supply 1050, and a display device 1060. The display device 1060 may be the display device DD of FIGS. 1 and 2. The electronic device 1000 may further include various ports for communication with a video card, a sound card, a memory card, a universal serial bus ("USB") device, or other systems. In an embodiment, as illustrated in FIG. 33, the electronic device 1000 may be a smartphone. In an embodiment, as illustrated in FIG. 34, the electronic device 1000 may be a tablet computer. However, the aforementioned examples are illustrative, and the electronic device 1000 is not necessarily limited to the aforementioned examples. In an embodiment, the electronic device 1000 may be a cellular phone, a video phone, a smart pad, a smartwatch, a navigation device for vehicles, a computer monitor, a laptop computer, a head-mounted display device, or the like, for example.

The processor 1010 may perform predetermined calculations or tasks. In an embodiment, the processor 1010 may be a microprocessor, a central processing unit, an application processor, or the like. The processor 1010 may be connected to other components through an address bus, a control bus, a data bus, or the like. In an embodiment, the processor 1010 may be connected to an expansion bus such as a peripheral component interconnect ("PCI") bus.

The memory device 1020 may store data desired to perform the operation of the electronic device 1000. In an embodiment, the memory device 1020 may include non-volatile memory devices such as an Erasable Programmable Read-Only Memory ("EPROM") device, an Electrically Erasable Programmable Read-Only Memory ("EEPROM") device, a flash memory device, a Phase Change Random Access Memory ("PRAM") device, a Resistance Random Access Memory ("RRAM") device, a Nano Floating Gate Memory ("NFGM") device, a Polymer Random Access Memory ("PoRAM") device, a Magnetic Random Access Memory ("MRAM"), and a Ferroelectric Random Access Memory ("FRAM") device, and/or a volatile memory device such as a Dynamic Random Access Memory ("DRAM") device, a Static Random Access Memory ("SRAM") device, and a mobile DRAM device, for example.

The storage device 1030 may include a solid state drive ("SSD"), a hard disk drive ("HDD"), a compact disc read-only memory ("CD-ROM"), or the like.

The I/O device 1040 may include input devices such as a keyboard, a keypad, a touchpad, a touch screen, and a mouse, and output devices such as a speaker and a printer. In an embodiment, the display device 1060 may be included in the I/O device 1040.

The power supply 1050 may supply power desired to perform the operation of the electronic device 1000. In an embodiment, the power supply 1050 may include a power management integrated circuit ("PMIC"), for example.

The display device 1060 may display images in response to control signals or data from the processor 1010. The display device 1060 may be an organic light-emitting display device or a quantum dot light-emitting display device, but the disclosure is not limited to these. The display device 1060 may be connected to other components through the buses or other communication links.

A display device and a repairing method thereof in embodiments may improve the reliability of the display device by easily repairing dark spot failures occurring in four sub-pixels in one pixel row at the same time.

By embodiments, the yield of a product may be improved by increasing the number of repairable sub-pixels.

Furthermore, in embodiments, an electronic device including the above-described display device may be provided.

The effects of the disclosure are not limited by the foregoing, and other various effects are anticipated herein.

What is claimed is:

1. A display device comprising:
a substrate in which a display area including a first area and a second area and a non-display area surrounding a side of the display area are defined;
a sub-pixel arranged in the display area;
a dummy pixel arranged in the non-display area, the dummy pixel including:
a first dummy pixel and a second dummy pixel, each of the first and second dummy pixels including:
a dummy pixel circuit; and
a first capacitor electrically connected to the dummy pixel circuit; and
a repair line commonly provided to the display area and the non-display area and extending in a first direction, the repair line including:
a first repair line and a second repair line arranged between a first pixel row and a second pixel row of the substrate in the first area,
wherein the first dummy pixel and the second dummy pixel are arranged corresponding to the first pixel row and the second pixel row, respectively, and
wherein the first capacitor of each of the first and second dummy pixels is disposed between the dummy pixel circuit of the first dummy pixel and the dummy pixel circuit of the second dummy pixel.

2. The display device of claim 1, wherein the first capacitor of the first dummy pixel and the first capacitor of the second dummy pixel are provided as a single body, and
wherein the first dummy pixel and the second dummy pixel share the first capacitor.

3. The display device of claim 2, wherein the first repair line and the second repair line extend in the first direction, are spaced apart from each other in a second direction crossing the first direction, and are electrically isolated from each other.

4. The display device of claim 3, further including:
a first bridge pattern extending in the second direction and electrically connected to the first repair line; and
a second bridge pattern extending in the second direction and electrically connected to the second repair line.

5. The display device of claim 4, wherein the sub-pixel includes:
a transistor arranged on the substrate;
a light-emitting element electrically connected to the transistor and emitting light; and a contact electrode electrically connecting the light-emitting element and the transistor.

6. The display device of claim 5, wherein the contact electrode is arranged on a semiconductor pattern of the transistor between an insulating layer interposed therebetween, and is electrically connected to the semiconductor pattern of the transistor through a first contact hole passing through the insulating layer.

7. The display device of claim 6, wherein the first bridge pattern is disposed on one side of the first contact hole and the second bridge pattern is disposed on an opposite side of the first contact hole opposite to the one side of the first contact hole based on the first contact hole in a plan view.

8. The display device of claim 6, wherein the first and second bridge patterns are disposed on one side of the first contact hole based on the first contact hole in a plan view.

9. The display device of claim 6, wherein the contact electrode overlaps the first and second bridge patterns, and
wherein the contact electrode, the first bridge pattern, and the second bridge pattern are electrically isolated from each other.

10. The display device of claim 3, wherein the first dummy pixel is electrically connected to one of the first and second repair lines, and
wherein the second dummy pixel is electrically connected to a remaining repair line between the first and second repair lines.

11. The display device of claim 3, wherein the sub-pixel includes a pixel circuit, and
wherein pixel circuits of two sub-pixels facing each other in the second direction while interposing the first and second repair lines in the first area are mirror symmetrical with respect to each other.

12. The display device of claim 3, wherein the sub-pixel includes a transistor arranged on the substrate, a light-emitting element electrically connected to the transistor and emitting light, and a contact electrode electrically connecting the light-emitting element and the transistor,
the display device further including a bridge pattern disposed between the sub-pixel arranged in the first pixel row and the sub-pixel arranged in the second pixel row, and connected to a corresponding repair line between the first and second repair lines,
wherein the contact electrode of the sub-pixel arranged in the first pixel row overlaps one end of the bridge pattern, and
wherein the contact electrode of the sub-pixel arranged in the second pixel row overlaps an opposite end of the bridge pattern opposite to the one end of the bridge pattern.

13. The display device of claim 12, wherein in each of the first and second pixel rows, the sub-pixel includes a first sub-pixel, a second sub-pixel, and a third sub-pixel arranged in the first direction,
wherein the bridge pattern disposed between the first sub-pixel arranged in the first pixel row and the first sub-pixel arranged in the second pixel row is connected to the first repair line,
wherein the bridge pattern disposed between the second sub-pixel arranged in the first pixel row and the second sub-pixel arranged in the second pixel row is connected to the second repair line, and
wherein the bridge pattern disposed between the third sub-pixel arranged in the first pixel row and the third sub-pixel arranged in the second pixel row is connected to the first repair line.

14. The display device of claim 3, wherein the non-display area includes a first non-display area next to the first area and a second non-display area next to the second area, and wherein the first and second repair lines are arranged between the first and second dummy pixels arranged in the same row as the first pixel row and the first and second dummy pixels arranged in the same row as the second pixel row in the first non-display area.

15. A display device comprising:

a substrate in which a display area and a non-display area surrounding a side of the display area are defined;

a sub-pixel arranged in the display area and including a transistor, a light-emitting element electrically connected to the transistor, and a contact electrode electrically connecting the light-emitting element and the transistor;

a first repair line and a second repair line extending in a first direction and arranged between a first pixel row and a second pixel row of the substrate;

a first dummy pixel and a second dummy pixel arranged in the non-display area and arranged in the first pixel row and the second pixel row, respectively; and a first bridge pattern and a second bridge pattern disposed between the first repair line and the second repair line and extending in a second direction crossing the first direction, wherein the first bridge pattern is connected to the first repair line, and the second bridge pattern is connected to the second repair line, wherein the contact electrode is arranged on a semiconductor pattern of the transistor with an insulating layer interposed therebetween, and is electrically connected to the semiconductor pattern through a first contact hole passing through the insulating layer, and wherein the first bridge pattern is disposed on one side of the first contact hole and the second bridge pattern is disposed on an opposite side of the first contact hole opposite to the one side of the first contact hole, based on the first contact hole.

16. The display device of claim 15, wherein the contact electrode overlaps the first and second bridge patterns, and wherein the contact electrode, the first bridge pattern, and the second bridge pattern are electrically isolated from each other.

17. The display device of claim 15, wherein each of the first dummy pixel and the second dummy pixel includes a dummy pixel circuit including a first capacitor, and wherein the dummy pixel circuit of the first dummy pixel and the dummy pixel circuit of the second dummy pixel share the first capacitor.

18. The display device of claim 15, wherein the first dummy pixel is electrically connected to one of the first and second repair lines, and wherein the second dummy pixel is electrically connected to a remaining repair line between the first and second repair lines.

19. An electronic device comprising:

a processor providing input image data to a display device; and the display device which displays an image based on the input image data, the display device including:

a substrate in which a display area including a first area and a second area and a non-display area surrounding a side of the display area are defined;

a sub-pixel arranged in the display area;

a dummy pixel arranged in the non-display area, the dummy pixel including:

a first dummy pixel and a second dummy pixel; and a repair line commonly provided to the display area and the non-display area and extending in a first direction, the repair line including:

a first repair line and a second repair line arranged between a first pixel row and a second pixel row of the substrate in the first area, wherein the first dummy pixel and the second dummy pixel are arranged corresponding to the first pixel row and the second pixel row, respectively, wherein each of the first and second dummy pixels includes a dummy pixel circuit and a first capacitor electrically connected to the dummy pixel circuit, and wherein the first capacitor of each of the first and second dummy pixels is disposed between the dummy pixel circuit of the first dummy pixel and the dummy pixel circuit of the second dummy pixel.

20. The electronic device of claim 19, wherein the first capacitor of the first dummy pixel and the first capacitor of the second dummy pixel are provided as a single body, and wherein the first dummy pixel and the second dummy pixel share the first capacitor.

* * * * *